(12) United States Patent
Yamazaki et al.

(10) Patent No.: US 11,430,817 B2
(45) Date of Patent: Aug. 30, 2022

(54) SEMICONDUCTOR DEVICE

(71) Applicant: Semiconductor Energy Laboratory Co., Ltd., Atsugi (JP)

(72) Inventors: Shunpei Yamazaki, Tokyo (JP); Junichi Koezuka, Tochigi (JP); Yukinori Shima, Tochigi (JP); Masami Jintyou, Tochigi (JP); Takashi Hamochi, Tochigi (JP); Satoshi Higano, Tochigi (JP); Yasuharu Hosaka, Tochigi (JP); Toshimitsu Obonai, Tochigi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 15/697,627

(22) Filed: Sep. 7, 2017

(65) Prior Publication Data
US 2018/0012912 A1   Jan. 11, 2018

Related U.S. Application Data

(62) Division of application No. 14/546,443, filed on Nov. 18, 2014, now abandoned.

(30) Foreign Application Priority Data

Nov. 29, 2013  (JP) .............................. JP2013-248284
Feb. 28, 2014  (JP) .............................. JP2014-038615

(51) Int. Cl.
*H01L 27/12*  (2006.01)
*H01L 49/02*  (2006.01)
(Continued)

(52) U.S. Cl.
CPC .......... *H01L 27/1255* (2013.01); *H01L 28/20* (2013.01); *H01L 28/24* (2013.01);
(Continued)

(58) Field of Classification Search
CPC ............................ H01L 27/1255; H01L 28/57
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| CN | 101501820 A | 8/2009 |
| CN | 101752390 A | 6/2010 |

(Continued)

OTHER PUBLICATIONS

English translation of KR 20130086910 A which is the Korean version of the Chinese patent document CN 103227206A (Year: 2013).*

(Continued)

*Primary Examiner* — Vincent Wall
(74) *Attorney, Agent, or Firm* — Fish & Richardson P.C.

(57) ABSTRACT

A novel semiconductor device in which a metal film containing copper (Cu) is used for a wiring, a signal line, or the like in a transistor including an oxide semiconductor film is provided. The semiconductor device includes an oxide semiconductor film having conductivity on an insulating surface and a conductive film in contact with the oxide semiconductor film having conductivity. The conductive film includes a Cu—X alloy film (X is Mn, Ni, Cr, Fe, Co, Mo, Ta, or Ti).

7 Claims, 53 Drawing Sheets

(51) Int. Cl.
*H01L 29/786* (2006.01)
*H01L 29/45* (2006.01)

(52) U.S. Cl.
CPC .............. *H01L 28/60* (2013.01); *H01L 29/45* (2013.01); *H01L 29/7869* (2013.01); *H01L 29/78693* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,909,145 B2 | 6/2005 | Cabral, Jr. et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,304,384 B2 | 12/2007 | Koike et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,626,665 B2 | 12/2009 | Koike |
| 7,674,650 B2 | 3/2010 | Akimoto et al. |
| 7,732,819 B2 | 6/2010 | Akimoto et al. |
| 7,782,433 B2 | 8/2010 | Koike |
| 7,910,490 B2 | 3/2011 | Akimoto et al. |
| 7,923,722 B2 * | 4/2011 | Ryu .................. H01L 21/02565 257/43 |
| 7,932,521 B2 | 4/2011 | Akimoto et al. |
| 7,943,517 B2 | 5/2011 | Koike et al. |
| 8,008,184 B2 | 8/2011 | Matsumoto et al. |
| 8,084,860 B2 | 12/2011 | Koike et al. |
| 8,089,158 B2 | 1/2012 | Koike et al. |
| 8,102,476 B2 | 1/2012 | Son et al. |
| 8,119,462 B2 | 2/2012 | Takasawa et al. |
| 8,242,015 B2 | 8/2012 | Matsumoto et al. |
| 8,242,496 B2 * | 8/2012 | Yamazaki ........... H01L 27/1251 257/43 |
| 8,274,077 B2 | 9/2012 | Akimoto et al. |
| 8,293,595 B2 | 10/2012 | Yamazaki et al. |
| 8,344,374 B2 | 1/2013 | Yamazaki et al. |
| 8,384,077 B2 | 2/2013 | Yano et al. |
| 8,466,463 B2 | 6/2013 | Akimoto et al. |
| 8,471,256 B2 | 6/2013 | Yamazaki et al. |
| 8,476,625 B2 | 7/2013 | Kimura |
| 8,629,069 B2 | 1/2014 | Akimoto et al. |
| 8,669,550 B2 | 3/2014 | Akimoto et al. |
| 8,790,959 B2 | 7/2014 | Akimoto et al. |
| 8,796,069 B2 | 8/2014 | Akimoto et al. |
| 8,841,710 B2 | 9/2014 | Yamazaki et al. |
| 8,866,140 B2 | 10/2014 | Koike et al. |
| 8,927,982 B2 | 1/2015 | Koezuka et al. |
| 8,932,903 B2 | 1/2015 | Sato et al. |
| 8,981,369 B2 | 3/2015 | Yano et al. |
| 8,999,750 B2 | 4/2015 | Kimura |
| 9,142,679 B2 | 9/2015 | Yamazaki et al. |
| 9,201,280 B2 | 12/2015 | Kimura |
| 9,202,827 B2 | 12/2015 | Koyama et al. |
| 9,214,533 B2 | 12/2015 | Miyamoto et al. |
| 9,252,226 B2 | 2/2016 | Kim et al. |
| 9,276,126 B2 | 3/2016 | Miyamoto et al. |
| 9,379,223 B2 | 6/2016 | Koezuka et al. |
| 9,412,798 B2 | 8/2016 | Yamazaki et al. |
| 9,443,888 B2 | 9/2016 | Koyama et al. |
| 9,472,656 B2 | 10/2016 | Yamazaki et al. |
| 9,589,998 B2 | 3/2017 | Kim et al. |
| 9,748,436 B2 | 8/2017 | Yamazaki |
| 9,837,446 B2 | 12/2017 | Kim et al. |
| 9,859,441 B2 | 1/2018 | Yamazaki et al. |
| 9,941,310 B2 | 4/2018 | Koyama et al. |
| 10,396,236 B2 | 8/2019 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0006794 A1 | 1/2006 | Sakakura et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0178007 A1 | 8/2006 | Nakamura et al. |
| 2006/0197092 A1 | 9/2006 | Hoffman et al. |
| 2006/0208977 A1 | 9/2006 | Kimura |
| 2006/0228974 A1 | 10/2006 | Theiss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee. et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308805 A1 | 12/2008 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0141203 A1 | 6/2009 | Son et al. |
| 2009/0152506 A1 | 6/2009 | Umeda et al. |
| 2009/0152541 A1 | 6/2009 | Maekawa et al. |

(56) References Cited

U.S. PATENT DOCUMENTS

| | | | |
|---|---|---|---|
| 2009/0173945 A1* | 7/2009 | Takasawa | C23C 14/185 257/66 |
| 2009/0278122 A1 | 11/2009 | Hosono et al. | |
| 2009/0280600 A1 | 11/2009 | Hosono et al. | |
| 2009/0305461 A1 | 12/2009 | Akimoto et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0163874 A1* | 7/2010 | Koyama | H01L 27/12 257/57 |
| 2010/0220117 A1* | 9/2010 | Kimura | G09G 3/3233 345/690 |
| 2010/0233847 A1 | 9/2010 | Ohara et al. | |
| 2010/0233876 A1 | 9/2010 | Matsumoto et al. | |
| 2010/0311238 A1 | 12/2010 | Nakamura et al. | |
| 2011/0012106 A1* | 1/2011 | Yamazaki | H01L 27/124 257/43 |
| 2011/0032435 A1 | 2/2011 | Kimura | |
| 2011/0073856 A1* | 3/2011 | Sato | H01L 29/7869 257/43 |
| 2011/0090183 A1* | 4/2011 | Yamazaki | G09G 3/3648 345/204 |
| 2011/0104851 A1 | 5/2011 | Akimoto et al. | |
| 2011/0121290 A1 | 5/2011 | Akimoto et al. | |
| 2011/0121300 A1 | 5/2011 | Miyairi et al. | |
| 2011/0147733 A1 | 6/2011 | Kao et al. | |
| 2012/0001170 A1* | 1/2012 | Yamazaki | H01L 27/1225 257/43 |
| 2012/0062811 A1 | 3/2012 | Miyake | |
| 2012/0138932 A1* | 6/2012 | Lin | G02F 1/136213 257/59 |
| 2012/0146018 A1 | 6/2012 | Schneider-Betz et al. | |
| 2012/0161121 A1 | 6/2012 | Yamazaki | |
| 2012/0319107 A1 | 12/2012 | Miyake | |
| 2013/0112972 A1 | 5/2013 | Koike et al. | |
| 2013/0113044 A1 | 5/2013 | Yamazaki et al. | |
| 2013/0168671 A1 | 7/2013 | Koike et al. | |
| 2013/0267068 A1 | 10/2013 | Hanaoka et al. | |
| 2013/0278855 A1 | 10/2013 | Uemura et al. | |
| 2013/0302938 A1 | 11/2013 | Sato et al. | |
| 2014/0034954 A1 | 2/2014 | Yamazaki et al. | |
| 2014/0291672 A1 | 10/2014 | Yamazaki et al. | |
| 2015/0155313 A1 | 6/2015 | Yamazaki et al. | |
| 2015/0155363 A1 | 6/2015 | Nakazawa et al. | |
| 2016/0284864 A1 | 9/2016 | Koezuka et al. | |
| 2016/0358950 A1 | 12/2016 | Koyama et al. | |
| 2019/0109259 A1 | 4/2019 | Yamazaki et al. | |
| 2019/0157499 A1 | 5/2019 | Yamazaki | |

FOREIGN PATENT DOCUMENTS

| | | | |
|---|---|---|---|
| CN | 101794791 A | | 8/2010 |
| CN | 102349158 A | | 2/2012 |
| CN | 103227206 A | * | 7/2013 |
| CN | 103227206 A | | 7/2013 |
| CN | 105793995 A | | 7/2016 |
| DE | 102013208317 | | 11/2013 |
| EP | 1737044 A | | 12/2006 |
| EP | 2051287 A | | 4/2009 |
| EP | 2202802 A | | 6/2010 |
| EP | 2226847 A | | 9/2010 |
| EP | 2406826 A | | 1/2012 |
| EP | 2515337 A | | 10/2012 |
| JP | 60-198861 A | | 10/1985 |
| JP | 63-210022 A | | 8/1988 |
| JP | 63-210023 A | | 8/1988 |
| JP | 63-210024 A | | 8/1988 |
| JP | 63-215519 A | | 9/1988 |
| JP | 63-239117 A | | 10/1988 |
| JP | 63-265818 A | | 11/1988 |
| JP | 05-251705 A | | 9/1993 |
| JP | 07-104312 A | | 4/1995 |
| JP | 08-264794 A | | 10/1996 |
| JP | 11-505377 | | 5/1999 |
| JP | 2000-044236 A | | 2/2000 |
| JP | 2000-150900 A | | 5/2000 |
| JP | 2002-076356 A | | 3/2002 |
| JP | 2002-289859 A | | 10/2002 |
| JP | 2003-086000 A | | 3/2003 |
| JP | 2003-086808 A | | 3/2003 |
| JP | 2004-103957 A | | 4/2004 |
| JP | 2004-273614 A | | 9/2004 |
| JP | 2004-273732 A | | 9/2004 |
| JP | 2005-077822 A | | 3/2005 |
| JP | 2006-245558 A | | 9/2006 |
| JP | 2007-123861 A | | 5/2007 |
| JP | 2010-056546 A | | 3/2010 |
| JP | 2010-171394 A | | 8/2010 |
| JP | 2012-212874 A | | 11/2012 |
| JP | 2012-222171 A | | 11/2012 |
| JP | 2013-033927 A | | 2/2013 |
| JP | 2013-042150 A | | 2/2013 |
| JP | 2013-067857 A | | 4/2013 |
| JP | 2013-093621 A | | 5/2013 |
| JP | 2013-153140 A | | 8/2013 |
| JP | 2013-232636 A | | 11/2013 |
| JP | 2013-254946 A | | 12/2013 |
| KR | 2010-0065110 A | | 6/2010 |
| KR | 2010-0075407 A | | 7/2010 |
| KR | 2011-0126172 A | | 11/2011 |
| KR | 2013-0126479 A | | 11/2013 |
| TW | 201104759 | | 2/2011 |
| WO | WO-2004/114391 | | 12/2004 |
| WO | WO-2009/075281 | | 6/2009 |
| WO | WO-2010/103935 | | 9/2010 |
| WO | WO-2011/065208 | | 6/2011 |
| WO | WO-2012/002573 | | 1/2012 |
| WO | WO-2012/002574 | | 1/2012 |
| WO | WO-2012/128030 | | 9/2012 |
| WO | WO-2012/141089 | | 10/2012 |
| WO | WO-2013/080900 | | 6/2013 |
| WO | WO-2013/115051 | | 8/2013 |
| WO | WO-2013/115052 | | 8/2013 |
| WO | WO-2015/079360 | | 6/2015 |
| WO | WO-2015/079362 | | 6/2015 |

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Backplane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

(56) References Cited

OTHER PUBLICATIONS

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janottla et al., "Native Point Defects in ZnO", Phys. Rev. B (Physical Review. B), Oct. 4, 2007, vol. 76, No. 16, pp. 165202-1-165202-22.

Janottla et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "SPINEL,YBFE2O4, and YB2FE3O7 Types of Structures for Compounds in the IN2O3 and Sc2O3-A2O3-BO Systems [A; Fe, Ga, or Al; B: Mg, Mn, Fe, Ni, Cu, or Zn] at Temperatures Over 1000°C", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW'06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW'08 : Proceedings of the 6th International Display Workshops, Dec. 3, 2008, pp. 581-584.

Nakamura.M et al., "The phase relations in the In2O3—Ga2ZnO4—ZnO system at 1350°C", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

(56) References Cited

OTHER PUBLICATIONS

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-IN. AMOLED Display With Driver Circuit Using Amorphous In—Ga—Zn-Oxide TFTs", IDW' 09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW'08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

International Search Report (Application No. PCT/IB2014/066150) dated Mar. 3, 2015.

Written Opinion (Application No. PCT/IB2014/066150) dated Mar. 3, 2015.

Chinese Office Action (Application No. 201480064849.3) dated Aug. 28, 2018.

Japanese Office Action (Application No. 2019-144990) dated Sep. 29, 2020.

Korean Office Action (Application No. 10-2016-7017512) dated Sep. 29, 2020.

\* cited by examiner

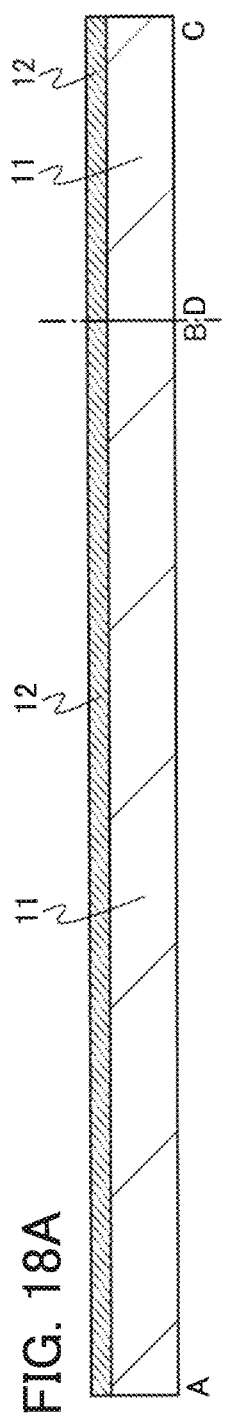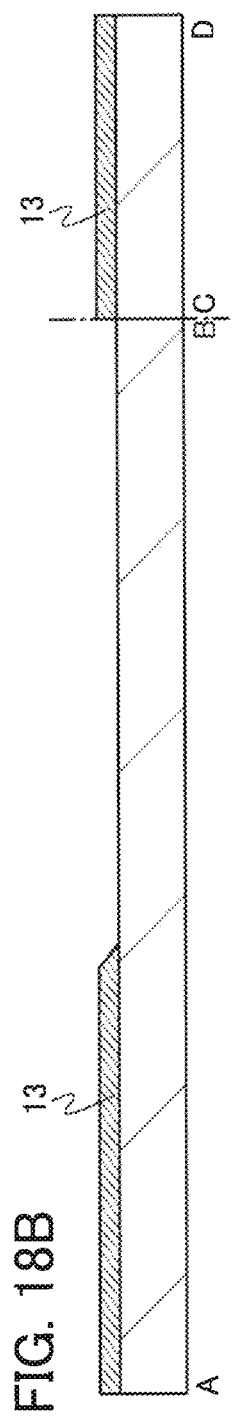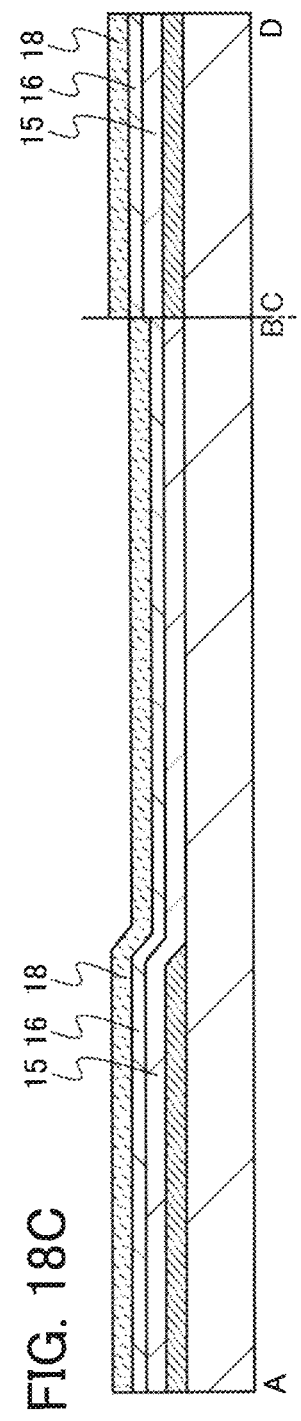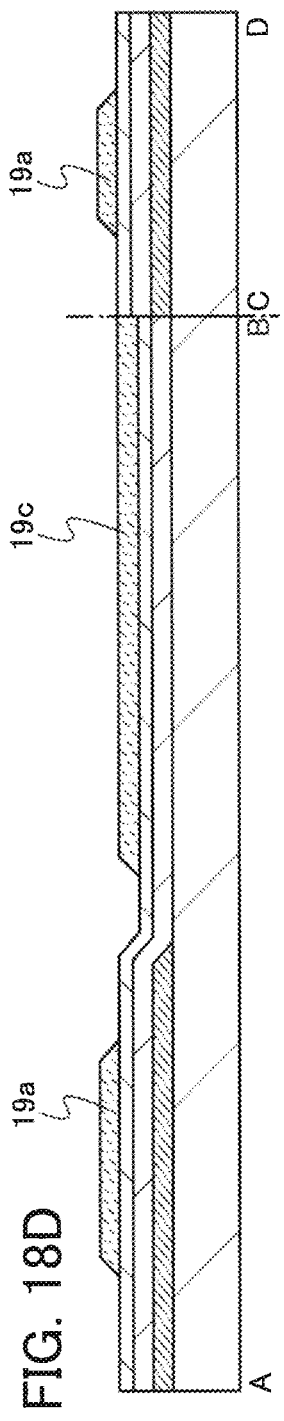

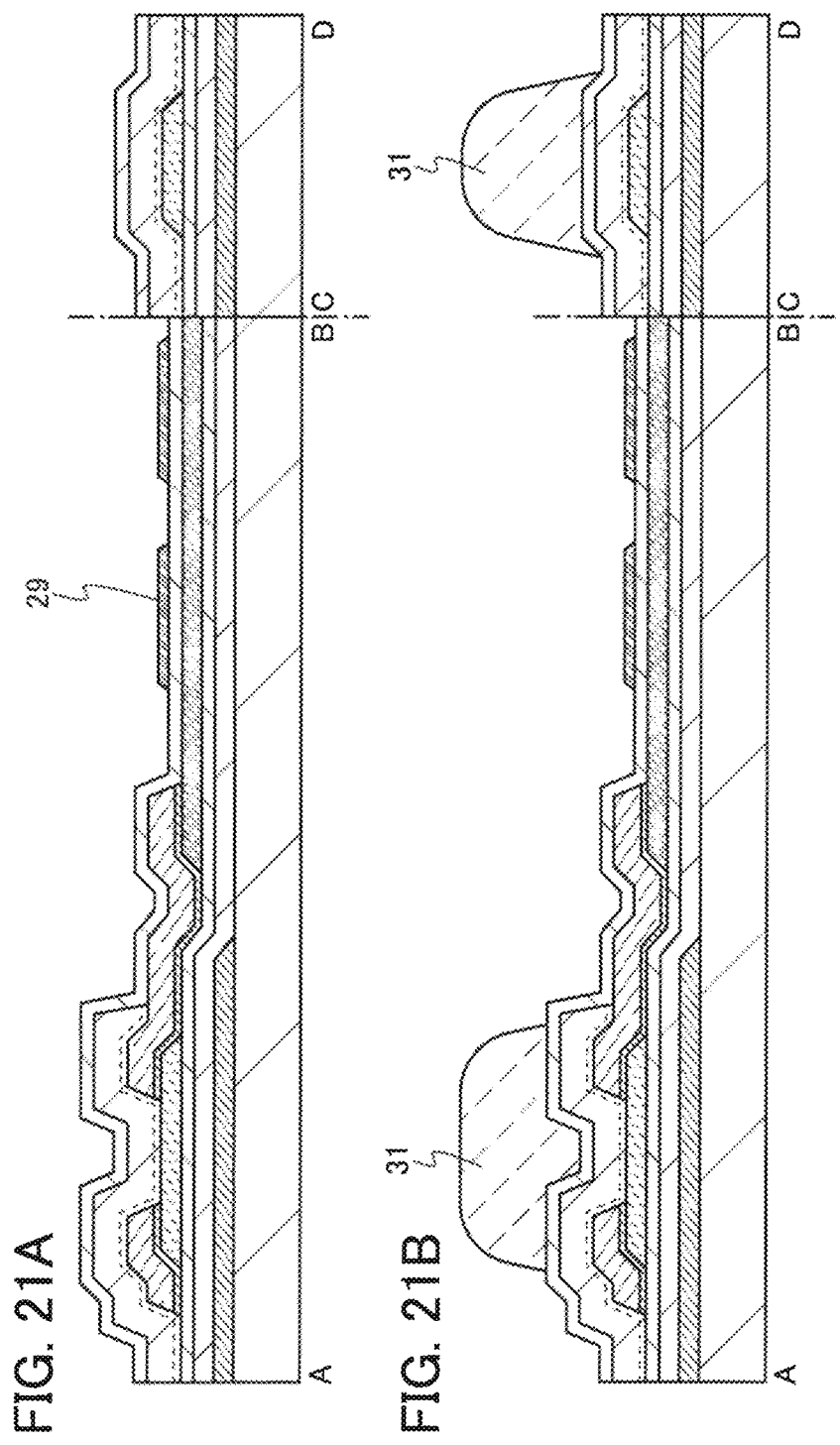

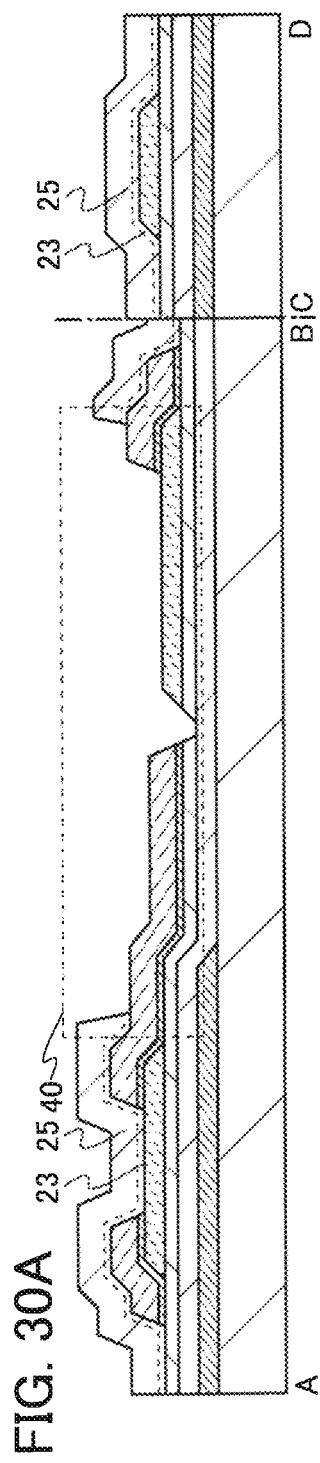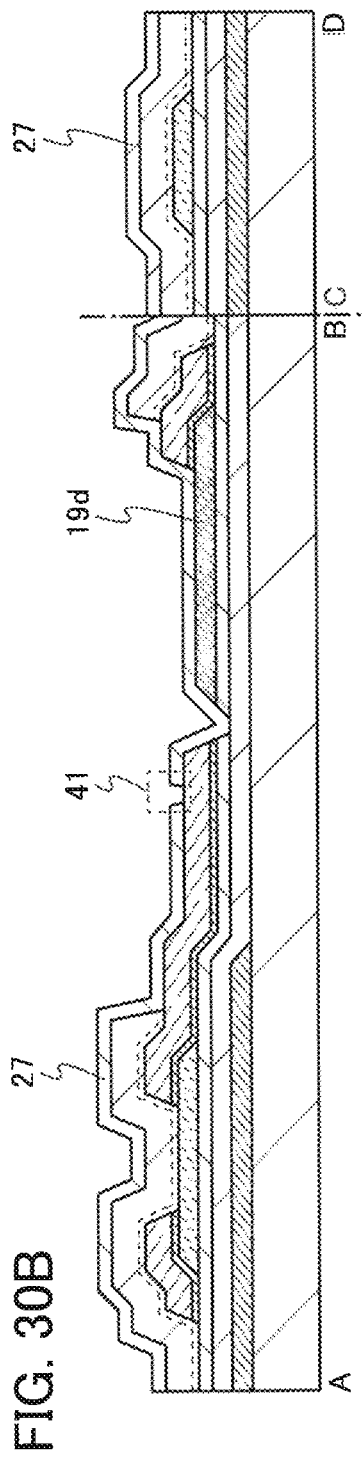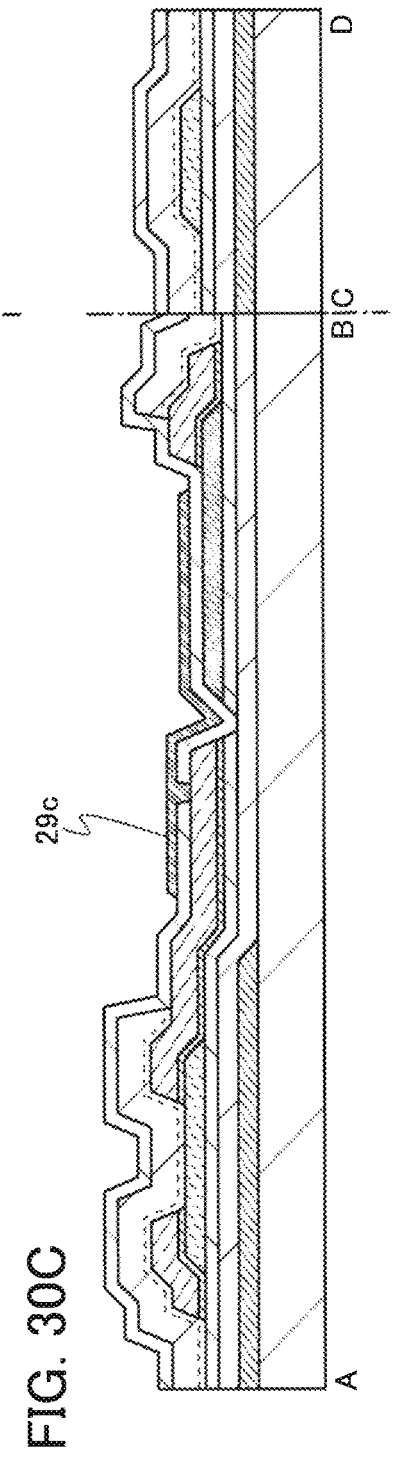

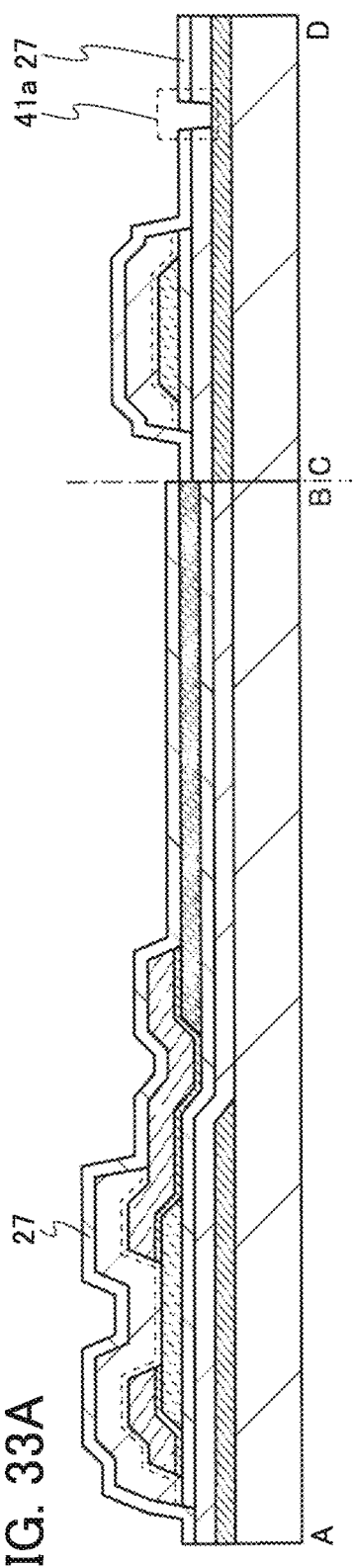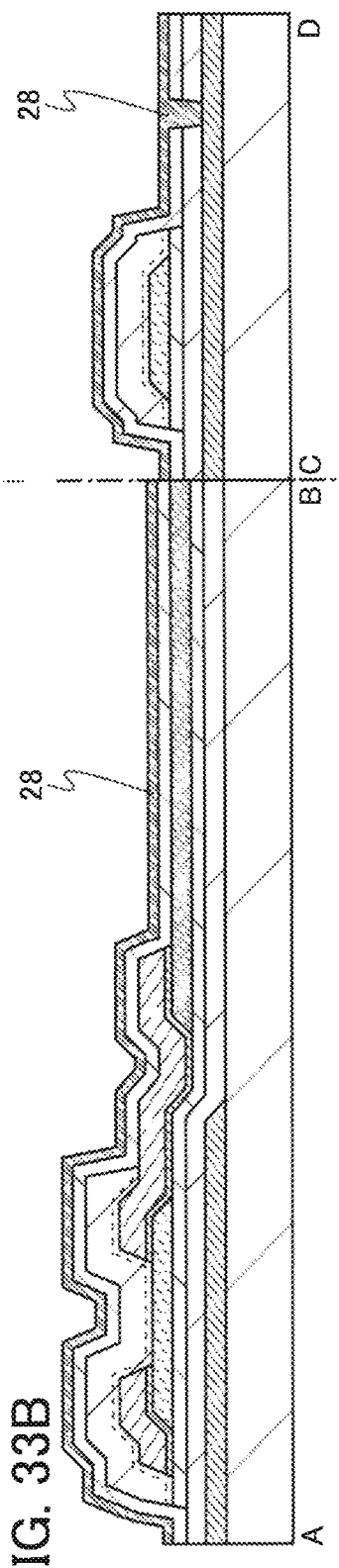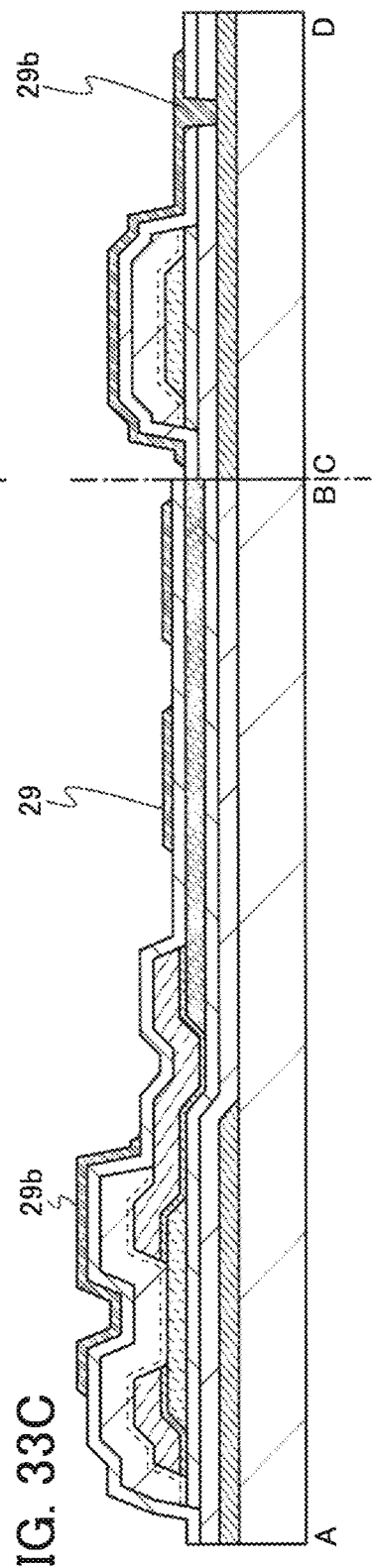

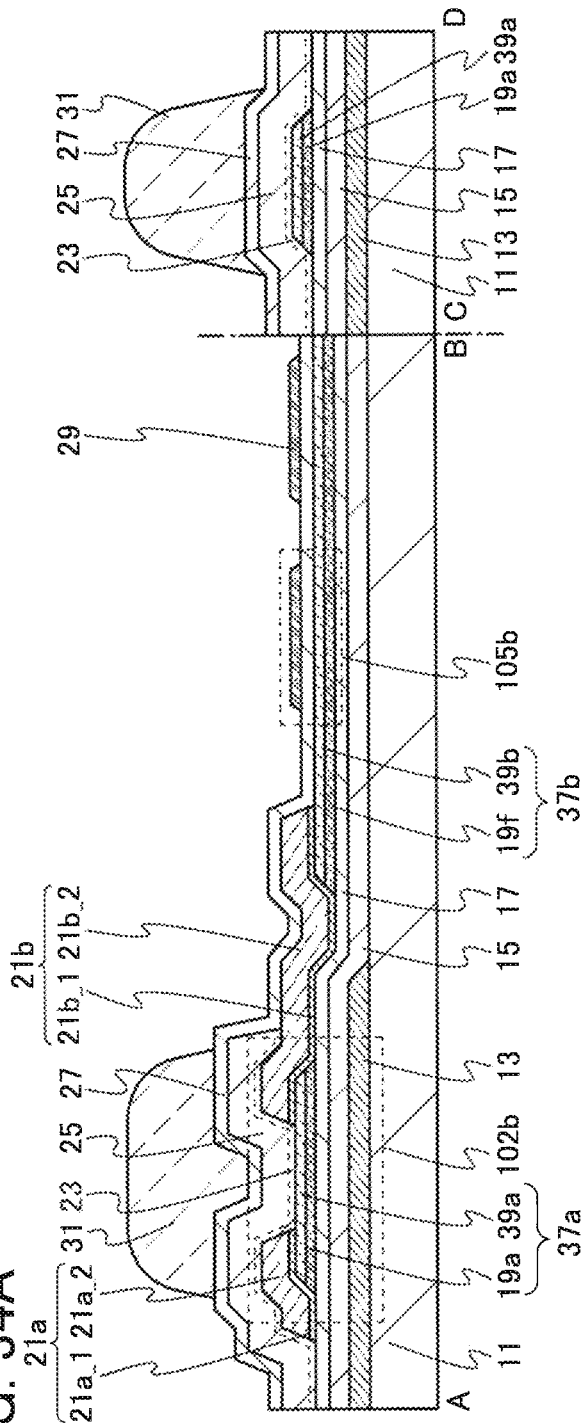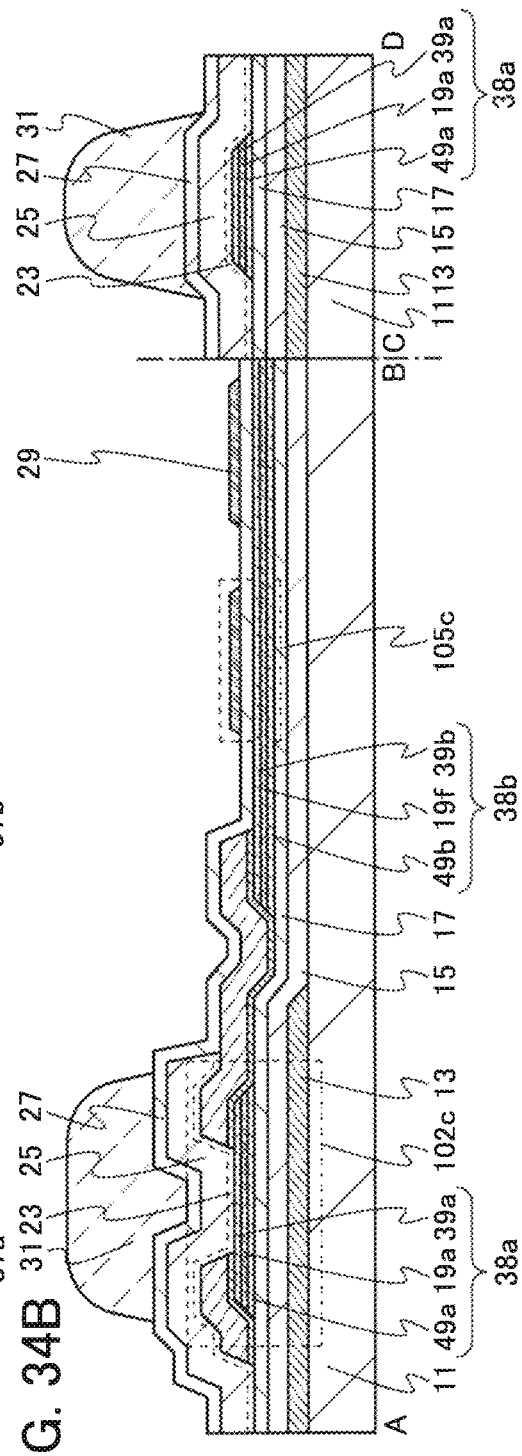

FIG. 38A
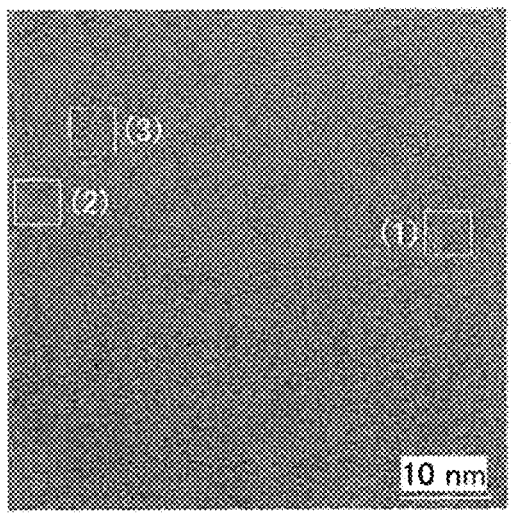
FIG. 38B    FIG. 38C    FIG. 38D
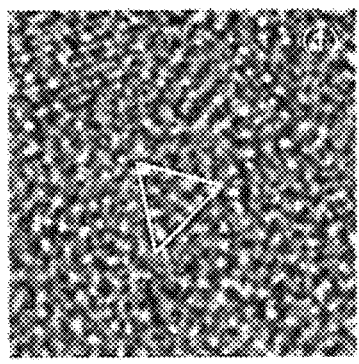 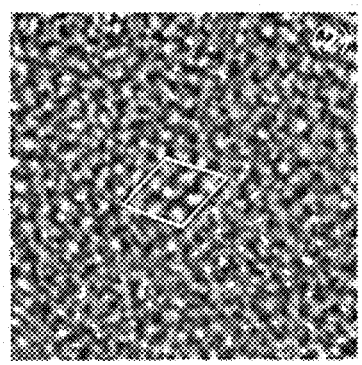 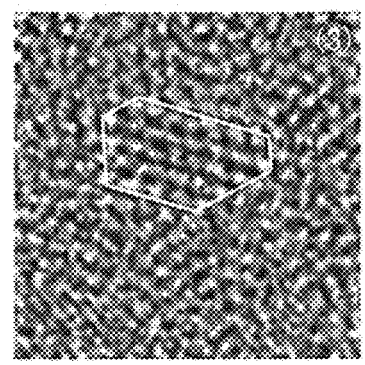

FIG. 40A
FIG. 40B
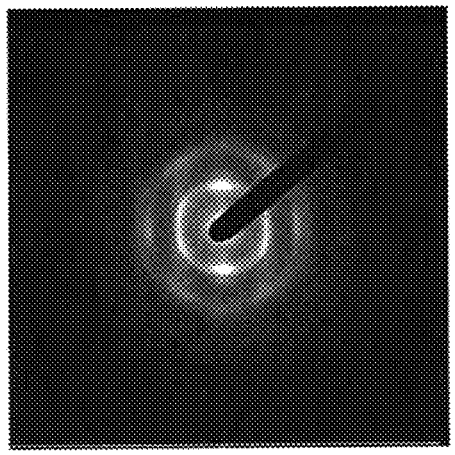
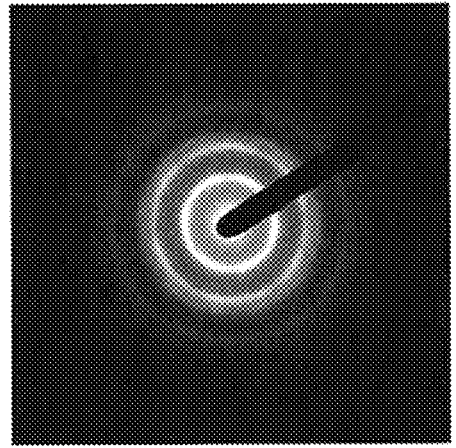

pellet cross-sectional pellet top

InGaZnO₄

Ar or O
(300eV)

Ga-Zn-O layer
In-O layer
Ga-Zn-O layer
Ga-Zn-O layer
In-O layer
Ga-Zn-O layer
Ga-Zn-O layer
In-O layer
Ga-Zn-O layer temperature control layer (300k)

fixed layer

InGaZnO₄ entrance position

In : ◯  Ga : ◯  Zn : ◉  O : ●

99.9psec after Ar collision 99.9psec after O collision

In : ◌  Ga : ○  Zn : ◯  O : ●

FIG. 48A
FIG. 48B
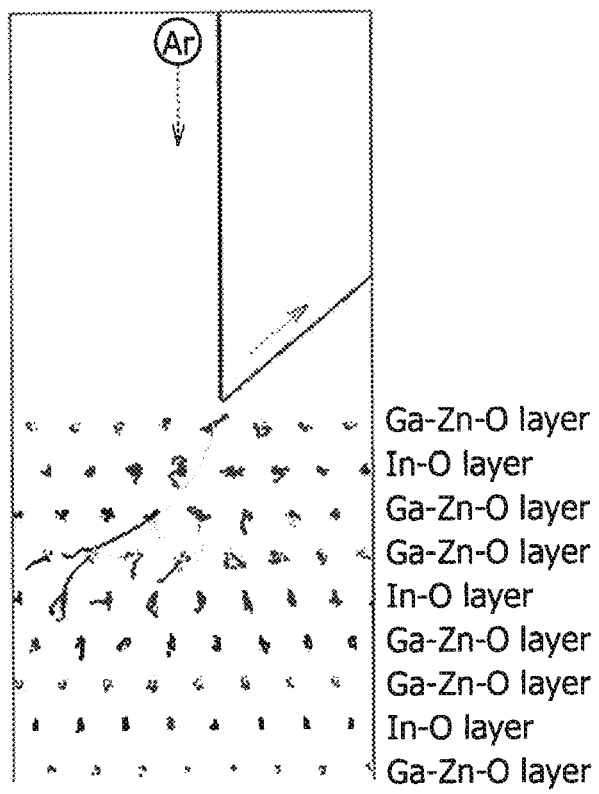
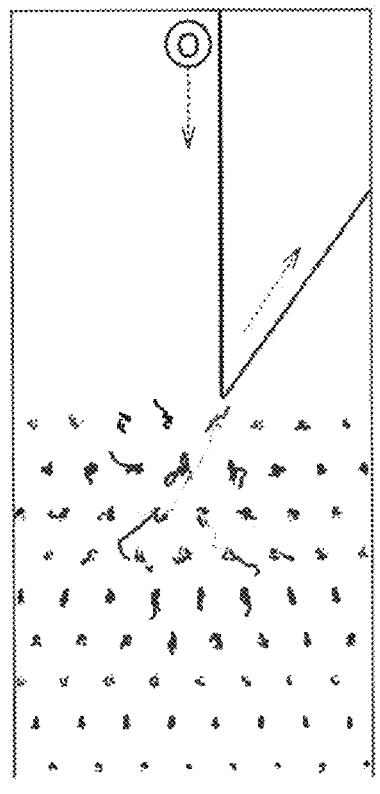
0~0.3psec after Ar entrance
0~0.3psec after O entrance CAAC-OS film        1 nm terget        1 nm

SEMICONDUCTOR DEVICE

CROSS-REFERENCE TO RELATED APPLICATIONS

This application is a divisional of U.S. application Ser. No. 14/546,443, filed Nov. 18, 2014, now pending, which claims the benefit of foreign priority applications filed in Japan as Serial No. 2013-248284 on Nov. 29, 2013, and Serial No. 2014-038615 on Feb. 28, 2014, all of which are incorporated by reference.

TECHNICAL FIELD

One embodiment of the present invention relates to a semiconductor device and a display device each including an oxide semiconductor.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a storage device, a method for driving any of them, and a method for manufacturing any of them.

BACKGROUND ART

There is a trend in a display device using a transistor (e.g., a liquid crystal panel and an organic EL panel) toward a larger screen. As the screen size becomes larger, in the case of a display device using an active element such as a transistor, a voltage applied to an element varies depending on the position of a wiring which is connected to the element due to wiring resistance, which cause a problem of deterioration of display quality such as display unevenness and a defect in grayscale.

Conventionally, an aluminum film has been widely used as a material used for the wiring, the signal line, or the like; moreover, research and development of using a copper (Cu) film as a material is extensively conducted to further reduce resistance. However, a copper (Cu) film is disadvantageous in that adhesion thereof to a base film is poor and that characteristics of a transistor easily deteriorate due to diffusion of copper in the copper film into a semiconductor film of the transistor. Note that a silicon-based semiconductor material is widely known as a material for a semiconductor thin film applicable to a transistor, and as another material, an oxide semiconductor has attracted attention (see Patent Document 1).

In addition, as an ohmic electrode formed over a semiconductor film containing an oxide semiconductor material including indium, a Cu—Mn alloy has been disclosed (see Patent Document 2).

REFERENCE

Patent Document

[Patent Document 1] Japanese Published Patent Application No. 2007-123861
[Patent Document 2] PCT International Publication No. 2012/002573

DISCLOSURE OF INVENTION

Regarding a transistor in which a silicon-based semiconductor material is used for a semiconductor film, research and development have been extensively conducted on a structure in which a copper film is used for a wiring, a signal line, or the like while copper in the copper film is not diffused into a semiconductor film. However, there has been a problem in that the structure and its manufacturing method are not yet optimized for a transistor using an oxide semiconductor film.

Furthermore, a transistor using an oxide semiconductor film in which a copper film is used for a wiring, a signal line, or the like and a barrier film is used to suppress diffusion of copper in the copper film has had a problem in that electrical characteristics of the oxide semiconductor film deteriorate, the number of masks for the transistor using the oxide semiconductor film is increased, or the manufacturing cost of the transistor using the oxide semiconductor film is increased.

In view of the above problems, an object of one embodiment of the present invention is to provide a novel semiconductor device in which a metal film containing copper (Cu) is used for a wiring, a signal line, or the like in a transistor using an oxide semiconductor film. Another object of one embodiment of the present invention is to provide a method for manufacturing a semiconductor device in which a metal film containing copper (Cu) is used for a wiring, a signal line, or the like in a transistor using an oxide semiconductor film. Another object of one embodiment of the present invention is to provide a novel semiconductor device in which a metal film containing copper (Cu) in a transistor using an oxide semiconductor film has a favorable shape. Another object of one embodiment of the present invention is to provide a novel semiconductor device or a method for manufacturing the novel semiconductor device.

Note that the descriptions of these objects do not disturb the existence of other objects. In one embodiment of the present invention, there is no need to achieve all the objects. Objects other than the above objects will be apparent from and can be derived from the description of the specification, the drawings, the claims, and the like.

One embodiment of the present invention is a semiconductor device including an oxide semiconductor film having conductivity on an insulating surface and a first conductive film in contact with the oxide semiconductor film having conductivity. The first conductive film includes a Cu—X alloy film (X is Mn, Ni, Cr, Fe, Co, Mo, Ta, or Ti).

Another embodiment of the present invention is a semiconductor device including an oxide semiconductor film having conductivity on an insulating surface and a first conductive film in contact with the oxide semiconductor film having conductivity. The hydrogen concentration in the oxide semiconductor film having conductivity is higher than or equal to $8\times10^{19}$ atoms/cm$^3$. The first conductive film includes a Cu—X alloy film (X is Mn, Ni, Cr, Fe, Co, Mo, Ta, or Ti).

Another embodiment of the present invention is a semiconductor device including an oxide semiconductor film having conductivity on an insulating surface and a first conductive film in contact with the oxide semiconductor film having conductivity. The resistivity of the oxide semiconductor film having conductivity is higher than or equal to $1\times10^{-3}$ Ωcm and lower than $1\times10^4$ Ωcm. The first conductive film includes a Cu—X alloy film (X is Mn, Ni, Cr, Fe, Co, Mo, Ta, or Ti).

Note that the first conductive film may be a pair of conductive films, and the oxide semiconductor film having conductivity and the pair of conductive films in contact with the oxide semiconductor film having conductivity may serve as a resistor.

Alternatively, the semiconductor device of one embodiment of the present invention includes an insulating film in contact with the oxide semiconductor film having conductivity and the first conductive film, and a second conductive film in contact with the insulating film and overlapping with the oxide semiconductor film having conductivity with the insulating film provided therebetween. The oxide semiconductor film having conductivity, the first conductive film, the insulating film, and the second conductive film may serve as a capacitor. Note that the insulating film may include a nitride insulating film.

The first conductive film includes a Cu—Mn alloy film. Alternatively, the first conductive film is a stack of a Cu—Mn alloy film and a Cu film over the Cu—Mn alloy film. Alternatively, the first conductive film is a stack of a first Cu—Mn alloy film, a Cu film over the first Cu—Mn alloy film, and a second Cu—Mn alloy film over the Cu film.

A coating film including a compound containing X may be provided on the outer periphery of the first conductive film. In the case where the first conductive film includes a Cu—Mn alloy film, manganese oxide may be provided on the outer periphery of the first conductive film.

The oxide semiconductor film having conductivity includes a crystal part, and a c-axis of the crystal part may be parallel to a normal vector of the surface where the oxide semiconductor film is formed.

The oxide semiconductor film having conductivity may include an In-M-Zn oxide (M is Al, Ga, Y, Zr, Sn, La, Ce, or Nd).

According to one embodiment of the present invention, a novel semiconductor device in which a metal film containing copper is used for a wiring, a signal line, or the like in a transistor using an oxide semiconductor film can be provided. According to another embodiment of the present invention, a method for manufacturing a semiconductor device in which a metal film containing copper is used for a wiring, a signal line, or the like in a transistor using an oxide semiconductor film can be provided. According to another embodiment of the present invention, a novel semiconductor device in which a shape of a metal film containing copper is favorable in a transistor using an oxide semiconductor film can be provided. According to another embodiment of the present invention, a novel semiconductor device of which productivity is improved can be provided. According to another embodiment of the present invention, a novel semiconductor device or a method for manufacturing the novel semiconductor device can be provided.

Note that the description of these effects does not disturb the existence of other effects. In one embodiment of the present invention, there is no need to obtain all the effects. Other effects will be apparent from and can be derived from the description of the specification, the drawings, the claims, and the like.

BRIEF DESCRIPTION OF DRAWINGS

In the accompanying drawings:

FIGS. 18A to 18D are cross-sectional views illustrating one embodiment of a method for manufacturing a display device;

FIGS. 21A and 21B are cross-sectional views illustrating one embodiment of a method for manufacturing a display device;

FIGS. 30A to 30C are cross-sectional views illustrating one embodiment of a method for manufacturing a display device;

FIGS. 33A to 33C are cross-sectional views illustrating one embodiment of a method for manufacturing a display device;

FIGS. 34A and 34B are cross-sectional views each illustrating one embodiment of a display device;

FIGS. 38A to 38D are Cs-corrected high-resolution TEM images of a plane of a CAAC-OS;

FIGS. 40A and 40B show electron diffraction patterns of a CAAC-OS;

FIGS. 48A and 48B show trajectories of atoms after collision of atoms;

BEST MODE FOR CARRYING OUT THE INVENTION

Figure 1A:
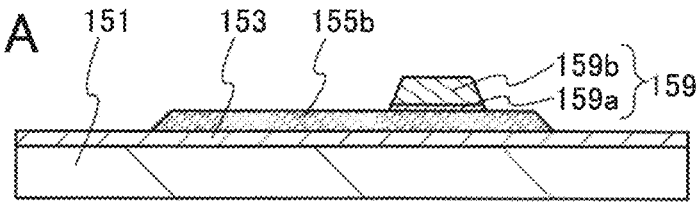
FIGS. 1A to 1E are cross-sectional views illustrating embodiments of a semiconductor device of the present invention.

Embodiments will be described below with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings.

Note that in this specification, ordinal numbers such as "first", "second", and "third" are used in order to avoid confusion among components, and the terms do not limit the components numerically.

Note that in this specification, terms for describing arrangement, such as "over" "above", "under", and "below", are used for convenience in describing a positional relation between components with reference to drawings. The positional relation between components is changed as appropriate in accordance with a direction in which each component is described. Thus, the positional relation is not limited to that described with a term used in this specification and can be explained with another term as appropriate depending on the situation.

In this specification and the like, a transistor is an element having at least three terminals of a gate, a drain, and a source. In addition, the transistor has a channel region between a drain (a drain terminal, a drain region, or a drain electrode layer) and a source (a source terminal, a source region, or a source electrode layer), and current can flow through the drain, the channel region, and the source. Note that in this specification and the like, a channel region refers to a region through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

Note that in this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

Embodiment 1

In this embodiment, a semiconductor device of one embodiment of the present invention is described with reference to FIGS. 1A to 1E, FIGS. 2A to 2D, FIGS. 3A to 3D, FIGS. 4A to 4C, FIGS. 5A to 5F, and FIGS. 6A to 6C. In this embodiment, a structure of an oxide semiconductor film having conductivity and a conductive film in contact with the oxide semiconductor film and a manufacturing method thereof are described. Here, the oxide semiconductor film having conductivity serves as an electrode or a wiring.

FIGS. 1A to 1E are cross-sectional views of an oxide semiconductor film having conductivity and a conductive film in contact with the oxide semiconductor film which are included in a semiconductor device.

In FIG. 1A, an insulating film 153, an oxide semiconductor film 155b having conductivity over the insulating film 153, and a conductive film 159 in contact with the oxide semiconductor film 155b having conductivity are formed over a substrate 151.

Figure 1B:
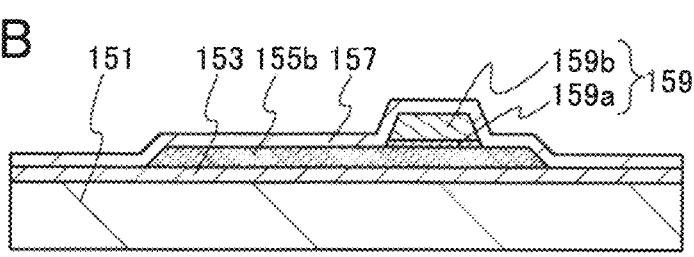

Furthermore, as illustrated in FIG. 1B, an insulating film 157 may be formed over the insulating film 153, the oxide semiconductor film 155b having conductivity, and the conductive film 159.

Figure 1C:
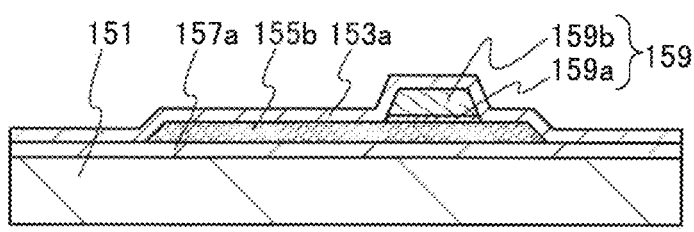

Alternatively, as illustrated in FIG. 1C, the oxide semiconductor film 155b having conductivity may be formed over an insulating film 157a. In this case, an insulating film 153a can be provided over the oxide semiconductor film 155b having conductivity and the conductive film 159.

The oxide semiconductor film 155b having conductivity is typically formed of a metal oxide film such as an In—Ga oxide film, an In—Zn oxide film, or an In-M-Zn oxide film (M is Al, Ga, Y, Zr, Sn, La, Ce, or Nd). Note that the oxide semiconductor film 155b having conductivity has a light-transmitting property.

In the case where the oxide semiconductor film 155b having conductivity contains an In-M-Zn oxide film, the proportions of In and M when summation of In and M is assumed to be 100 atomic % are preferably as follows: the atomic percentage of In is greater than 25 atomic % and the atomic percentage of M is less than 75 atomic %, or further preferably, the atomic percentage of In is greater than 34 atomic % and the atomic percentage of M is less than 66 atomic %.

The energy gap of the oxide semiconductor film 155b having conductivity is 2 eV or more, preferably 2.5 eV or more, further preferably 3 eV or more.

The thickness of the oxide semiconductor film 155b having conductivity is greater than or equal to 3 nm and less than or equal to 200 nm, preferably greater than or equal to 3 nm and less than or equal to 100 nm, further preferably greater than or equal to 3 nm and less than or equal to 50 nm.

In the case where the oxide semiconductor film 155b having conductivity is an In-M-Zn oxide film (M is Al, Ga, Y, Zr, Sn, La, Ce, or Nd), it is preferable that the atomic ratio of metal elements of a sputtering target used for forming the In-M-Zn oxide film satisfy In≥M and Zn≥M. As the atomic ratio of metal elements of such a sputtering target, In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, or the like is preferable. Note that the proportion of each metal element in the atomic ratio of the formed oxide semiconductor film 155b having conductivity varies within a range of ±40% of that in the above atomic ratio of the sputtering target as an error.

The oxide semiconductor film 155b having conductivity may have a non-single-crystal structure, for example. The non-single crystal structure includes a c-axis aligned crystalline oxide semiconductor (CAAC-OS) described later, a polycrystalline structure, a microcrystalline structure described later, and an amorphous structure, for example. Among the non-single crystal structures, the amorphous structure has the highest density of defect levels, whereas the CAAC-OS has the lowest density of defect levels.

Note that the oxide semiconductor film 155b having conductivity may be a mixed film including two or more of the following: a region having an amorphous structure, a region having a microcrystalline structure, a region having a polycrystalline structure, a CAAC-OS region, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure in some cases. Furthermore, the mixed film has a stacked-layer structure of two or more of a region having an amorphous structure, a region having a microcrystalline structure, a region having a polycrystalline single layer structure, a CAAC-OS region, and a region having a single-crystal structure in some cases.

The insulating film 157 and the insulating film 157a are preferably formed of a film containing hydrogen, typically, a silicon nitride film containing hydrogen. When the insulating films 157 and 157a in contact with an oxide semiconductor film contain hydrogen, the hydrogen is supplied to the oxide semiconductor film, so that the oxide semiconductor film 155b having conductivity can be formed.

The oxide semiconductor film 155b having conductivity includes an impurity. Hydrogen is given as an example of the impurity included in the oxide semiconductor film 155b having conductivity. Instead of hydrogen, as the impurity, boron, phosphorus, nitrogen, tin, antimony, a rare gas element, alkali metal, alkaline earth metal, or the like may be included.

The hydrogen concentration in the oxide semiconductor film 155b having conductivity is higher than or equal to $8 \times 10^{19}$ atoms/cm$^3$, preferably higher than or equal to $1 \times 10^{20}$ atoms/cm$^3$, further preferably higher than or equal to $5 \times 10^{20}$ atoms/cm$^3$. The hydrogen concentration in the oxide semiconductor film 155b having conductivity is lower than or equal to 20 atomic %, preferably lower than or equal to $1 \times 10^{22}$ atoms/cm$^3$. Note that the concentration of hydrogen in the oxide semiconductor film 155b is measured by secondary ion mass spectrometry (SIMS) or hydrogen forward scattering (HFS).

Including defects and impurities, the oxide semiconductor film 155b having conductivity exhibits conductivity. The resistivity of the oxide semiconductor film 155b having conductivity is preferably higher than or equal to $1 \times 10^{-3}$ cm and lower than $1 \times 10^4$ Ωcm, further preferably higher than or equal to $1 \times 10^{-3}$ cm and lower than $1 \times 10^{-1}$ Ωcm.

The oxide semiconductor film 155b having conductivity includes defects in addition to impurities. The oxide semiconductor film 155b having conductivity is typically a film in which defects are generated by releasing oxygen by heat treatment in vacuum in the formation process, a film in which defects are generated by adding a rare gas, or a film in which defects are generated by plasma exposure in the deposition process or the etching process of the conductive film 159. As an example of the defect included in the oxide semiconductor film 155b having conductivity, an oxygen vacancy is given.

When hydrogen is added to an oxide semiconductor including oxygen vacancies, hydrogen enters oxygen vacancies and forms a donor level in the vicinity of the conduction band. As a result, the conductivity of the oxide semiconductor is increased, so that the oxide semiconductor becomes a conductor. An oxide semiconductor having become a conductor can be referred to as an oxide conductor. That is, the oxide semiconductor film 155b having conductivity can be formed of an oxide conductor film. Oxide semiconductors generally have a visible light transmitting property because of their large energy gap. An oxide conductor is an oxide semiconductor having a donor level in the vicinity of the conduction band. Therefore, the influence of absorption due to the donor level is small, and an oxide conductor has a visible light transmitting property comparable to that of an oxide semiconductor.

The conductive film 159 preferably includes at least a Cu—X alloy film (X is Mn, Ni, Cr, Fe, Co, Mo, Ta, or Ti)

(hereinafter, simply referred to as Cu—X alloy film), and for example, the conductive film 159 preferably has a single-layer structure of the Cu—X alloy film or a stacked-layer structure including the Cu—X alloy film. As the stacked-layer structure including the Cu—X alloy film, a stacked-layer structure of the Cu—X alloy film and a conductive film including a low-resistance material such as copper (Cu), aluminum (Al), gold (Au), or silver (Ag), an alloy thereof, or a compound containing any of these materials as a main component (hereinafter referred to as a conductive film including a low-resistance material) is given.

Here, the conductive film 159 has a stacked-layer structure of a conductive film 159a in contact with the oxide semiconductor film 155b having conductivity and a conductive film 159b in contact with the conductive film 159a. Furthermore, the Cu—X alloy film is used as the conductive film 159a and the conductive film including a low-resistance material is used as the conductive film 159b.

The conductive film 159 also serves as a lead wiring or the like. The conductive film 159 includes the conductive film 159a using the Cu—X alloy film and the conductive film 159b using the conductive film including a low-resistance material, whereby even in the case where a large substrate is used as the substrate 151, a semiconductor device in which wiring delay is suppressed can be manufactured.

The conductive film 159 including the Cu—X alloy film is formed over the oxide semiconductor film 155b having conductivity, whereby the adhesion between the oxide semiconductor film 155b having conductivity and the conductive film 159 can be increased and the contact resistance therebetween can be reduced.

Figure 1D:
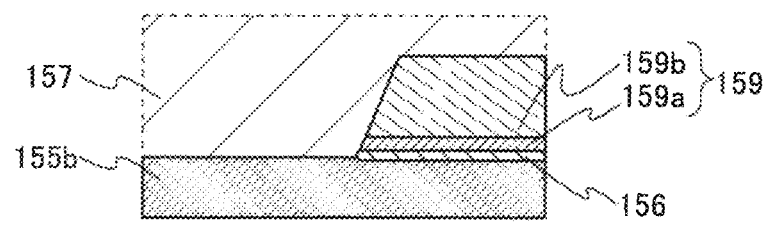

Here, FIG. 1D shows an enlarged view of a region where the oxide semiconductor film 155b having conductivity is in contact with the conductive film 159. When the Cu—X alloy film is used as the conductive film 159a in contact with the oxide semiconductor film 155b having conductivity, a coating film 156 is formed at an interface between the oxide semiconductor film 155b having conductivity and the conductive film 159 in some cases. The coating film 156 is formed using a compound including X. The compound including X is formed by reaction between X in the Cu—X alloy film included in the conductive film 159 and an element included in the oxide semiconductor film 155b having conductivity or the insulating film 157. As the compound including X, oxide including X, nitride including X, silicide including X, carbide including X, and the like are given. As examples of the oxide including X, X oxide, In—X oxide, Ga—X oxide, In—Ga—X oxide, In—Ga—Zn—X oxide, and the like are given. By forming the coating film 156 serving as a blocking film against Cu, entry of Cu in the Cu—X alloy film into the oxide semiconductor film 155b having conductivity can be suppressed.

As an example of the conductive film 159a, a Cu—Mn alloy film is used, whereby the adhesion between the conductive film 159a and the underlying oxide semiconductor film 155b having conductivity can be increased. Furthermore, by using the Cu—Mn alloy film, a favorable ohmic contact can be obtained between the conductive film 159 and the oxide semiconductor film 155b having conductivity.

As a specific example, the coating film 156 is formed in the following manner in some cases: after the formation of the Cu—Mn alloy film, by heat treatment at a temperature higher than or equal to 150° C. and lower than or equal to 450° C., preferably at a temperature higher than or equal to 250° C. and lower than or equal to 350° C. or by forming the insulating film 157 while being heated, Mn in the Cu—Mn alloy film is segregated at the interface between the oxide semiconductor film 155b having conductivity and the conductive film 159a. The coating film 156 can include Mn oxide formed by oxidation of the Mn or In—Mn oxide, Ga—Mn oxide, In—Ga—Mn oxide, In—Ga—Zn—Mn oxide, or the like, which is formed by reaction between the segregated Mn and a constituent element in the oxide semiconductor film 155b having conductivity. With the coating film 156, the adhesion between the oxide semiconductor film 155b having conductivity and the conductive film 159a is improved. Furthermore, with the segregation of Mn in the Cu—Mn alloy film, part of the Cu—Mn alloy film becomes a pure Cu film, so that the conductive film 159a can obtain high conductivity.

Figure 1E:
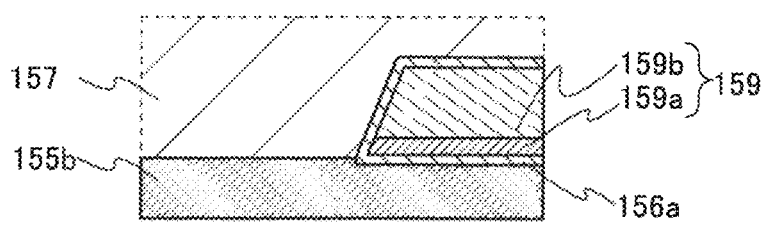

Alternatively, as illustrated in FIG. 1E, a coating film 156a is formed on at least one of the bottom surface, side surface, and top surface of the conductive film 159, preferably on the outer periphery of the conductive film 159 in some cases. The coating film 156a is formed using a compound including X. The compound including X is formed by reaction between X in the Cu—X alloy film included in the conductive film 159 and an element included in the oxide semiconductor film 155b having conductivity or the insulating film 157. As the compound including X, oxide including X, nitride including X, silicide including X, carbide including X, and the like are given.

In the case where an oxide insulating film is formed as the insulating film 157, in a region where the coating film 156a is in contact with the conductive film 159b, an oxide of a low-resistance material is formed. Note that X in the Cu—X alloy film is included in the region where the coating film 156a is in contact with the conductive film 159b in some cases. This is probably due to an attachment of a residue generated in the etching of the conductive film 159a, the attachment of the residue in the formation of the insulating film 157, the attachment of the residue at the heat treatment, or the like. Furthermore, X in the Cu—X alloy film is oxidized to oxide in some cases.

For example, a copper (Cu) film is preferably used as the conductive film 159b, because the thickness of the conductive film 159b can be increased to improve the conductivity of the conductive film 159. Here, the copper (Cu) film refers to pure copper (Cu), and the purity is preferably 99% or higher. Note that the pure copper (Cu) may include an impurity element at several percent.

The conductive film 159 includes the Cu—X alloy film, whereby a semiconductor device in which entry of the copper (Cu) into the oxide semiconductor film 155b having conductivity is suppressed and a wiring has high conductivity can be obtained.

As the substrate 151, a variety of substrates can be used without particular limitation. Examples of the substrate include a semiconductor substrate (e.g., a single crystal substrate or a silicon substrate), a silicon on insulator (SOI) substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film. As an example of a glass substrate, a barium borosilicate glass substrate, an aluminoborosilicate glass substrate, a soda lime glass substrate, or the like can be given. Examples of a flexible substrate, an attachment film, a base material film, and the like are as follows: plastic typified by polyethylene terephthalate (PET), polyethylene naphthalate (PEN), and polyether sulfone (PES); a synthetic resin such as acrylic; polypropylene; polyester; polyvinyl fluoride; polyvinyl chloride; polyamide; polyimide; aramid;

epoxy; an inorganic vapor deposition film; and paper. Specifically, the use of semiconductor substrates, single crystal substrates, SOI substrates, or the like enables the manufacture of small-sized transistors with a small variation in characteristics, size, shape, or the like and with high current capability. A circuit using such transistors achieves lower power consumption of the circuit or higher integration of the circuit.

Furthermore, a flexible substrate may be used as the substrate 151, and a semiconductor element may be formed directly on the flexible substrate. Alternatively, a separation layer may be provided between the substrate 151 and the semiconductor element. The separation layer can be used when part or the whole of a semiconductor element formed over the separation layer is separated from the substrate 151 and transferred onto another substrate. In such a case, the semiconductor element can be transferred onto a substrate having low heat resistance or a flexible substrate as well. As the above separation layer, a stack including inorganic films, such as a tungsten film and a silicon oxide film, or an organic resin film of polyimide or the like formed over a substrate can be used, for example.

Examples of a substrate to which a transistor is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. The use of such a substrate enables formation of a transistor with excellent properties, a transistor with low power consumption, or a device with high durability, high heat resistance, or a reduction in weight or thickness.

As the insulating films 153 and 153a, a single layer or a stacked layer including an oxide insulating film such as a silicon oxide film, a silicon oxynitride film, an aluminum oxide film, a hafnium oxide film, a gallium oxide film, or a Ga—Zn-based metal oxide film may be used. Alternatively, the insulating films 153 and 153a may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide. Note that in this specification, "silicon oxynitride film" refers to a film that contains more oxygen than nitrogen, and "silicon nitride oxide film" refers to a film that contains more nitrogen than oxygen.

Alternatively, the insulating films 153 and 153a can be formed using a nitride insulating film such as a silicon nitride film, a silicon nitride oxide film, an aluminum nitride film, or an aluminum nitride oxide film.

<Formation Method 1 of Oxide Semiconductor Film 155b Having Conductivity and Conductive Film 159>

First of all, a method for forming the oxide semiconductor film 155b having conductivity and the conductive film 159, which are illustrated in FIG. 1A, is described with reference to FIGS. 2A to 2D.

First, the substrate 151 is prepared. Here, a glass substrate is used as the substrate 151.

Figure 2A:
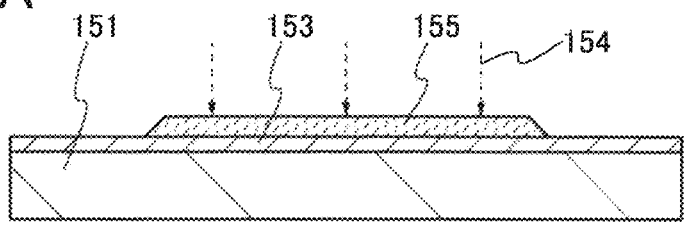
FIGS. 2A to 2D are cross-sectional views illustrating one embodiment of a method for manufacturing a semiconductor device of the present invention.

As illustrated in FIG. 2A, the insulating film 153 is formed over the substrate 151, and an oxide semiconductor film 155 is formed over the insulating film 153. Then, a rare gas 154 such as helium, neon, argon, krypton, or xenon is added to the oxide semiconductor film 155.

The insulating film 153 can be formed by a sputtering method, a CVD method, a vacuum evaporation method, a pulsed laser deposition (PLD) method, a thermal CVD method, or the like.

A formation method of the oxide semiconductor film 155 is described below.

An oxide semiconductor film is formed by a sputtering method, a coating method, a pulsed laser deposition method, a laser ablation method, a thermal CVD method, or the like. Then, by forming a mask over the oxide semiconductor film through a photolithography process and etching the oxide semiconductor film with the mask, the oxide semiconductor film 155 can be formed.

As a sputtering gas, a rare gas (typically argon), an oxygen gas, or a mixed gas of a rare gas and an oxygen gas is used as appropriate. In the case of using the mixed gas of a rare gas and an oxygen gas, the proportion of an oxygen gas to a rare gas is preferably increased.

Furthermore, a target may be appropriately selected in accordance with the composition of the oxide semiconductor film to be formed.

For example, in the case where the oxide semiconductor film is formed by a sputtering method at a substrate temperature higher than or equal to 150° C. and lower than or equal to 750° C., preferably higher than or equal to 150° C. and lower than or equal to 450° C., more preferably higher than or equal to 200° C. and lower than or equal to 350° C., the oxide semiconductor film can be a CAAC-OS film.

For the deposition of the CAAC-OS film as the oxide semiconductor film, the following conditions are preferably used.

By suppressing entry of impurities into the CAAC-OS film during the deposition, the crystal state can be prevented from being broken by the impurities. For example, the impurity concentration (e.g., hydrogen, water, carbon dioxide, and nitrogen) which exist in the deposition chamber may be reduced. Furthermore, the impurity concentration in a deposition gas may be reduced. Specifically, a deposition gas whose dew point is −80° C. or lower, preferably −100° C. or lower is used.

In the case where an oxide semiconductor film, e.g., an In—Ga—Zn—O film is formed using a deposition apparatus employing ALD, an $In(CH_3)_3$ gas and an $O_3$ gas are sequentially introduced plural times to form an In—O layer, a $Ga(CH_3)_3$ gas and an $O_3$ gas are introduced at a time to form a GaO layer, and then a $Zn(CH_3)_2$ gas and an $O_3$ gas are introduced at a time to form a ZnO layer. Note that the order of these layers is not limited to this example. A mixed compound layer such as an In—Ga—O layer, an In—Zn—O layer, or a Ga—Zn—O layer may be formed by mixing of these gases. Note that although an $H_2O$ gas which is obtained by bubbling with an inert gas such as Ar may be used instead of an $O_3$ gas, it is preferable to use an $O_3$ gas that does not contain H. Instead of an $In(CH_3)_3$ gas, an $In(C_2H_5)_3$ may be used. Instead of a $Ga(CH_3)_3$ gas, a $Ga(C_2H_5)_3$ gas may be used. Furthermore, a $Zn(CH_3)_2$ gas may be used.

After that, hydrogen, water, and the like may be released from the oxide semiconductor film 155 by heat treatment to reduce at least the hydrogen concentration in the oxide semiconductor film 155. By the heat treatment, oxygen is released from the oxide semiconductor film 155, so that defects can be formed. As a result, variation in hydrogen concentration in the oxide semiconductor film 155b formed later can be reduced. The heat treatment is performed typically at a temperature higher than or equal to 250° C. and lower than or equal to 650° C., preferably higher than or equal to 300° C. and lower than or equal to 500° C. The heat treatment is performed typically at a temperature higher than or equal to 300° C. and lower than or equal to 400° C., preferably higher than or equal to 320° C. and lower than or equal to 370° C., whereby warp or shrinking of a large-sized substrate can be reduced and yield can be improved.

An electric furnace, an RTA apparatus, or the like can be used for the heat treatment. With the use of an RTA apparatus, the heat treatment can be performed at a temperature of higher than or equal to the strain point of the substrate if the heating time is short. Thus, the heat treatment time can be shortened and warp of the substrate during the heat treatment can be reduced, which is particularly preferable in a large-sized substrate.

The heat treatment may be performed under an atmosphere of nitrogen, oxygen, ultra-dry air (air in which a water content is 20 ppm or less, preferably 1 ppm or less, more preferably 10 ppb or less), or a rare gas (argon, helium, or the like). The atmosphere of nitrogen, oxygen, ultra-dry air, or a rare gas preferably does not contain hydrogen, water, and the like.

As the rare gas 154, helium, neon, argon, xenon, krypton, or the like can be used as appropriate. Furthermore, as methods for adding the rare gas 154 to the oxide semiconductor film 155, a doping method, an ion implantation method, and the like are given. Alternatively, the rare gas 154 can be added to the oxide semiconductor film 155 by exposing the oxide semiconductor film 155 to plasma including the rare gas 154.

Figure 2B:
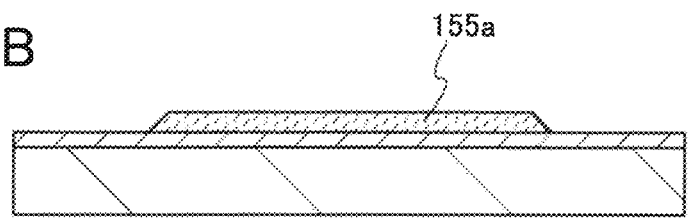

As a result, as illustrated in FIG. 2B, an oxide semiconductor film 155a including defects can be formed.

Then, the oxide semiconductor film 155a including defects is heated in an atmosphere including impurities. The heat treatment is performed in an atmosphere including one or more of hydrogen, nitrogen, water vapor, and the like as the atmosphere including impurities.

Alternatively, after the surface of the oxide semiconductor film 155a including defects is exposed to a solution including boron, phosphorus, alkali metal, alkaline earth metal, or the like heat treatment is performed.

The heat treatment is preferably performed under a condition for supplying impurities to the oxide semiconductor film, and typically performed at a heating temperature higher than or equal to 250° C. and lower than or equal to 350° C. By performing heat treatment at 350° C. or lower, impurities can be supplied to the oxide semiconductor film while the release of the impurities from the oxide semiconductor film is minimized. Note that the heat treatment is preferably performed under a pressure higher than or equal to 0.1 Pa, further preferably higher than or equal to 0.1 Pa and lower than or equal to 101325 Pa, still further preferably higher than or equal to 1 Pa and lower than or equal to 133 Pa.

Figure 2C:
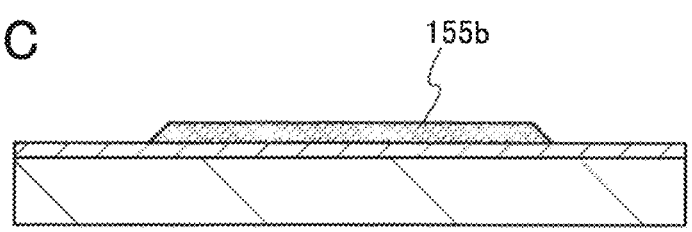

As a result, as illustrated in FIG. 2C, the oxide semiconductor film 155b having conductivity can be formed. The oxide semiconductor film 155b having conductivity includes defects and impurities. By the effect of the defects and the impurities, the conductivity of the oxide semiconductor film 155b having conductivity is increased as compared to that of the oxide semiconductor film 155. As an example of the action of defects and impurities, hydrogen enters an oxygen vacancy, whereby an electron serving as a carrier is generated. Alternatively, bonding of part of hydrogen to oxygen bonded to a metal atom causes generation of an electron serving as a carrier. By these actions, the conductivity of the oxide semiconductor film is increased. As a result, the oxide semiconductor film 155b having conductivity serves as an electrode or a wiring. Furthermore, the oxide semiconductor film 155b having conductivity has a light-transmitting property. Thus, a light-transmitting electrode or a light-transmitting wiring can be formed.

Note that the resistivity of the oxide semiconductor film 155b having conductivity is higher than that of the conductive film 159. Thus, as a lead wiring, the conductive film 159 is preferably in contact with the oxide semiconductor film 155b.

Figure 2D:
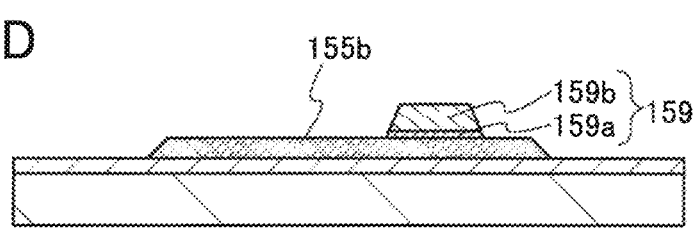

Next, as illustrated in FIG. 2D, the conductive film 159 is formed over the oxide semiconductor film 155b having conductivity. Here, after a stack of the Cu—X alloy film and the conductive film including a low-resistance material is formed, a mask is formed over the conductive film including a low-resistance material by a photolithography process and the Cu—X alloy film and the conductive film including a low-resistance material are etched using the mask, whereby the conductive film 159 in which the conductive film 159a formed of the Cu—X alloy film and the conductive film 159b formed of the conductive film including a low-resistance material are stacked can be formed.

As a method for etching the Cu—X alloy film and the conductive film including a low-resistance material, a dry etching method or a wet etching method can be used as appropriate. In the case where a copper (Cu) film is used as the conductive film including a low-resistance material, a wet etching method is preferably used. The Cu—X alloy film can be etched by a wet etching method; thus, when the Cu—X alloy film and the copper (Cu) film are stacked, the conductive film 159 in which the conductive film 159a formed of the Cu—X alloy film and the conductive film 159b formed of the conductive film including a low-resistance material are stacked can be formed in a single wet etching step. As an etchant used in the wet etching method, an etchant containing an organic acid solution and hydrogen peroxide water, or the like is used.

Through the above steps, the oxide semiconductor film having conductivity and the conductive film in contact with the oxide semiconductor film having conductivity can be formed.

<Formation Method 2 of Oxide Semiconductor Film 155b Having Conductivity and Conductive Film 159>

A formation method of the oxide semiconductor film 155b having conductivity which is different from the method in FIGS. 2A to 2D is described with reference to FIGS. 3A to 3D.

Figure 3A:
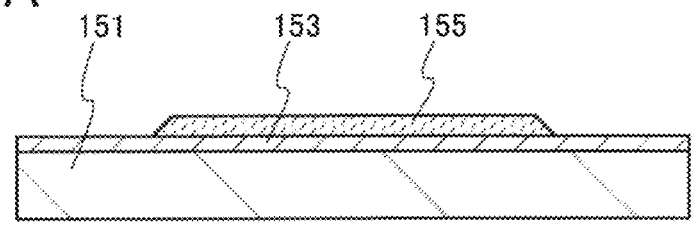
FIGS. 3A to 3D are cross-sectional views illustrating one embodiment of a method for manufacturing a semiconductor device of the present invention.
Figure 3B:
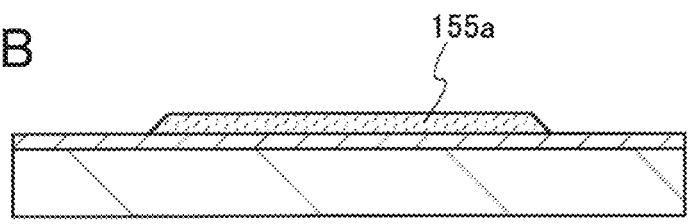

As illustrated in FIG. 3A, the insulating film 153 is formed over the substrate 151, and the oxide semiconductor film 155 is formed over the insulating film 153. Then, heat treatment is performed in vacuum. By performing heat treatment in vacuum, oxygen is released from the oxide semiconductor film 155, so that the oxide semiconductor film 155a including defects can be obtained as illustrated in FIG. 3B. Note that a typical example of the defects included in the oxide semiconductor film 155a is oxygen vacancies.

The heat treatment is preferably performed under a condition for releasing oxygen from the oxide semiconductor film, and typically performed at a temperature higher than or equal to 350° C. and lower than or equal to 800° C., preferably higher than or equal to 450° C. and lower than or equal to 800° C. By performing heat treatment at 350° C. or higher, oxygen is released from the oxide semiconductor film. In addition, by performing heat treatment at 800° C. or lower, oxygen can be released from the oxide semiconductor film while the crystal structure of the oxide semiconductor film is maintained. Moreover, heating is preferably performed in vacuum, typically under a pressure higher than or equal to $1\times10^{-7}$ Pa and lower than or equal to 10 Pa, preferably higher than or equal to $1\times10^{-7}$ Pa and lower than or equal to 1 Pa, further preferably higher than or equal to $1\times10^{-7}$ Pa and lower than or equal to $1E^{-1}$ Pa.

Next, by a method similar to that in FIG. 2B, the oxide semiconductor film 155a including defects is heated in an atmosphere including impurities. The heat treatment is performed in an atmosphere including one or more of hydrogen, nitrogen, water vapor, and the like as the atmosphere including impurities.

Alternatively, after the surface of the oxide semiconductor film 155a including defects is exposed to a solution including boron, phosphorus, alkali metal, or alkaline earth metal, heat treatment is performed.

Figure 3C:
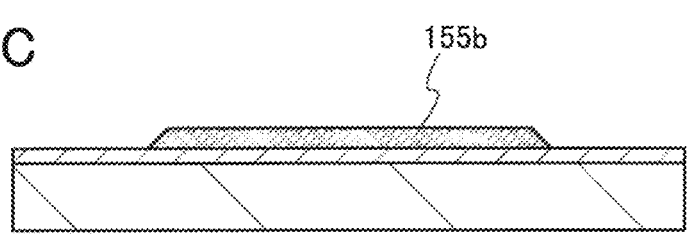

As a result, as illustrated in FIG. 3C, the oxide semiconductor film 155b having conductivity can be formed.

Figure 3D:
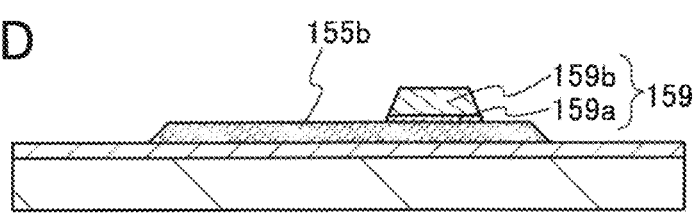

Next, by a method similar to that in FIG. 2D, the conductive film 159 can be formed over the oxide semiconductor film 155b having conductivity (see FIG. 3D).

<Formation Method 3 of Oxide Semiconductor Film 155b Having Conductivity and Conductive Film 159>

A formation method of the oxide semiconductor film 155b having conductivity which is different from the methods in FIGS. 2A to 2D and FIGS. 3A to 3D is described with reference to FIGS. 4A to 4C.

Figure 4A:
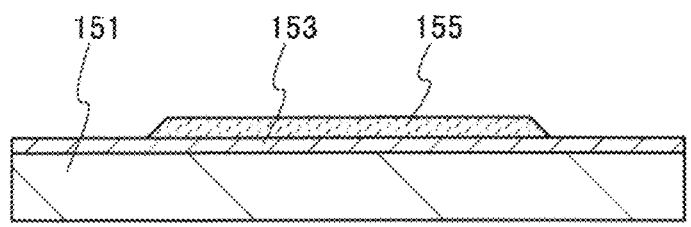
FIGS. 4A to 4C are cross-sectional views illustrating one embodiment of a method for manufacturing a semiconductor device of the present invention.

As illustrated in FIG. 4A, after the insulating film 153 is formed over the substrate 151, the oxide semiconductor film 155 is formed over the insulating film 153.

Figure 4B:
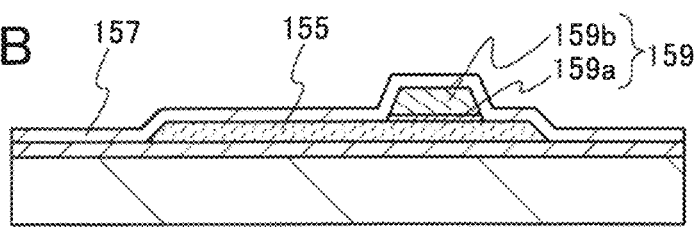
Figure 4C:
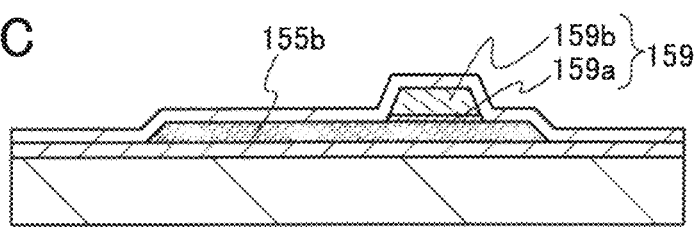

Next, by a method similar to that in FIG. 2D, the conductive film 159 is formed over the oxide semiconductor film 155 (see FIG. 4B). Here, as the conductive film 159, the conductive film 159a and the conductive film 159b are formed.

Next, the insulating film 157 including hydrogen is formed over the insulating film 153, the oxide semiconductor film 155, and the conductive film 159. The insulating film 157 is formed by a sputtering method, a plasma CVD method, or the like. The insulating film 157 may be formed while being heated. Alternatively, heat treatment may be performed after the insulating film 157 is formed.

By using a sputtering method, a plasma CVD method, or the like as a formation method of the insulating film 157, the oxide semiconductor film 155 is damaged and defects are generated. Furthermore, the insulating film 157 is formed while heating or heat treatment is performed after the insulating film 157 is formed, whereby hydrogen included in the insulating film 157 moves to the oxide semiconductor film 155. As a result, as illustrated in FIG. 4C, the oxide semiconductor film 155b having conductivity can be formed. By the action of defects and impurities, the conductivity of the oxide semiconductor film 155b having conductivity is increased as compared to that of the oxide semiconductor film 155. Thus, the oxide semiconductor film 155b having conductivity serves as an electrode or a wiring.

Modification Example 1

Modification examples of the conductive film 159 are described with reference to FIGS. 5A to 5F. Here, modification examples of the conductive film 159 in FIG. 1B are shown; however, the modification examples can be used in the conductive film 159 in FIGS. 1A and 1C as appropriate.

Figure 5A:
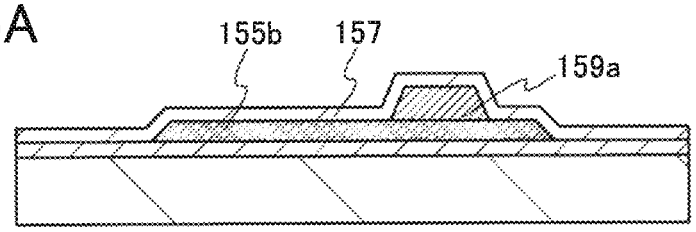
FIGS. 5A to 5F are cross-sectional views illustrating embodiments of a semiconductor device of the present invention.

As illustrated in FIG. 5A, the conductive film 159a can be formed of a single layer of the Cu—X alloy film over the oxide semiconductor film 155b having conductivity.

Figure 5B:
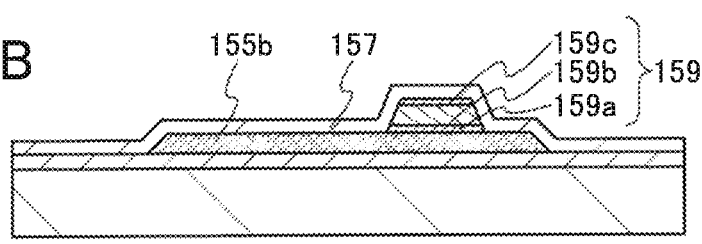

Alternatively, as illustrated in FIG. 5B, the conductive film 159 can be formed over the oxide semiconductor film 155b having conductivity by stacking the conductive film 159a formed of the Cu—X alloy film, the conductive film 159b formed of the conductive film including a low-resistance material, and a conductive film 159c formed of the Cu—X alloy film.

When the conductive film 159 includes the conductive film 159c formed of the Cu—X alloy film over the conductive film 159b formed of the conductive film including a low-resistance material, the conductive film 159c formed of the Cu—X alloy film serves as a protective film of the conductive film 159b including a low-resistance material; thus, the reaction of the conductive film 159b including a low-resistance material in the formation of the insulating film 157 can be prevented.

Figure 5C:
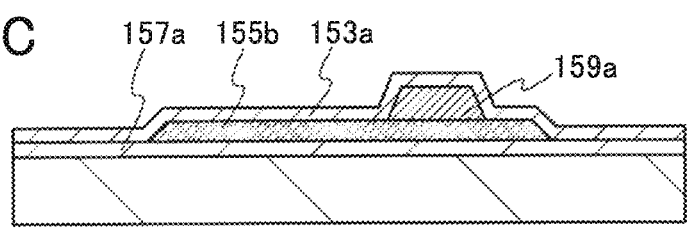
Figure 5D:
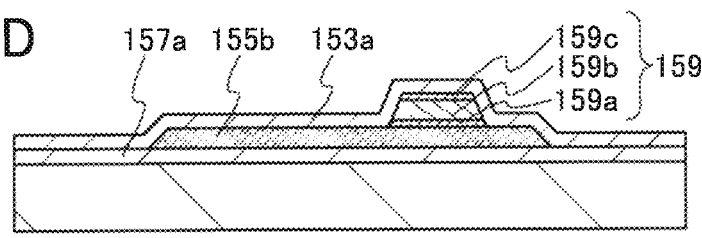

Alternatively, as illustrated in FIGS. 5C and 5D, the oxide semiconductor film 155b having conductivity may be formed over the insulating film 157a formed of a film including hydrogen. In this case, the insulating film 153a can be provided over the oxide semiconductor film 155b having conductivity and the conductive film 159.

Figure 5E:
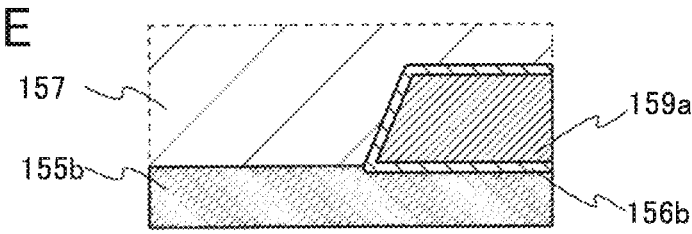
Figure 5F:
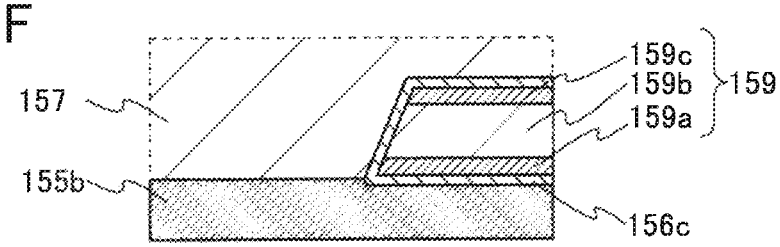

Next, FIGS. 5E and 5F show enlarged views of regions where the oxide semiconductor film 155b having conductivity is in contact with the conductive film 159 and the conductive film 159a respectively. As illustrated in FIG. 5E, a coating film 156b is formed on at least one of the bottom surface, side surface, and top surface of the conductive film 159a, preferably on the outer periphery of the conductive film 159a in some cases. The coating film 156b is formed using a compound including X. The compound including X is formed by reaction between X in the Cu—X alloy film included in the conductive film 159a and an element included in the oxide semiconductor film 155b having conductivity or the insulating film 157. As the compound including X, oxide including X, nitride including X, silicide including X, carbide including X, and the like are given.

In the case where a Cu—Mn alloy film is used as the Cu—X alloy film, as an example of the coating film 156b, a manganese oxide film is formed.

Alternatively, as illustrated in FIG. 5F, a coating film 156c is formed on at least one of the bottom surface, side surface, and top surface of the conductive film 159, preferably on the outer periphery of the conductive film 159 in some cases. The coating film 156c is formed using a compound including X. The compound including X is formed by reaction between X in the Cu—X alloy film included in the conductive film 159 and an element included in the oxide semiconductor film 155b having conductivity or the insulating film 157. In a region where the coating film 156c is in contact with the conductive film 159b, an oxide of the low-resistance material is formed. Furthermore, X in the Cu—X alloy film is included in the region where the coating film 156c is in contact with the conductive film 159b in some cases. This is probably due to an attachment of a residue generated in the etching of the conductive film 159a or the conductive film 159c, the attachment of the residue in the formation of the insulating film 157, the attachment of the residue at the heat treatment, or the like. Furthermore, X in the Cu—X alloy film is oxidized to oxide in some cases. Thus, in the case where a Cu—Mn alloy film is used as the conductive film 159b, as an example of the coating film 156c, a manganese oxide film is formed.

Modification Example 2

Here, modification examples of the oxide semiconductor film having conductivity and the conductive film are described with reference to FIGS. 6A to 6C.

Figure 6A:
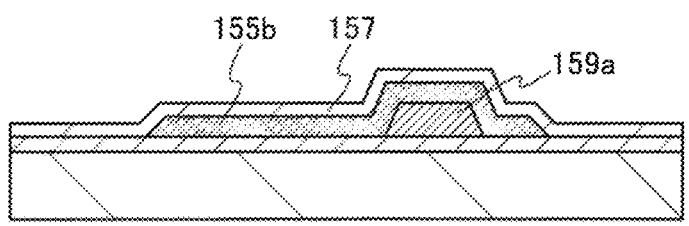
FIGS. 6A to 6C are cross-sectional views illustrating embodiments of a semiconductor device of the present invention.

In FIG. 6A, a single layer of the conductive film 159a formed of the Cu—X alloy film is provided between the insulating film 153 and the oxide semiconductor film 155b having conductivity.

Figure 6B:
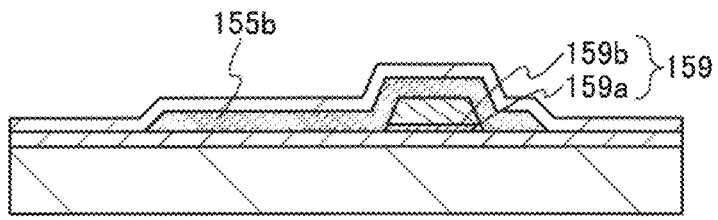

Alternatively, as illustrated in FIG. 6B, the conductive film 159 having a two-layer structure is provided between the insulating film 153 and the oxide semiconductor film 155b having conductivity. The conductive film 159 is formed by stacking the conductive film 159a formed of the Cu—X alloy film and the conductive film 159b formed of the conductive film including a low-resistance material.

Figure 6C:
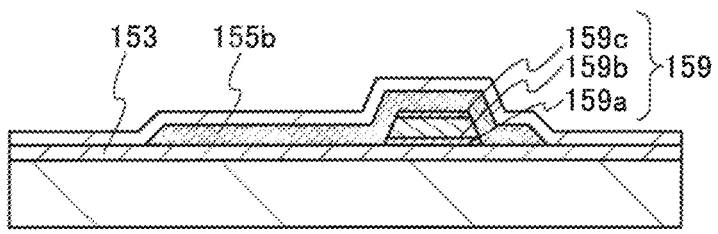

Alternatively, as illustrated in FIG. 6C, the conductive film 159 having a three-layer structure is provided between the insulating film 153 and the oxide semiconductor film 155b having conductivity. The conductive film 159 is formed by stacking the conductive film 159a formed of the Cu—X alloy film, the conductive film 159b formed of the conductive film including a low-resistance material, and the conductive film 159c formed of the Cu—X alloy film.

When the conductive film 159c formed of the Cu—X alloy film is provided over the conductive film 159b formed of the conductive film including a low-resistance material in the conductive film 159, the conductive film 159c formed of the Cu—X alloy film serves as a protective film of the conductive film 159b including a low-resistance material; thus, the reaction of the conductive film 159b including a low-resistance material in the formation of the oxide semiconductor film 155b having conductivity can be prevented.

The structures, methods, and the like described in this embodiment can be used as appropriate in combination with any of the structures, methods, and the like described in the other embodiments.

Embodiment 2

In this embodiment, a resistor including the oxide semiconductor film having conductivity in Embodiment 1 is described with reference to FIGS. 7A to 7D, FIGS. 8A and 8B, FIGS. 9A and 9B, FIGS. 10A and 10B, and FIGS. 11A to 11C.

FIGS. 7A to 7D are cross-sectional views of resistors included in a semiconductor device.

Figure 7A:
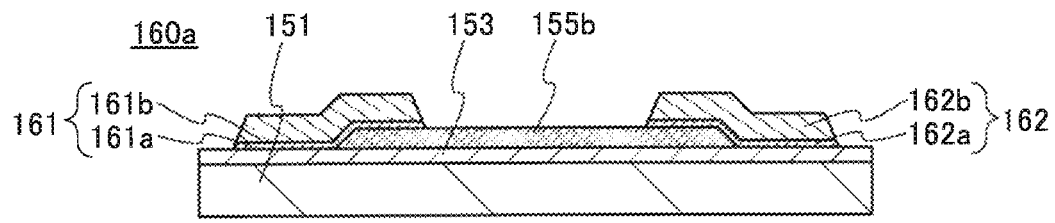
FIGS. 7A to 7D are cross-sectional views illustrating embodiments of a semiconductor device of the present invention.

A resistor 160a in FIG. 7A includes the oxide semiconductor film 155b having conductivity and a pair of conductive films 161 and 162 in contact with the oxide semiconductor film 155b having conductivity. The oxide semiconductor film 155b having conductivity and the pair of conductive films 161 and 162 are provided over the insulating film 153 formed over the substrate 151.

Furthermore, each of the conductive films 161 and 162 may have a single layer structure or a stacked-layer structure of two or more layers. The pair of conductive films 161 and 162 can be formed using a structure, a material, and a formation method similar to those of the conductive film 159 in Embodiment 1. That is, the pair of conductive films 161 and 162 includes the Cu—X alloy film.

In the resistor 160a in FIG. 7A, the conductive film 161 has a stacked-layer structure of a conductive film 161a in contact with the oxide semiconductor film 155b having conductivity and a conductive film 161b in contact with the conductive film 161a, and the conductive film 162 has a stacked-layer structure of a conductive film 162a in contact with the oxide semiconductor film 155b having conductivity and a conductive film 162b in contact with the conductive film 162a.

Here, as the conductive films 161a and 162a, the Cu—X alloy film is used. As the conductive films 161b and 162b, the conductive film including a low-resistance material is used.

Figure 7B:
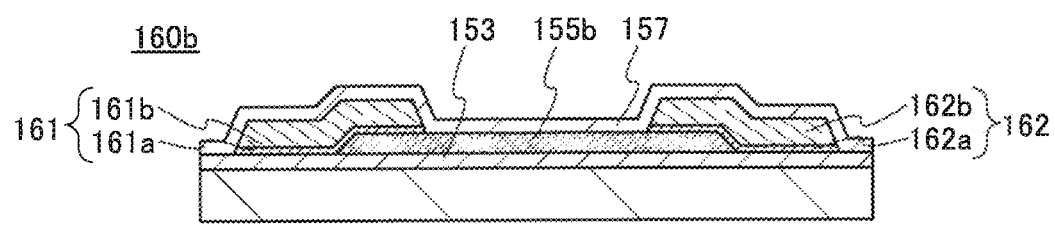

Furthermore, as in a resistor 160b illustrated in FIG. 7B, the insulating film 157 made of a film including hydrogen may be formed over the insulating film 153, the oxide semiconductor film 155b having conductivity, and the pair of conductive films 161 and 162.

Figure 7C:
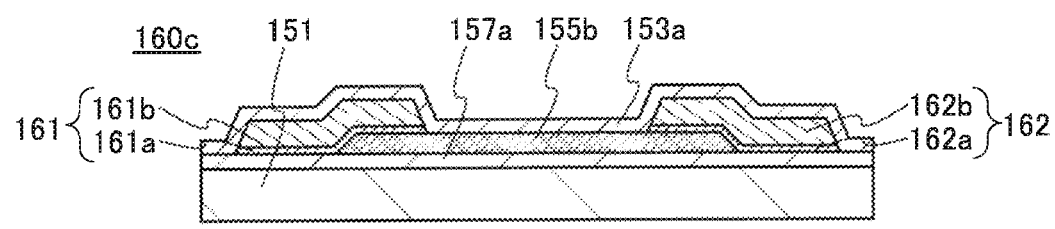

Alternatively, as in a resistor 160c illustrated in FIG. 7C, the oxide semiconductor film 155b having conductivity and the pair of conductive films 161 and 162 may be formed over the insulating film 157a made of a film including hydrogen. In this case, the insulating film 153a can be provided over the oxide semiconductor film 155b having conductivity and the pair of conductive films 161 and 162.

The resistivity of the oxide semiconductor film 155b having conductivity is higher than those of the pair of conductive films 161 and 162 including the Cu—X film. Thus, by providing the oxide semiconductor film 155b having conductivity between the pair of conductive films 161 and 162, they serve as a resistor.

The oxide semiconductor film 155b having conductivity includes defects and impurities. By the effect of the defects and the impurities, the conductivity of the oxide semiconductor film 155b having conductivity is increased. Furthermore, the oxide semiconductor film 155b having conductivity has a light-transmitting property. As a result, a light-transmitting resistor can be formed.

The pair of conductive films 161 and 162 including the Cu—X alloy film is formed over the oxide semiconductor film 155b having conductivity, whereby the adhesion between the oxide semiconductor film 155b having conductivity and the pair of conductive films 161 and 162 can be increased and the contact resistance therebetween can be reduced.

Figure 7D:
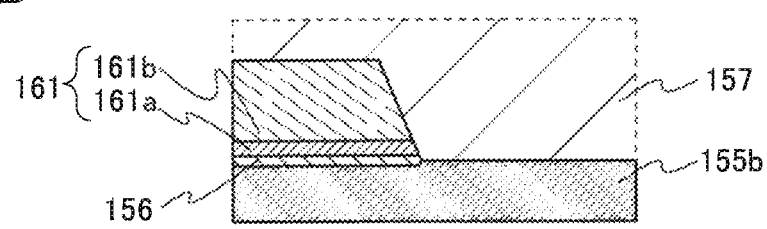

Here, FIG. 7D shows an enlarged view of a region where the oxide semiconductor film 155b having conductivity is in contact with the conductive film 161. When the Cu—X alloy film is used as the conductive film 161a in contact with the oxide semiconductor film 155b having conductivity, the coating film 156 including X in the Cu—X alloy film is formed at an interface between the oxide semiconductor film 155b having conductivity and the conductive film 161a in some cases. By forming the coating film 156 serving as a blocking film against Cu, entry of Cu in the Cu—X alloy film into the oxide semiconductor film 155b having conductivity can be suppressed.

Furthermore, although not illustrated, a coating film such as the coating film 156a is formed on the periphery of the conductive films 161 and 162 in some cases, similarly to the case of the conductive film 159 in Embodiment 1.

<Circuit Diagram of Protection Circuit>

A protection circuit using the resistor in this embodiment is described with reference to FIGS. 8A and 8B. Although a display device is used as a semiconductor device here, a protection circuit can be used in another semiconductor device.

Figure 8A:
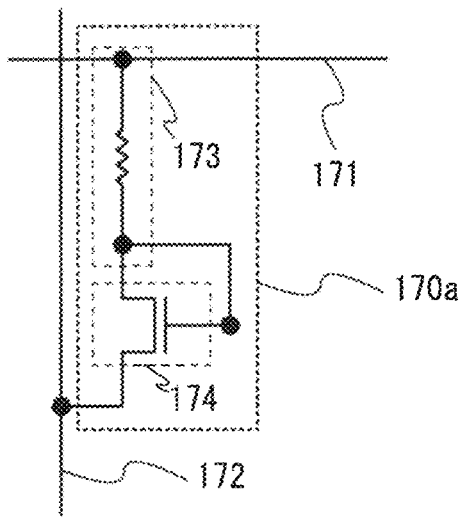
FIGS. 8A and 8B are circuit diagrams each showing one embodiment of a semiconductor device of the present invention.

FIG. 8A illustrates a specific example of a protection circuit 170a included in the semiconductor device.

The protection circuit 170a illustrated in FIG. 8A includes a resistor 173 between a wiring 171 and a wiring 172, and a transistor 174 that is diode-connected.

The resistor 173 is connected to the transistor 174 in series, so that the resistor 173 can control the value of current flowing through the transistor 174 or can function as a protective resistor of the transistor 174 itself.

The wiring 171 is, for example, a lead wiring from a scan line, a data line, or a terminal portion included in a display device to a driver circuit portion. The wiring 172 is, for example, a wiring that is supplied with a potential (VDD, VSS, or GND) of a power supply line for supplying power to a gate driver or a source driver. Alternatively, the wiring 172 is a wiring that is supplied with a common potential (common line).

For example, the wiring 172 is preferably connected to the power supply line for supplying power to a scan line driver circuit, in particular, to a wiring for supplying a low potential. This is because a gate signal line has a low-level potential in most periods, and thus, when the wiring 172 also has a low-level potential, current leaked from the gate signal line to the wiring 172 can be reduced in a normal operation.

Although the resistor 173 illustrated in FIG. 8A is connected in series to the diode-connected transistor, the resistor 173 can be connected in parallel to the diode-connected transistor without being limited to the example in FIG. 8A.

Figure 8B:
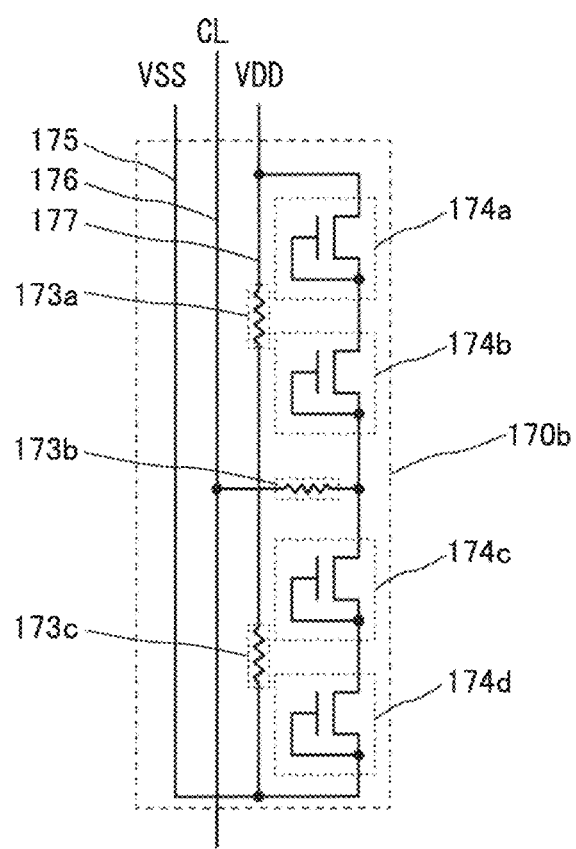

Next, FIG. 8B illustrates a protection circuit including a plurality of transistors and a plurality of resistors.

A protection circuit 170b illustrated in FIG. 8B includes transistors 174a, 174b, 174c, and 174d and resistors 173a, 173b, and 173c. The protection circuit 170b is provided between a set of wirings 175, 176, and 177 and another set of wirings 175, 176, and 177. The wirings 175, 176, and 177 are connected to one or more of a scan line driver circuit, a signal line driver circuit, and a pixel portion. In addition, a first terminal serving as a source electrode of the transistor 174a is connected to a second terminal serving as a gate electrode of the transistor 174a, and a third terminal serving as a drain electrode of the transistor 174a is connected to a wiring 177. A first terminal serving as a source electrode of the transistor 174b is connected to a second terminal serving as a gate electrode of the transistor 174b, and a third terminal serving as a drain electrode of the transistor 174b is connected to the first terminal of the transistor 174a. A first terminal serving as a source electrode of the transistor 174c is connected to a second terminal serving as a gate electrode of the transistor 174c, and a third terminal serving as a drain electrode of the transistor 174c is connected to the first terminal of the transistor 174b. A first terminal serving as a source electrode of the transistor 174d is connected to a second terminal serving as a gate electrode of the transistor 174d, and a third terminal serving as a drain electrode of the transistor 174d is connected to the first terminal of the transistor 174c. In addition, the resistors 173a and 173c are provided in the wiring 177. The resistor 173b is provided between the wiring 176 and the first terminal of the transistor 174b and the third terminal of the transistor 174c.

Note that the wiring 175 can be used as a power supply line to which the low power supply potential VSS is applied, for example. The wiring 176 can be used as a common line, for example. The wiring 177 can be used as a power supply line to which the high power supply potential VDD is applied.

Figure 9A:
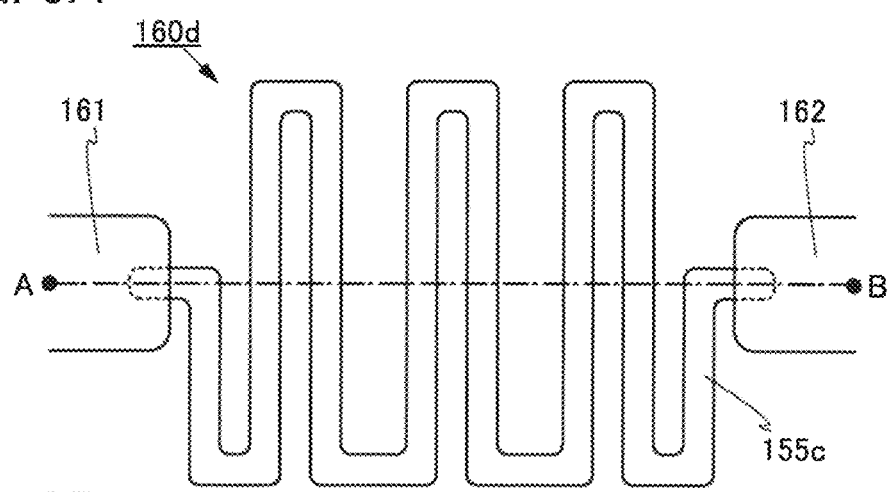
FIGS. 9A and 9B are a top view and a cross-sectional view illustrating one embodiment of a semiconductor device of the present invention.
Figure 9B:
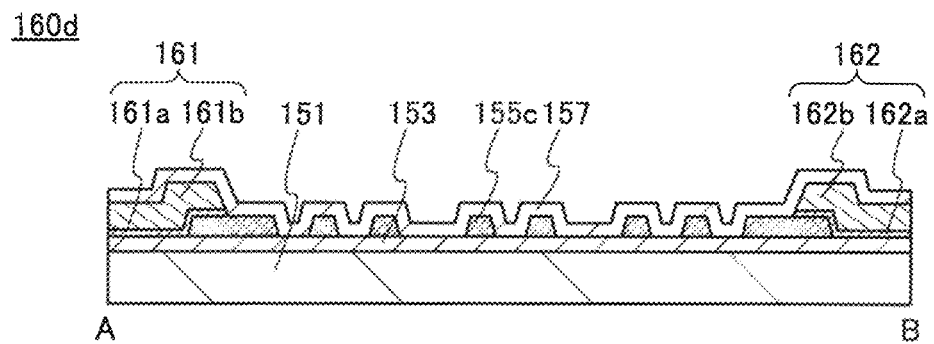

The resistor in this embodiment can be used as the resistors in FIGS. 8A and 8B. By appropriately adjusting the shape, specifically the length or the width, of the oxide semiconductor film having conductivity included in the resistor, the resistor can have a given resistance. FIGS. 9A and 9B illustrate an example of a resistor 160d. FIG. 9A is a top view of the resistor 160d, and FIG. 9B is a cross-sectional view taken along dashed-dotted line A-B in FIG. 9A. As in the resistor 160d illustrated in FIGS. 9A and 9B, the top surface of an oxide semiconductor film 155c having conductivity has a zigzag shape, whereby the resistance of the resistor can be controlled.

In this manner, the protection circuit 170b includes the plurality of transistors that are diode-connected and the plurality of resistors. In other words, the protection circuit 170b can include diode-connected transistors and resistors that are combined in parallel.

With the protection circuit, the semiconductor device can have an enhanced resistance to overcurrent due to electrostatic discharge (ESD). Therefore, a semiconductor device with improved reliability can be provided.

Furthermore, because the resistor can be used as the protection circuit and the resistance of the resistor can be controlled arbitrarily, the diode-connected transistor or the like that is used as the protection circuit can also be protected.

The structure described in this embodiment can be used in appropriate combination with the structure described in any of the other embodiments.

Modification Example 1

Figure 10A:
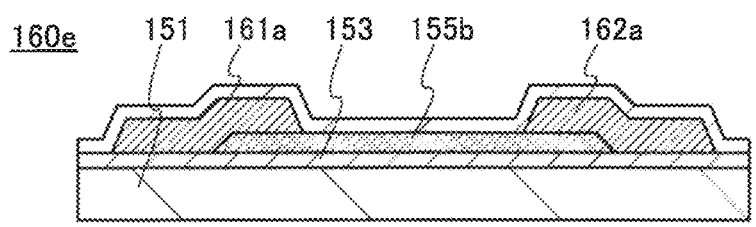
FIGS. 10A and 10B are cross-sectional views illustrating embodiments of a semiconductor device of the present invention.

As in a resistor 160e illustrated in FIG. 10A, each of the conductive films 161a and 162a can be formed of a single layer of the Cu—X alloy film over the oxide semiconductor film 155b having conductivity.

Figure 10B:
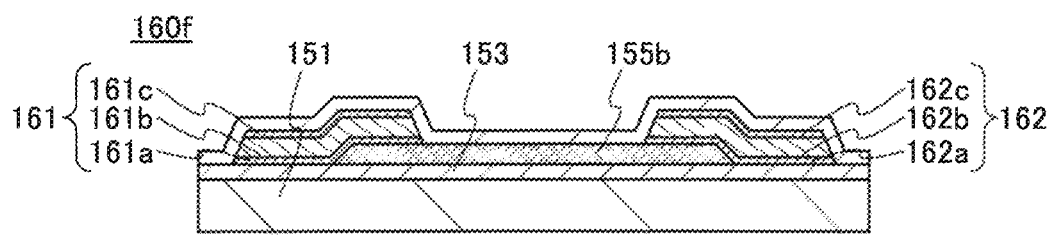

Alternatively, as in a resistor 160f illustrated in FIG. 10B, the pair of conductive films 161 and 162 can have a three-layer structure. The conductive film 161 has a stacked-layer structure of the conductive film 161a in contact with the oxide semiconductor film 155b having conductivity, the conductive film 161b in contact with the conductive film 161a, and a conductive film 161c in contact with the conductive film 161b. The conductive film 162 has a stacked-layer structure of the conductive film 162a in contact with the oxide semiconductor film 155b having conductivity, the conductive film 162b in contact with the conductive film 162a, and a conductive film 162c in contact with the conductive film 162b.

When the pair of conductive films 161 and 162 includes the conductive films 161c and 162c formed of the Cu—X alloy film over the conductive films 161b and 162b formed of the conductive film including a low-resistance material, the conductive films 161c and 162c formed of the Cu—X alloy film serve as protective films of the conductive films 161b and 162b including a low-resistance material; thus, the reaction of the conductive films 161b and 162b including a low-resistance material in the formation of the insulating film 157 can be prevented.

Furthermore, although not illustrated, a coating film such as the coating films 156b and 156c is formed on the periphery of the conductive films 161 and 162 in some cases, similarly to the case of the conductive film 159 in Embodiment 1.

Modification Example 2

Here, a modification example of a resistor is described with reference to FIGS. 11A to 11C.

Figure 11A:
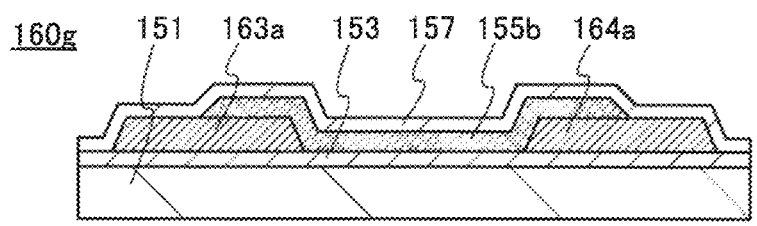
FIGS. 11A to 11C are cross-sectional views illustrating embodiments of a semiconductor device of the present invention.

A resistor 160g in FIG. 11A includes the pair of conductive films 163a and 164a formed of the single-layer Cu—X alloy film between the insulating film 153 and the oxide semiconductor film 155b having conductivity.

Figure 11B:
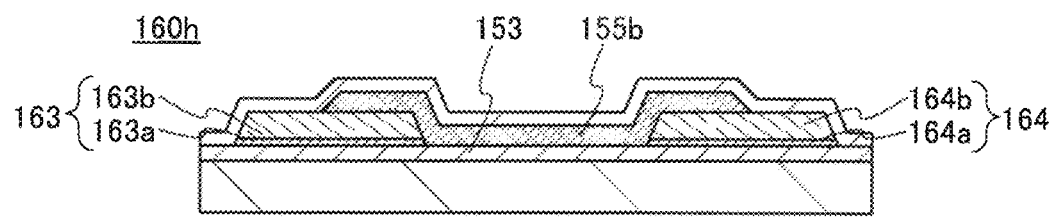

Alternatively, as illustrated in FIG. 11B, in a resistor 160h, the pair of conductive films 163 and 164 is provided between the insulating film 153 and the oxide semiconductor film 155b having conductivity and has a two-layer structure.

The conductive film 163 is formed by stacking the conductive film 163a formed of the Cu—X alloy film and the conductive film 163b formed of the conductive film including a low-resistance material. The conductive film 164 is formed by stacking the conductive film 164a formed of the Cu—X alloy film and the conductive film 164b formed of the conductive film including a low-resistance material.

Figure 11C:
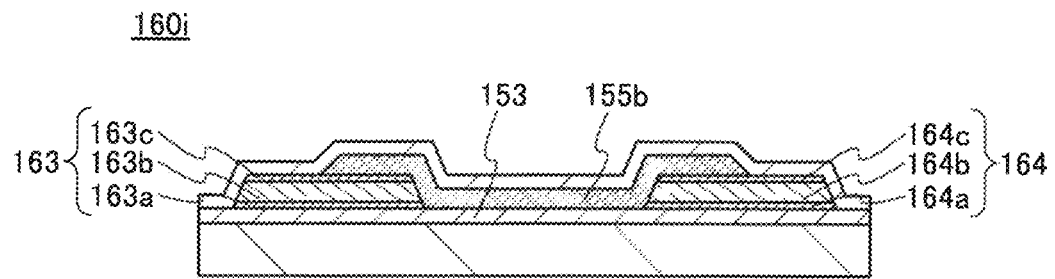

Alternatively, as illustrated in FIG. 11C, in a resistor 160i, the pair of conductive films 163 and 164 is provided between the insulating film 153 and the oxide semiconductor film 155b having conductivity and has a three-layer structure. The conductive film 163 is formed by stacking the conductive film 163a formed of the Cu—X alloy film, the conductive film 163b formed of the conductive film including a low-resistance material, and the conductive film 163c formed of the Cu—X alloy film. The conductive film 164 is formed by stacking the conductive film 164a formed of the Cu—X alloy film, the conductive film 164b formed of the conductive film including a low-resistance material, and the conductive film 164c formed of the Cu—X alloy film.

When the conductive films 163c and 164c formed of the Cu—X alloy film are provided over the conductive films 163b and 164b formed of the conductive film including a low-resistance material in the pair of conductive films 163 and 164, the conductive films 163c and 164c formed of the Cu—X alloy film serve as protective films of the conductive films 163b and 164b formed of a conductive film including a low-resistance material; thus, the reaction of the conductive films 163b and 164b including a low-resistance material in the formation of the oxide semiconductor film 155b having conductivity and the insulating film 157 can be prevented.

Furthermore, although not illustrated, a coating film such as the coating films 156, 156a, 156b and 156c is formed on the periphery of the pair of conductive films 163 and 164 in some cases, similarly to the case of the conductive film 159 in Embodiment 1.

The structures, methods, and the like described in this embodiment can be used as appropriate in combination with any of the structures, methods, and the like described in the other embodiments.

Embodiment 3

In this embodiment, a capacitor including the oxide semiconductor film having conductivity in Embodiment 1 is described with reference to FIGS. 12A to 12C, FIGS. 13A and 13B, and FIGS. 14A to 14C.

Figure 12A:
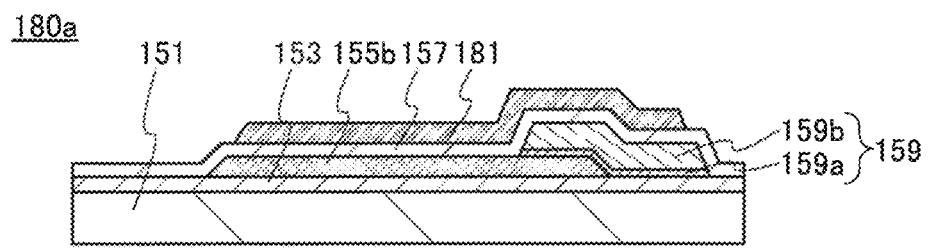
FIGS. 12A to 12C are cross-sectional views illustrating embodiments of a semiconductor device of the present invention.
Figure 12B:
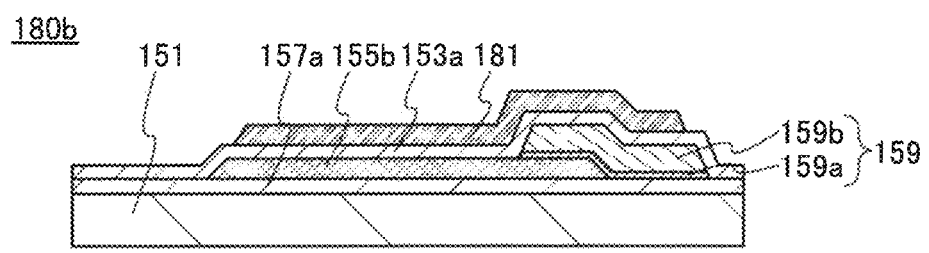
Figure 12C:
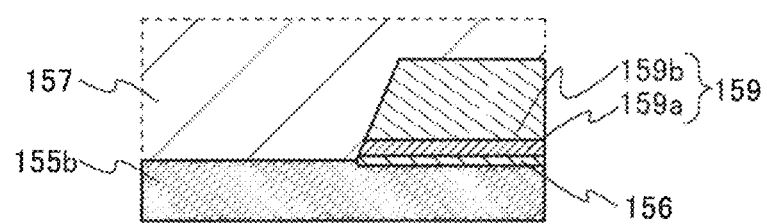

FIGS. 12A to 12C are cross-sectional views of capacitors included in a semiconductor device.

A capacitor 180a in FIG. 12A includes the oxide semiconductor film 155b having conductivity, the insulating film 157 in contact with the oxide semiconductor film 155b having conductivity, and a conductive film 181 overlapping with the oxide semiconductor film 155b with the insulating film 157 therebetween. Furthermore, a conductive film serving as a lead wiring may be in contact with the oxide semiconductor film 155b having conductivity or the conductive film 181. Here, the conductive film 159 in contact with the oxide semiconductor film 155b having conductivity is the film serving as a lead wiring. The oxide semiconductor film 155b having conductivity, the insulating film 157, and the conductive film 159 are provided over the insulating film 153 formed over the substrate 151.

Furthermore, the conductive film 159 may have a single layer structure or a stacked-layer structure of two or more layers. The conductive film 159 can be formed using a structure, a material, and a formation method similar to those of the conductive film 159 in Embodiment 1. That is, the conductive film 159 includes the Cu—X alloy film.

In the capacitor 180a in FIG. 12A, the conductive film 159 has a stacked-layer structure of a conductive film 159a in contact with the oxide semiconductor film 155b having conductivity and a conductive film 159b in contact with the conductive film 159a. As the conductive film 159a, the Cu—X alloy film is used. As the conductive film 159b, the conductive film including a low-resistance material is used.

Alternatively, as in a capacitor 180b illustrated in FIG. 12B, the oxide semiconductor film 155b having conductivity and the conductive film 159 may be formed over the insulating film 157a. In this case, the insulating film 153a can be provided between the oxide semiconductor film 155b having conductivity and the conductive film 181.

The conductive film 181 is formed to have a single-layer structure or a stacked-layer structure including any of metals such as aluminum, titanium, chromium, nickel, copper, yttrium, zirconium, molybdenum, iron, cobalt, silver, tantalum, and tungsten and an alloy containing any of these metals as its main component. For example, a single-layer structure of an aluminum film containing silicon; a single-layer structure of a copper film containing manganese; a two-layer structure in which an aluminum film is stacked over a titanium film; a two-layer structure in which an aluminum film is stacked over a tungsten film; a two-layer structure in which a copper film is stacked over a copper-magnesium-aluminum alloy film; a two-layer structure in which a copper film is stacked over a titanium film; a two-layer structure in which a copper film is stacked over a tungsten film; a two-layer structure in which a copper film is stacked over a copper film containing manganese; a three-layer structure in which a titanium film or a titanium nitride film, an aluminum film or a copper film, and a titanium film or a titanium nitride film are stacked in this order; a three-layer structure in which a molybdenum film or a molybdenum nitride film, an aluminum film or a copper film, and a molybdenum film or a molybdenum nitride film are stacked in this order; a three-layer structure in which a copper film containing manganese, a copper film, and a copper film containing manganese are stacked in this order; and the like can be given.

For the conductive film 181, a structure and a material similar to those of the conductive film 159 can be used as appropriate.

Furthermore, as the conductive film 181, a light-transmitting conductive film can be used. As the light-transmitting conductive film, an indium oxide film containing tungsten oxide, an indium zinc oxide film containing tungsten oxide, an indium oxide film containing titanium oxide, an indium tin oxide film containing titanium oxide, an indium tin oxide (hereinafter, referred to as ITO) film, an indium zinc oxide film, an indium tin oxide film to which silicon oxide is added, and the like are given.

The oxide semiconductor film 155b having conductivity includes defects and impurities. By the action of the defects and the impurities, the conductivity of the oxide semiconductor film 155b having conductivity is increased. Furthermore, the oxide semiconductor film 155b having conductivity has a light-transmitting property. A light-transmitting conductive film is used as the conductive film 181, whereby a light-transmitting capacitor can be formed.

The conductive film 159 including the Cu—X alloy film is formed over the oxide semiconductor film 155b having conductivity, whereby the adhesion between the oxide semiconductor film 155*b* having conductivity and the conductive film 159 can be increased and the contact resistance between them can be reduced.

Here, FIG. 12C shows an enlarged view of a region where the oxide semiconductor film 155*b* having conductivity is in contact with the conductive film 159. When the Cu—X alloy film is used as the conductive film 159*a* in contact with the oxide semiconductor film 155*b* having conductivity, the coating film 156 including X in the Cu—X alloy film is formed at an interface between the oxide semiconductor film 155*b* having conductivity and the conductive film 159*a* in some cases. By forming the coating film 156 serving as a blocking film against Cu, entry of Cu in the Cu—X alloy film into the oxide semiconductor film 155*b* having conductivity can be suppressed.

Furthermore, although not illustrated, a coating film such as the coating film 156*a* is formed on the periphery of the conductive films 159 in some cases, similarly to the case of the conductive film 159 in Embodiment 1.

Modification Example 1

Figure 13A:
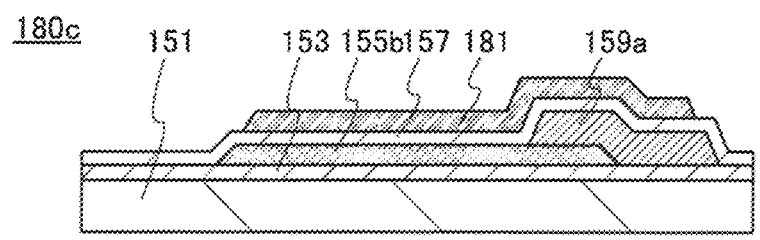
FIGS. 13A and 13B are cross-sectional views illustrating embodiments of a semiconductor device of the present invention.

As in a capacitor 180*c* illustrated in FIG. 13A, a single layer of the conductive film 159*a* formed of the Cu—X alloy film can be formed over the oxide semiconductor film 155*b* having conductivity.

Figure 13B:
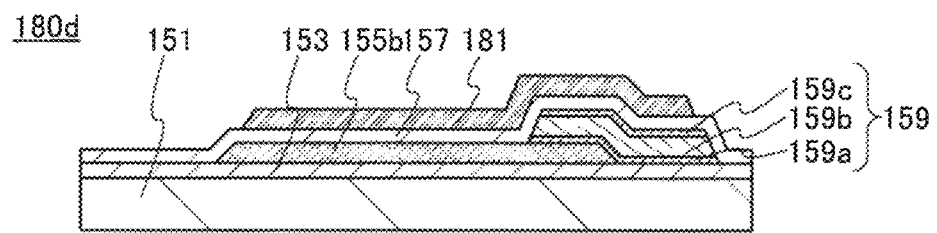

Alternatively, as in a capacitor 180*d* illustrated in FIG. 13B, the conductive film 159 can have a three-layer structure. The conductive film 159 has a stacked-layer structure of the conductive film 159*a* in contact with the oxide semiconductor film 155*b* having conductivity, the conductive film 159*b* in contact with the conductive film 159*a*, and the conductive film 159*c* in contact with the conductive film 159*b*.

When the conductive film 159*c* formed of the Cu—X alloy film is provided over the conductive film 159*b* formed of the conductive film including a low-resistance material in the conductive film 159, the conductive film 159*c* formed of the Cu—X alloy film serves as a protective film of the conductive film 159*b* including a low-resistance material; thus, the reaction of the conductive film 159*b* including a low-resistance material in the formation of the insulating film 157 can be prevented.

Furthermore, although not illustrated, a coating film such as the coating films 156*b* and 156*c* is formed on the periphery of the conductive film 159 in some cases, similarly to the case of the conductive film 159 in Embodiment 1.

Modification Example 2

Here, a modification example of a capacitor is described with reference to FIGS. 14A to 14C.

Figure 14A:
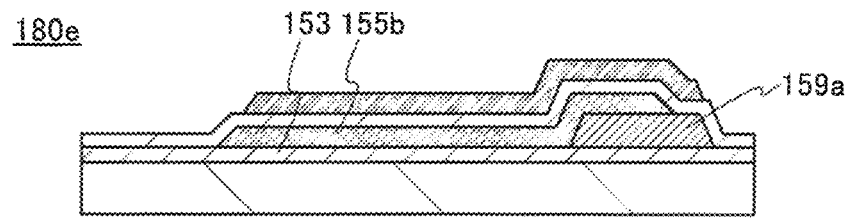
FIGS. 14A to 14C are cross-sectional views illustrating embodiments of a semiconductor device of the present invention.

A capacitor 180*e* in FIG. 14A includes the conductive film 159*a* formed of the single-layer Cu—X alloy film between the insulating film 153 and the oxide semiconductor film 155*b* having conductivity.

Figure 14B:
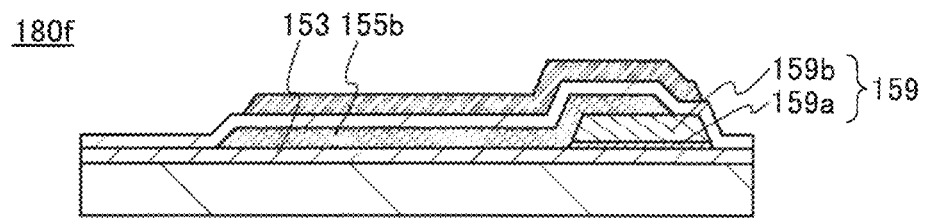

Alternatively, as illustrated in FIG. 14B, in a capacitor 180*f*, the conductive film 159 is provided between the insulating film 153 and the oxide semiconductor film 155*b* having conductivity and has a two-layer structure. The conductive film 159 is formed by stacking the conductive film 159*a* formed of the Cu—X alloy film and the conductive film 159*b* formed of the conductive film including a low-resistance material.

Figure 14C:
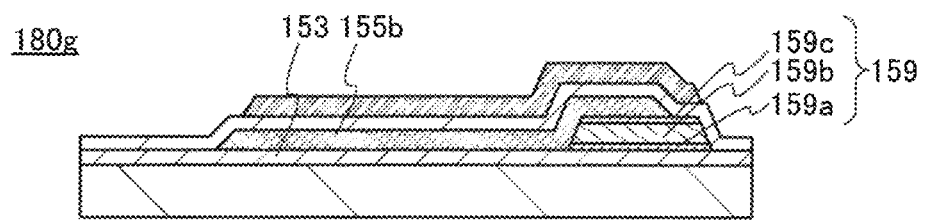

Alternatively, as illustrated in FIG. 14C, in a capacitor 180*g*, the conductive film 159 is provided between the insulating film 153 and the oxide semiconductor film 155*b* having conductivity and has a three-layer structure. The conductive film 159 is formed by stacking the conductive film 159*a* formed of the Cu—X alloy film, the conductive film 159*b* formed of the conductive film including a low-resistance material, and the conductive film 159*c* formed of the Cu—X alloy film.

When the conductive film 159*c* formed of the Cu—X alloy film is provided over the conductive film 159*b* formed of the conductive film including a low-resistance material in the conductive film 159, the conductive film 159*c* formed of the Cu—X alloy film serves as a protective film of the conductive film 159*b* including a low-resistance material; thus, the reaction of the conductive film 159*b* including a low-resistance material in the formation of the oxide semiconductor film 155*b* having conductivity and the insulating film 157 can be prevented.

Furthermore, although not illustrated, a coating film such as the coating films 156, 156*a*, 156*b* and 156*c* is formed on the periphery of the conductive film 159 in some cases, similarly to the case of the conductive film 159 in Embodiment 1.

The structures, methods, and the like described in this embodiment can be used as appropriate in combination with any of the structures, methods, and the like described in the other embodiments.

Embodiment 4

In this embodiment, a display device of one embodiment of the present invention is described with reference to drawings. A semiconductor device provided with a capacitor including the oxide semiconductor film having conductivity in Embodiment 1 is described with reference to FIGS. 15A to 15C, FIG. 16, FIG. 17, FIGS. 18A to 18D, FIGS. 19A to 19C, FIGS. 20A to 20C, FIGS. 21A and 21B, FIG. 22, FIG. 23, FIG. 24, FIG. 25, and FIGS. 26A and 26B.

Figure 15A:
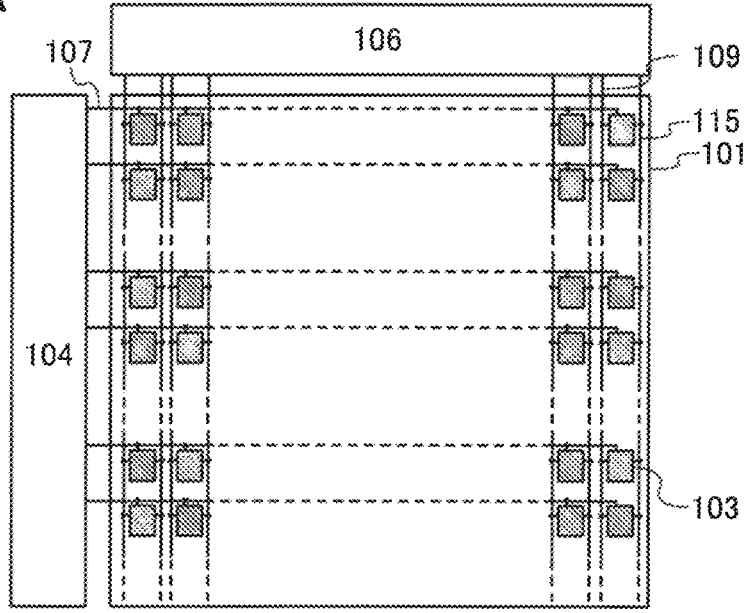
FIGS. 15A to 15C are a block diagram and circuit diagrams illustrating one embodiment of a display device.

FIG. 15A illustrates an example of a display device. A display device illustrated in FIG. 15A includes a pixel portion 101; a scan line driver circuit 104; a signal line driver circuit 106; m scan lines 107 which are arranged parallel or substantially parallel to each other and whose potentials are controlled by the scan line driver circuit 104; and n signal lines 109 which are arranged parallel or substantially parallel to each other and whose potentials are controlled by the signal line driver circuit 106. The pixel portion 101 further includes a plurality of pixels 103 arranged in a matrix. Furthermore, capacitor lines 115 arranged parallel or substantially parallel may be provided along the signal lines 109. Note that the capacitor lines 115 may be arranged parallel or substantially parallel along the scan lines 107. The scan line driver circuit 104 and the signal line driver circuit 106 are collectively referred to as a driver circuit portion in some cases.

In addition, the display device also includes a driver circuit for driving a plurality of pixels, and the like. The display device may also be referred to as a liquid crystal module including a control circuit, a power supply circuit, a signal generation circuit, a backlight module, and the like provided over another substrate.

Each scan line 107 is electrically connected to the n pixels 103 in the corresponding row among the pixels 103 arranged in m rows and n columns in the pixel portion 101. Each signal line 109 is electrically connected to the m pixels 103 in the corresponding column among the pixels 103 arranged in m rows and n columns. Note that m and n are each an integer of 1 or more. Each capacitor line 115 is electrically connected to the m pixels 103 in the corresponding columns among the pixels 103 arranged in m rows and n columns. Note that in the case where the capacitor lines 115 are arranged parallel or substantially parallel along the scan lines 107, each capacitor line 115 is electrically connected to the n pixels 103 in the corresponding rows among the pixels 103 arranged in m rows and n columns.

In the case where FFS driving is used for a liquid crystal display device, the capacitor line is not provided and a common line or a common electrode serves as a capacitor line.

Note that here, a pixel refers to a region surrounded by scan lines and signal lines and exhibiting one color. Therefore, in the case of a color display device having color elements of R (red), G (green), and B (blue), a minimum unit of an image is composed of three pixels of an R pixel, a G pixel, and a B pixel. Note that color reproducibility can be improved by adding a yellow pixel, a cyan pixel, a magenta pixel, or the like to the R pixel, the G pixel, and the B pixel. Moreover, power consumption of the display device can be reduced by adding a W (white) pixel to the R pixel, the G pixel, and the B pixel. In the case of a liquid crystal display device, brightness of the liquid crystal display device can be improved by adding a W pixel to each of the R pixel, the G pixel, and the B pixel. As a result, the power consumption of the liquid crystal display device can be reduced.

Figure 15B:
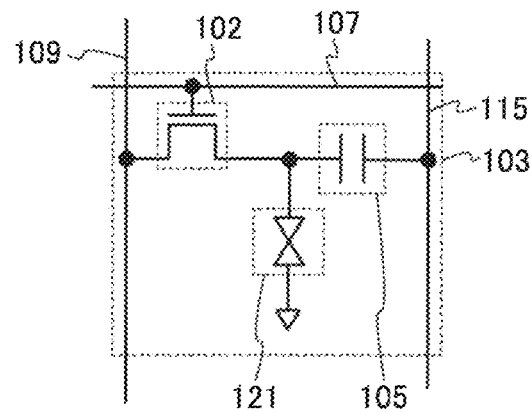
Figure 15C:
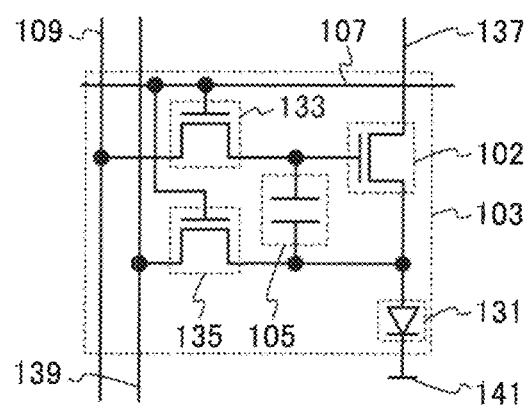

FIGS. 15B and 15C illustrate examples of a circuit configuration that can be used for the pixels 103 in the display device illustrated in FIG. 15A.

The pixel 103 in FIG. 15B includes a liquid crystal element 121, a transistor 102, and a capacitor 105.

The potential of one of a pair of electrodes of the liquid crystal element 121 is set as appropriate according to the specifications of the pixel 103. The alignment state of the liquid crystal element 121 depends on written data. A common potential may be supplied to one of the pair of electrodes of the liquid crystal element 121 included in each of a plurality of pixels 103. Furthermore, the potential supplied to the one of the pair of electrodes of the liquid crystal element 121 in the pixel 103 in one row may be different from the potential supplied to the one of the pair of electrodes of the liquid crystal element 121 in the pixel 103 in another row.

The liquid crystal element 121 is an element that controls transmission or non-transmission of light utilizing an optical modulation action of liquid crystal. Note that the optical modulation action of the liquid crystal is controlled by an electric field applied to the liquid crystal (including a horizontal electric field, a vertical electric field, and a diagonal electric field). Examples of the liquid crystal element 121 are a nematic liquid crystal, a cholesteric liquid crystal, a smectic liquid crystal, a thermotropic liquid crystal, a lyotropic liquid crystal, a ferroelectric liquid crystal, and an anti-ferroelectric liquid crystal.

As examples of a driving method of the display device including the liquid crystal element 121, any of the following modes can be given: a TN mode, a VA mode, an ASM (axially symmetric aligned micro-cell) mode, an OCB (optically compensated birefringence) mode, an MVA mode, a PVA (patterned vertical alignment) mode, an IPS mode, an FFS mode, a TBA (transverse bend alignment) mode, and the like. Note that one embodiment of the present invention is not limited to this, and various liquid crystal elements and driving methods can be used as a liquid crystal element and a driving method thereof.

The liquid crystal element may be formed using a liquid crystal composition including liquid crystal exhibiting a blue phase and a chiral material. The liquid crystal exhibiting a blue phase has a short response time of 1 msec or less and is optically isotropic; therefore, alignment treatment is not necessary and viewing angle dependence is small.

In the structure of the pixel 103 illustrated in FIG. 15B, one of a source electrode and a drain electrode of the transistor 102 is electrically connected to the signal line 109, and the other is electrically connected to the other of the pair of electrodes of the liquid crystal element 121. A gate electrode of the transistor 102 is electrically connected to the scan line 107. The transistor 102 has a function of controlling whether to write a data signal by being turned on or off.

In the pixel 103 in FIG. 15B, one of a pair of electrodes of the capacitor 105 is electrically connected to the capacitor line 115 to which a potential is supplied, and the other thereof is electrically connected to the other of the pair of electrodes of the liquid crystal element 121. The potential of the capacitor line 115 is set as appropriate in accordance with the specifications of the pixel 103. The capacitor 105 functions as a storage capacitor for storing written data.

The pixel 103 in FIG. 15C includes a transistor 133 performing switching of a display element, the transistor 102 controlling pixel driving, a transistor 135, the capacitor 105, and a light-emitting element 131.

One of a source electrode and a drain electrode of the transistor 133 is electrically connected to the signal line 109 to which a data signal is supplied. A gate electrode of the transistor 133 is electrically connected to a scan line 107 to which a gate signal is supplied.

The transistor 133 has a function of controlling whether to write a data signal by being turned on or off.

One of a source electrode and a drain electrode of the transistor 102 is electrically connected to a wiring 137 serving as an anode line, and the other is electrically connected to one electrode of the light-emitting element 131. The gate electrode of the transistor 102 is electrically connected to the other of the source electrode and the drain electrode of the transistor 133 and one electrode of the capacitor 105.

The transistor 102 has a function of controlling current flowing through the light-emitting element 131 by being turned on or off.

One of a source electrode and a drain electrode of the transistor 135 is connected to a wiring 139 to which a reference potential of data is supplied, and the other thereof is electrically connected to the one electrode of the light-emitting element 131 and the other electrode of the capacitor 105. Moreover, a gate electrode of the transistor 135 is electrically connected to the scan line 107 to which the gate signal is supplied.

The transistor 135 has a function of adjusting the current flowing through the light-emitting element 131. For example, when the internal resistance of the light-emitting element 131 increases because of deterioration or the like of the light-emitting element 131, the current flowing through the light-emitting element 131 can be corrected by monitoring current flowing through the wiring 139 to which the one of the source electrode and the drain electrode of the transistor 135 is connected. The potential supplied to the wiring 139 can be set to 0 V, for example.

The one electrode of the capacitor 105 is electrically connected to the gate electrode of the transistor 102 and the other of the source electrode and the drain electrode of the transistor 133, and the other electrode of the capacitor 105 is electrically connected to the other of the source electrode and the drain electrode of the transistor 135 and the one electrode of the light-emitting element 131.

In the pixel 103 in FIG. 15C, the capacitor 105 functions as a storage capacitor for storing written data.

The one electrode of the light-emitting element 131 is electrically connected to the other of the source electrode and the drain electrode of the transistor 135, the other electrode of the capacitor 105, and the other of the source electrode and the drain electrode of the transistor 102. Furthermore, the other electrode of the light-emitting element 131 is electrically connected to a wiring 141 serving as a cathode.

As the light-emitting element 131, an organic electroluminescent element (also referred to as an organic EL element) or the like can be used, for example. Note that the light-emitting element 131 is not limited to an organic EL element; an inorganic EL element including an inorganic material may be used.

A high power supply potential VDD is supplied to one of the wiring 137 and the wiring 141, and a low power supply potential VSS is supplied to the other. In the structure of FIG. 15C, the high power supply potential VDD is supplied to the wiring 137, and the low power supply potential VSS is supplied to the wiring 141.

Note that although FIGS. 15B and 15C each illustrate an example where the liquid crystal element 121 and the light-emitting element 131 are used as a display element, one embodiment of the present invention is not limited thereto. Any of a variety of display elements can be used. Examples of a display element include a display medium whose contrast, luminance, reflectance, transmittance, or the like is changed by electromagnetic action, such as an LED (e.g., a white LED, a red LED, a green LED, or a blue LED), a transistor (a transistor that emits light depending on current), an electron emitter, electronic ink, an electrophoretic element, a grating light valve (GLV), a plasma display panel (PDP), a display element using micro electro mechanical system (MEMS), a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, or a carbon nanotube. Note that examples of display devices including EL elements include an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display) and the like. An example of a display device including electronic ink or electrophoretic elements is electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

Figure 16:
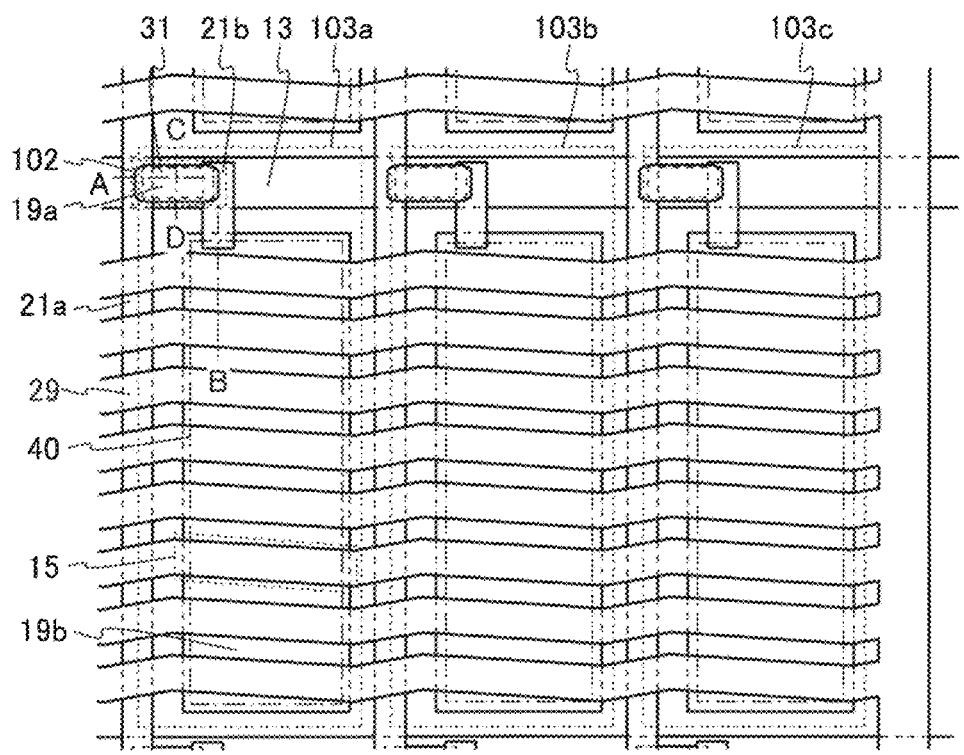
FIG. 16 is a top view illustrating one embodiment of a display device.

Next, a specific structure of an element substrate included in the display device is described. Here, a specific example of a liquid crystal display device including a liquid crystal element in the pixel 103 is described. FIG. 16 is a top view of the pixel 103 shown in FIG. 15B.

Here, a liquid crystal display device driven in an FFS mode is used as the display device, and FIG. 16 is a top view of a plurality of pixels 103a, 103b, and 103c included in the liquid crystal display device.

In FIG. 16, a conductive film 13 functioning as a scan line extends in a direction substantially perpendicularly to a conductive film functioning as a signal line (in the lateral direction in the drawing). The conductive film 21a functioning as a signal line extends in a direction substantially perpendicularly to the conductive film functioning as a scan line (in the vertical direction in the drawing). Note that the conductive film 13 functioning as a scan line is electrically connected to the scan line driver circuit 104 (see FIG. 15A), and the conductive film 21a functioning as a signal line is electrically connected to the signal line driver circuit 106 (see FIG. 15A).

The transistor 102 is provided in a region where the conductive film functioning as a scan line and the conductive film functioning as a signal line intersect with each other. The transistor 102 includes the conductive film 13 functioning as a gate electrode; a gate insulating film (not illustrated in FIG. 16); the oxide semiconductor film 19a where a channel region is formed, over the gate insulating film; and the conductive film 21a and a conductive film 21b functioning as a source electrode and a drain electrode. The conductive film 13 also functions as a conductive film functioning as a scan line, and a region of the conductive film 13 that overlaps with the oxide semiconductor film 19a serves as the gate electrode of the transistor 102. In addition, the conductive film 21a also functions as a conductive film functioning as a signal line, and a region of the conductive film 21a that overlaps with the oxide semiconductor film 19a functions as the source electrode or the drain electrode of the transistor 102. Furthermore, in the top view of FIG. 16, an end portion of the conductive film functioning as a scan line is positioned on an outer side of an end portion of the oxide semiconductor film 19a. Thus, the conductive film functioning as a scan line functions as a light-blocking film for blocking light from a light source such as a backlight. For this reason, the oxide semiconductor film 19a included in the transistor is not irradiated with light, so that a variation in the electrical characteristics of the transistor can be suppressed.

In addition, the transistor 102 includes the organic insulating film 31 overlapping with the oxide semiconductor film 19a. The organic insulating film 31 overlaps with the oxide semiconductor film 19a (in particular, a region of the oxide semiconductor film 19a which is between the conductive films 21a and 21b) with an inorganic insulating film (not illustrated in FIG. 16) provided therebetween.

Water from the outside does not diffuse to the liquid crystal display device through the organic insulating film 31 because the organic insulating film 31 is isolated in each transistor 102; therefore, the variation in electrical characteristics of the transistors provided in the liquid crystal display device can be reduced.

The conductive film 21b is electrically connected to an oxide semiconductor film 19b having conductivity. A common electrode 29 is provided over the oxide semiconductor film 19b having conductivity with an insulating film provided therebetween. An opening 40 indicated by a dashed-dotted line is provided in the insulating film provided over the oxide semiconductor film 19b having conductivity. The oxide semiconductor film 19b having conductivity is in contact with a nitride insulating film (not illustrated in FIG. 16) in the opening 40.

The common electrode 29 includes stripe regions extending in a direction intersecting with the conductive film 21a functioning as a signal line. The stripe regions are connected to a region extending in a direction parallel or substantially parallel to the conductive film 21a functioning as a signal line. Accordingly, the stripe regions of the common electrode 29 are at the same potential in pixels.

The capacitor 105 is formed in a region where the oxide semiconductor film 19b having conductivity and the common electrode 29 overlap with each other. The oxide semiconductor film 19b having conductivity and the common electrode 29 each have a light-transmitting property. That is, the capacitor 105 has a light-transmitting property.

As illustrated in FIG. 16, an FFS mode liquid crystal display device is provided with the common electrode including the stripe regions extending in a direction intersecting with the conductive film functioning as a signal line. Thus, the display device can have excellent contrast.

Owing to the light-transmitting property of the capacitor 105, the capacitor 105 can be formed large (in a large area) in the pixel 103. Thus, a display device with a large-capacitance capacitor as well as an aperture ratio increased to typically 50% or more, preferably 60% or more can be provided. For example, in a high-resolution display device such as a liquid crystal display device, the area of a pixel is small and accordingly the area of a capacitor is also small. For this reason, the amount of charges accumulated in the capacitor is small in the high-resolution display device. However, since the capacitor 105 of this embodiment has a light-transmitting property, when the capacitor 105 is provided in a pixel, a sufficient capacitance value can be obtained in the pixel and the aperture ratio can be improved. Typically, the capacitor 105 can be favorably used for a high-resolution display device with a pixel density of 200 pixels per inch (ppi) or more, 300 ppi or more, or furthermore, 500 ppi or more.

In a liquid crystal display device, as the capacitance value of a capacitor is increased, a period during which the alignment of liquid crystal molecules of a liquid crystal element can be kept constant in the state where an electric field is applied can be made longer. When the period can be made longer in a display device which displays a still image, the number of times of rewriting image data can be reduced, leading to a reduction in power consumption. Furthermore, according to the structure of this embodiment, the aperture ratio can be improved even in a high-resolution display device, which makes it possible to use light from a light source such as a backlight efficiently, so that power consumption of the display device can be reduced.

Figure 17:
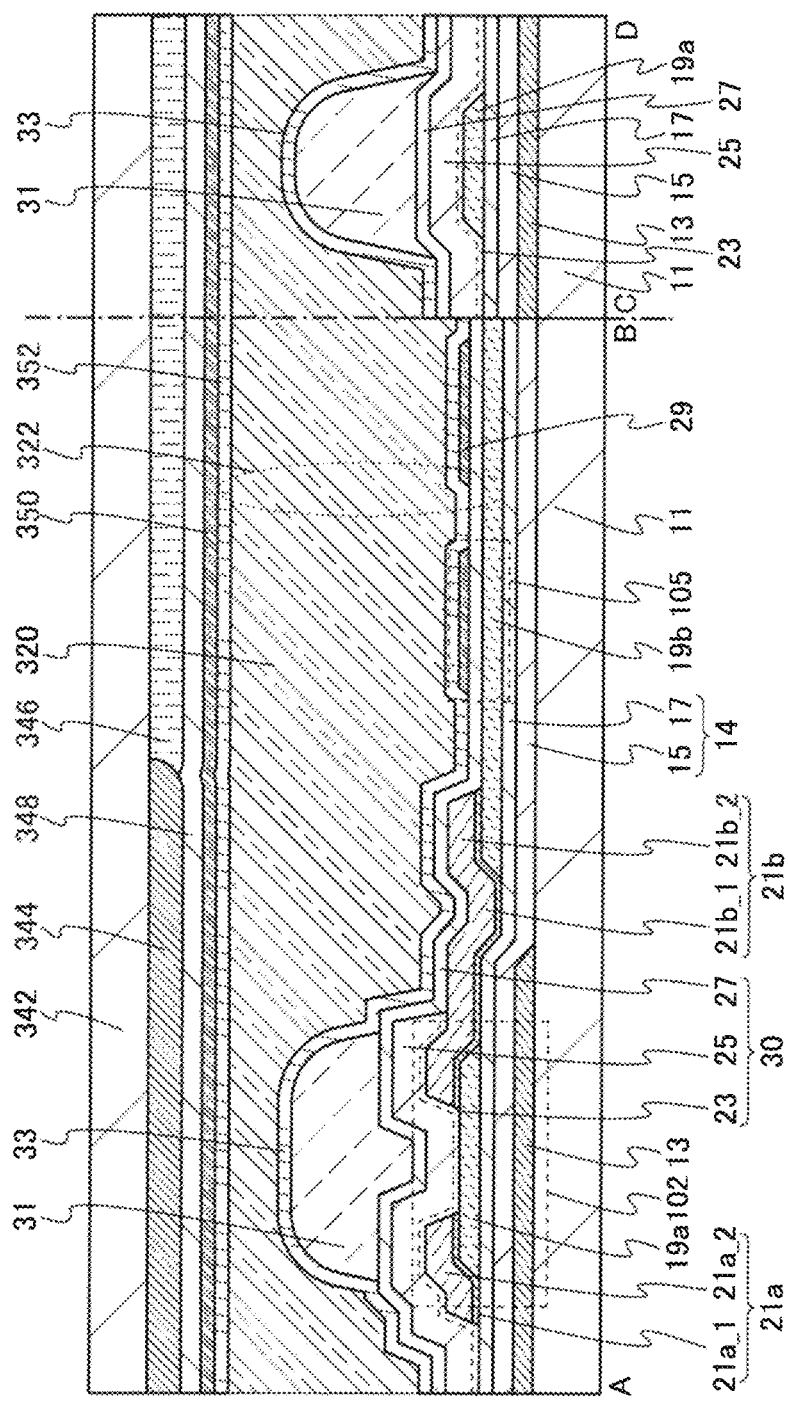
FIG. 17 is a cross-sectional view illustrating one embodiment of a display device.

Next, FIG. 17 is a cross-sectional view taken along dashed-dotted lines A-B and C-D in FIG. 16. The transistor 102 illustrated in FIG. 17 is a channel-etched transistor. Note that the transistor 102 in the channel length direction and the capacitor 105 are illustrated in the cross-sectional view taken along dashed-dotted line A-B, and the transistor 102 in the channel width direction is illustrated in the cross-sectional view taken along dashed-dotted line C-D.

The liquid crystal display device described in this embodiment includes a pair of substrates (a first substrate 11 and a second substrate 342), an element layer in contact with the first substrate 11, an element layer in contact with the second substrate 342, and a liquid crystal layer 320 provided between the element layers. Note that the element layer is a generic term used to refer to layers interposed between the substrate and the liquid crystal layer. Furthermore, the substrate and the element layer are collectively referred to as an element substrate in some cases. A liquid crystal element 322 is provided between a pair of substrates (the first substrate 11 and the second substrate 342).

The liquid crystal element 322 includes the oxide semiconductor film 19b having conductivity over the first substrate 11, the common electrode 29, a nitride insulating film 27, a film controlling alignment (hereinafter referred to as an alignment film 33), and the liquid crystal layer 320. The oxide semiconductor film 19b having conductivity functions as one electrode (also referred to as a pixel electrode) of the liquid crystal element 322, and the common electrode 29 functions as the other electrode of the liquid crystal element 322.

First, the element layer formed over the first substrate 11 is described. The transistor 102 in FIG. 17 has a single-gate structure and includes the conductive film 13 functioning as a gate electrode over the first substrate 11. In addition, the transistor 102 includes a nitride insulating film 15 formed over the first substrate 11 and the conductive film 13 functioning as a gate electrode, an oxide insulating film 17 formed over the nitride insulating film 15, the oxide semiconductor film 19a overlapping with the conductive film 13 functioning as a gate electrode with the nitride insulating film 15 and the oxide insulating film 17 provided therebetween, and the conductive films 21a and 21b functioning as a source electrode and a drain electrode which are in contact with the oxide semiconductor film 19a. The nitride insulating film 15 and the oxide insulating film 17 function as the gate insulating film 14. Moreover, an oxide insulating film 23 is formed over the oxide insulating film 17, the oxide semiconductor film 19a, and the conductive films 21a and 21b functioning as a source electrode and a drain electrode, and an oxide insulating film 25 is formed over the oxide insulating film 23. The nitride insulating film 27 is formed over the oxide insulating film 23, the oxide insulating film 25, and the conductive film 21b. The oxide insulating film 23, the oxide insulating film 25, and the nitride insulating film 27 function as the inorganic insulating film 30. The oxide semiconductor film 19b having conductivity is formed over the oxide insulating film 17. The oxide semiconductor film 19b having conductivity is connected to one of the conductive films 21a and 21b functioning as a source electrode and a drain electrode, here, connected to the conductive film 21b. The common electrode 29 is formed over the nitride insulating film 27. In addition, the organic insulating film 31 overlapping with the oxide semiconductor film 19a of the transistor 102 with the inorganic insulating film 30 provided therebetween is included.

A structure of the display device is described below in detail.

As the first substrate 11, the substrate 151 described in Embodiment 1 can be used as appropriate.

The conductive film 13 functioning as a gate electrode can be formed using a metal element selected from aluminum, chromium, copper, tantalum, titanium, molybdenum, and tungsten; an alloy containing any of these metal elements as a component; an alloy containing any of these metal elements in combination; or the like. Furthermore, one or more metal elements selected from manganese and zirconium may be used. The conductive film 13 functioning as a gate electrode may have a single-layer structure or a stacked-layer structure of two or more layers. For example, a single-layer structure of an aluminum film containing silicon, a two-layer structure in which an aluminum film is stacked over a titanium film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a two-layer structure in which a copper film is stacked over a titanium film, a two-layer structure in which a copper film is stacked over a molybdenum film, and a three-layer structure in which a titanium film, an aluminum film, and a titanium film are stacked in this order can be given. Alternatively, an alloy film or a nitride film which contains aluminum and one or more elements selected from titanium, tantalum, tungsten, molybdenum, chromium, neodymium, and scandium may be used.

For the conductive film 13 serving as a gate electrode, the structure and the material used for the conductive film 159 in Embodiment 1 can be used as appropriate. Alternatively, the light-transmitting conductive film described in the description of the conductive film 181 in Embodiment 3 can be used. Alternatively, the conductive film 13 serving as a gate electrode can have a stacked-layer structure of the light-transmitting conductive film and the metal element. Alternatively, the conductive film 13 serving as a gate electrode may be formed using the oxide semiconductor film 155b having conductivity in Embodiment 1.

The nitride insulating film 15 can be a nitride insulating film that is hardly permeated by oxygen. Furthermore, a nitride insulating film which is hardly permeated by oxygen, hydrogen, and water can be used. As the nitride insulating film that is hardly permeated by oxygen and the nitride insulating film that is hardly permeated by oxygen, hydrogen, and water, a silicon nitride film, a silicon nitride oxide film, an aluminum nitride film, an aluminum nitride oxide film, or the like is given. Instead of the nitride insulating film that is hardly permeated by oxygen and the nitride insulating film that is hardly permeated by oxygen, hydrogen, and water, an oxide insulating film such as an aluminum oxide film, an aluminum oxynitride film, a gallium oxide film, a gallium oxynitride film, an yttrium oxide film, an yttrium oxynitride film, a hafnium oxide film, or a hafnium oxynitride film can be used.

The thickness of the nitride insulating film 15 is preferably greater than or equal to 5 nm and less than or equal to 100 nm, further preferably greater than or equal to 20 nm and less than or equal to 80 nm.

The oxide insulating film 17 may be formed to have a single-layer structure or a stacked-layer structure using, for example, one or more of a silicon oxide film, a silicon oxynitride film, a silicon nitride oxide film, a silicon nitride film, an aluminum oxide film, a hafnium oxide film, a gallium oxide film, and a Ga—Zn-based metal oxide film.

The oxide insulating film 17 may also be formed using a material having a high relative dielectric constant such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide, so that gate leakage current of the transistor can be reduced.

The thickness of the oxide insulating film 17 is preferably greater than or equal to 5 nm and less than or equal to 400 nm, further preferably greater than or equal to 10 nm and less than or equal to 300 nm, still further preferably greater than or equal to 50 nm and less than or equal to 250 nm.

The oxide semiconductor film 19a and the oxide semiconductor film 19b having conductivity are formed at the same time and are formed using a metal oxide film such as an In—Ga oxide film, an In—Zn oxide film, or an In-M-Zn oxide film (M represents Al, Ga, Y, Zr, Sn, La, Ce, or Nd). Thus, the oxide semiconductor film 19a and the oxide semiconductor film 19b having conductivity include the same metal element.

However, the number of the defects of the oxide semiconductor film 19b having conductivity is large and the impurity concentration thereof is high as compared with the oxide semiconductor film 19a. Thus, the oxide semiconductor film 19b having conductivity has different electrical characteristics from the oxide semiconductor film 19a. Specifically, the oxide semiconductor film 19a has semiconductor characteristics and the oxide semiconductor film 19b having conductivity has conductivity.

The thicknesses of the oxide semiconductor film 19a and the oxide semiconductor film 19b having conductivity are greater than or equal to 3 nm and less than or equal to 200 nm, preferably greater than or equal to 3 nm and less than or equal to 100 nm, further preferably greater than or equal to 3 nm and less than or equal to 50 nm.

Part of the oxide semiconductor film 19a serves as the channel region of the transistor; thus, the energy gap of the oxide semiconductor film 19a is 2 eV or more, preferably 2.5 eV or more, further preferably 3 eV or more. The off-state current of the transistor 102 can be reduced by using an oxide semiconductor having such a wide energy gap.

An oxide semiconductor film with low carrier density is used as the oxide semiconductor film 19a. For example, an oxide semiconductor film whose carrier density is $1\times10^{17}$/cm$^3$ or lower, preferably $1\times10^{15}$/cm$^3$ or lower, preferably $1\times10^{13}$/cm$^3$ or lower, preferably $8\times10^{11}$/cm$^3$ or lower, preferably $1\times10^{11}$/cm$^3$ or lower, further preferably lower than $1\times10^{10}$/cm$^3$, and is $1\times10^{-9}$/cm$^3$ or higher is used as the oxide semiconductor film 19a.

Note that, without limitation to the compositions described above, a material with an appropriate composition may be used depending on required semiconductor characteristics and electrical characteristics (e.g., field-effect mobility and threshold voltage) of a transistor. Furthermore, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor film 19a be set to be appropriate.

Note that by using an oxide semiconductor film in which the impurity concentration is low and density of defect states is low as the oxide semiconductor film 19a, in which case a transistor which has more excellent electrical characteristics can be manufactured. Here, the state in which impurity concentration is low and density of defect states is low (the amount of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has few carrier traps in some cases. Furthermore, the highly purified intrinsic or substantially highly purified intrinsic oxide semiconductor film has an extremely low off-state current; even when an element has a channel width of $1\times10^6$ μm and a channel length (L) of 10 μm, the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V. Thus, the transistor in which a channel region is formed in the oxide semiconductor film has a small variation in electrical characteristics and high reliability in some cases.

As examples of the impurities, hydrogen, nitrogen, alkali metal, and alkaline earth metal are given.

Hydrogen contained in the oxide semiconductor film reacts with oxygen bonded to a metal atom to be water, and in addition, an oxygen vacancy is formed in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor which contains hydrogen is likely to be normally on.

Accordingly, it is preferable that hydrogen be reduced as much as possible as well as the oxygen vacancies in the oxide semiconductor film 19a. Specifically, in the oxide semiconductor film 19a, the hydrogen concentration which is measured by secondary ion mass spectrometry (SIMS) is set to be lower than or equal to $5\times10^{19}$ atoms/cm$^3$, preferably lower than or equal to $1\times10^{19}$ atoms/cm$^3$, further preferably lower than or equal to $5\times10^{18}$ atoms/cm$^3$, still further preferably lower than or equal to $1\times10^{18}$ atoms/cm$^3$, yet still further preferably lower than or equal to $5\times10^{17}$ atoms/cm$^3$, yet still furthermore preferably lower than or equal to $1\times10^{16}$ atoms/cm$^3$.

When silicon or carbon which is one of elements belonging to Group 14 is contained in the oxide semiconductor film 19a, oxygen vacancies are increased, and the oxide semiconductor film 19a becomes an n-type film. Thus, the concentration of silicon or carbon (the concentration is measured by SIMS) of the oxide semiconductor film 19a is set to be lower than or equal to $2\times10^{18}$ atoms/cm$^3$, preferably lower than or equal to $2\times10^{17}$ atoms/cm$^3$.

The concentration of alkali metal or alkaline earth metal in the oxide semiconductor film 19a, which is measured by SIMS, is set to be lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal in the oxide semiconductor film 19a.

Furthermore, when containing nitrogen, the oxide semiconductor film 19a easily has n-type conductivity by generation of electrons serving as carriers and an increase of carrier density. Thus, a transistor including an oxide semiconductor which contains nitrogen is likely to be normally on. For this reason, nitrogen in the oxide semiconductor film is preferably reduced as much as possible; the nitrogen concentration which is measured by SIMS is preferably set to be, for example, lower than or equal to $5\times10^{18}$ atoms/cm$^3$.

The oxide semiconductor film 19b having conductivity is formed by including defects, e.g., oxygen vacancies, and impurities in an oxide semiconductor film formed at the same time as the oxide semiconductor film 19a. Thus, the oxide semiconductor film 19b having conductivity serves as an electrode, e.g., a pixel electrode in this embodiment.

The oxide semiconductor film 19a and the oxide semiconductor film 19b having conductivity are both formed over the oxide insulating film 17, but differ in impurity concentration. Specifically, the oxide semiconductor film 19b having conductivity has a higher impurity concentration than the oxide semiconductor film 19a. For example, the hydrogen concentration in the oxide semiconductor film 19a is lower than or equal to $5\times10^{19}$ atoms/cm$^3$, preferably lower than or equal to $1\times10^{19}$ atoms/cm$^3$, further preferably lower than or equal to $5\times10^{18}$ atoms/cm$^3$, still further preferably lower than or equal to $1\times10^{18}$ atoms/cm$^3$, yet further preferably lower than or equal to $5\times10^{17}$ atoms/cm$^3$, yet furthermore preferably lower than or equal to $1\times10^{16}$ atoms/cm$^3$. On the other hand, the hydrogen concentration in the oxide semiconductor film 19b having conductivity is higher than or equal to $8\times10^{19}$ atoms/cm$^3$, preferably higher than or equal to $1\times10^{20}$ atoms/cm$^3$, further preferably higher than or equal to $5\times10^{20}$ atoms/cm$^3$. The hydrogen concentration in the oxide semiconductor film 19b having conductivity is greater than or equal to 2 times, preferably greater than or equal to 10 times that in the oxide semiconductor film 19a.

The oxide semiconductor film 19b having conductivity has lower resistivity than the oxide semiconductor film 19a. The resistivity of the oxide semiconductor film 19b having conductivity is preferably higher than or equal to $1\times10^{-8}$ times and lower than $1\times10^{-1}$ times the resistivity of the oxide semiconductor film 19a. The resistivity of the oxide semiconductor film 19b having conductivity is typically higher than or equal to $1\times10^{-3}$ Ωcm and lower than $1\times10^4$ Ωcm, preferably higher than or equal to $1\times10^{-3}$ Ωcm and lower than $1\times10^{-1}$ Ωcm.

The oxide semiconductor film 19a and the oxide semiconductor film 19b having conductivity can each have a crystal structure similar to that of the oxide semiconductor film 155b having conductivity in Embodiment 1, as appropriate.

For each of the conductive films 21a and 21b serving as a source electrode and a drain electrode, the structure and the material used for the conductive film 159 in Embodiment 1 can be used as appropriate.

In this embodiment, the conductive film 21a has a stacked-layer structure of a conductive film 21a_1 and a conductive film 21a_2. The conductive film 21b has a stacked-layer structure of a conductive film 21b_1 and a conductive film 21b_2. As the conductive films 21a_1 and 21b_1, a Cu—X alloy film is used. As the conductive films 21a_2 and 21b_2, a conductive film including a low-resistance material is used.

As the oxide insulating film 23 or the oxide insulating film 25, an oxide insulating film which contains more oxygen than that in the stoichiometric composition is preferably used. Here, as the oxide insulating film 23, an oxide insulating film which permeates oxygen is formed, and as the oxide insulating film 25, an oxide insulating film which contains more oxygen than that in the stoichiometric composition is formed.

The oxide insulating film 23 is an oxide insulating film through which oxygen is permeated. Thus, oxygen released from the oxide insulating film 25 provided over the oxide insulating film 23 can be moved to the oxide semiconductor film 19a through the oxide insulating film 23. Moreover, the oxide insulating film 23 also serves as a film which relieves damage to the oxide semiconductor film 19a at the time of forming the oxide insulating film 25 later.

A silicon oxide film, a silicon oxynitride film, or the like with a thickness greater than or equal to 5 nm and less than or equal to 150 nm, preferably greater than or equal to 5 nm and less than or equal to 50 nm can be used as the oxide insulating film 23.

Furthermore, the oxide insulating film 23 is preferably an oxide insulating film containing nitrogen and having a small number of defects.

Typical examples of the oxide insulating film containing nitrogen and having a small number of defects include a silicon oxynitride film and an aluminum oxynitride film.

In an ESR spectrum at 100 K or lower of the oxide insulating film with a small number of defects, a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1\times10^{18}$ spins/cm$^3$, typically higher than or equal to $1\times10^{17}$ spins/cm$^3$ and lower than $1\times10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide (NO$_x$; x is greater than or equal to 0 and less than or equal to 2, preferably greater than or equal to 1 and less than or equal to 2). Typical examples of nitrogen oxide include nitrogen monoxide and nitrogen dioxide. In other words, the lower the total spin density of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the lower the content of nitrogen oxide in the oxide insulating film is.

When the oxide insulating film 23 contains a small amount of nitrogen oxide as described above, the carrier trap at the interface between the oxide insulating film 23 and the oxide semiconductor film can be reduced. Thus, the amount of change in the threshold voltage of the transistor included in the semiconductor device can be reduced, which leads to a reduced change in the electrical characteristics of the transistor.

The oxide insulating film 23 preferably has a nitrogen concentration measured by secondary ion mass spectrometry (SIMS) of lower than or equal to $6\times10^{20}$ atoms/cm$^3$. In that case, nitrogen oxide is unlikely to be generated in the oxide insulating film 23, so that the carrier trap at the interface between the oxide insulating film 23 and the oxide semiconductor film 19a can be reduced. Furthermore, the amount of change in the threshold voltage of the transistor included in the semiconductor device can be reduced, which leads to a reduced change in the electrical characteristics of the transistor.

Note that when nitride oxide and ammonia are contained in the oxide insulating film 23, the nitride oxide and ammonia react with each other in heat treatment in the manufacturing process; accordingly, the nitride oxide is released as a nitrogen gas. Thus, the nitrogen concentration of the oxide insulating film 23 and the amount of nitrogen oxide therein can be reduced. Moreover, the carrier trap at the interface between the oxide insulating film 23 and the oxide semiconductor film 19a can be reduced. Furthermore, the amount of change in threshold voltage of the transistor included in the semiconductor device can be reduced, which leads to a reduced change in the electrical characteristics of the transistor.

Note that in the oxide insulating film 23, all oxygen entering the oxide insulating film 23 from the outside does not move to the outside of the oxide insulating film 23 and some oxygen remains in the oxide insulating film 23. Furthermore, movement of oxygen occurs in the oxide insulating film 23 in some cases in such a manner that oxygen enters the oxide insulating film 23 and oxygen contained in the oxide insulating film 23 is moved to the outside of the oxide insulating film 23.

When the oxide insulating film through which oxygen passes is formed as the oxide insulating film 23, oxygen released from the oxide insulating film 25 provided over the oxide insulating film 23 can be moved to the oxide semiconductor film 19a through the oxide insulating film 23.

The oxide insulating film 25 is formed in contact with the oxide insulating film 23. The oxide insulating film 25 is formed using an oxide insulating film which contains oxygen at a higher proportion than the stoichiometric composition. Part of oxygen is released by heating from the oxide insulating film which contains oxygen at a higher proportion than the stoichiometric composition. The oxide insulating film which contains oxygen at a higher proportion than the stoichiometric composition is an oxide insulating film of which the amount of released oxygen converted into oxygen atoms is greater than or equal to $1.0\times10^{18}$ atoms/cm$^3$, preferably greater than or equal to $3.0\times10^{20}$ atoms/cm$^3$ in TDS analysis. Note that the surface temperature of the oxide insulating film 25 in the TDS analysis is preferably higher than or equal to 100° C. and lower than or equal to 700° C., or higher than or equal to 100° C. and lower than or equal to 500° C.

A silicon oxide film, a silicon oxynitride film, or the like with a thickness greater than or equal to 30 nm and less than or equal to 500 nm, preferably greater than or equal to 50 nm and less than or equal to 400 nm can be used as the oxide insulating film 25.

It is preferable that the amount of defects in the oxide insulating film 25 be small and typically, the spin density of a signal that appears at g=2.001 be lower than $1.5\times10^{18}$ spins/cm$^3$, further preferably lower than or equal to $1\times10^{18}$ spins/cm$^3$ by ESR measurement. Note that the oxide insulating film 25 is provided more apart from the oxide semiconductor film 19a than the oxide insulating film 23 is; thus, the oxide insulating film 25 may have higher defect density than the oxide insulating film 23.

Like the nitride insulating film 15, the nitride insulating film 27 can be a nitride insulating film which is hardly permeated by oxygen. Furthermore, a nitride insulating film which is hardly permeated by oxygen, hydrogen, and water can be used.

The nitride insulating film 27 is formed using a silicon nitride film, a silicon nitride oxide film, an aluminum nitride film, an aluminum nitride oxide film, or the like with a thickness greater than or equal to 50 nm and less than or equal to 300 nm, preferably greater than or equal to 100 nm and less than or equal to 200 nm.

In the case where the oxide insulating film which contains oxygen at a higher proportion than the stoichiometric composition is included in the oxide insulating film 23 or the oxide insulating film 25, part of oxygen contained in the oxide insulating film 23 or the oxide insulating film 25 can be moved to the oxide semiconductor film 19a, so that the amount of oxygen vacancies contained in the oxide semiconductor film 19a can be reduced.

The threshold voltage of a transistor using an oxide semiconductor film with oxygen vacancies shifts negatively with ease, and such a transistor tends to be normally on. This is because charges are generated owing to oxygen vacancies in the oxide semiconductor film and the resistance is thus reduced. The transistor having normally-on characteristic causes various problems in that malfunction is likely to be caused when in operation and that power consumption is increased when not in operation, for example. Furthermore, there is a problem in that the amount of change in electrical characteristics, typically in threshold voltage, of the transistor is increased by change over time or due to a stress test.

However, in the transistor 102 in this embodiment, the oxide insulating film 23 or the oxide insulating film 25 provided over the oxide semiconductor film 19a contains oxygen at a higher proportion than the stoichiometric composition. Furthermore, the oxide semiconductor film 19a, the oxide insulating film 23, and the oxide insulating film 25 are surrounded by the nitride insulating film 15 and the oxide insulating film 17. As a result, oxygen contained in the oxide insulating film 23 or the oxide insulating film 25 is moved to the oxide semiconductor film 19a efficiently, so that the amount of oxygen vacancies in the oxide semiconductor film 19a can be reduced. Accordingly, a transistor having normally-off characteristic is obtained. Furthermore, the amount of change in electrical characteristics, typically in threshold voltage, of the transistor over time or due to a stress test can be reduced.

The common electrode 29 is formed using a light-transmitting film, preferably a light-transmitting conductive film. As the light-transmitting conductive film, an indium oxide film containing tungsten oxide, an indium zinc oxide film containing tungsten oxide, an indium oxide film containing titanium oxide, an indium tin oxide film containing titanium oxide, an ITO film, an indium zinc oxide film, an indium tin oxide film to which silicon oxide is added, and the like are given.

The common electrode 29 may be formed using the oxide semiconductor film 155b having conductivity in Embodiment 1.

The extending direction of the conductive film 21a functioning as a signal line and the extending direction of the common electrode 29 intersect with each other. Therefore, differences in directions between the electric field between the conductive film 21a functioning as a signal line and the common electrode 29 and the electric field between the pixel electrode formed using the oxide semiconductor film 19b having conductivity and the common electrode 29 arise and the differences form a large angle. Accordingly, in the case where negative liquid crystal molecules are used, the alignment state of the liquid crystal molecules in the vicinity of the conductive film functioning as a signal line and the alignment state of the liquid crystal molecules in the vicinity of the pixel electrode which is generated by an electric field between the pixel electrodes provided in adjacent pixels and the common electrode are less likely to be affected by each other. Thus, a change in the transmittance of the pixels is suppressed. Accordingly, flickers in an image can be reduced.

In the liquid crystal display device having a low refresh rate, alignment of liquid crystal molecules in the vicinity of the conductive film 21a functioning as a signal line is less likely to affect alignment state of liquid crystal molecules in the vicinity of the pixel electrode due to the electric field between the pixel electrodes in the adjacent pixels and the common electrode 29 even during the retention period. Thus, the transmittance of the pixels in the retention period can be held and flickers can be reduced.

The common electrode 29 includes the stripe regions extending in a direction intersecting with the conductive film 21a functioning as a signal line. Accordingly, in the vicinity of the oxide semiconductor film 19b having conductivity and the conductive film 21a, unintended alignment of liquid crystal molecules can be prevented and thus light leakage can be suppressed. As a result, a display device with excellent contrast can be manufactured.

Note that the shape of the common electrode 29 is not limited to that illustrated in FIG. 16, and may be stripe. In the case of a stripe shape, the extending direction may be parallel to the conductive film functioning as a signal line. The common electrode 29 may have a comb shape. Alternatively, the common electrode may be formed over the entire surface of the first substrate 11. Further alternatively, a light-transmitting conductive film different from the oxide semiconductor film 19b having conductivity may be formed over the common electrode 29 with an insulating film provided therebetween.

The thickness of the organic insulating film 31 is preferably greater than or equal to 500 nm and less than or equal to 10 μm. The thickness of the organic insulating film 31 in FIG. 17 is smaller than a gap between the inorganic insulating film 30 formed over the first substrate 11 and the element layer formed on the second substrate 342. Therefore, the liquid crystal layer 320 is provided between the organic insulating film 31 and the element layer formed on the second substrate 342. In other words, the liquid crystal layer 320 is provided between the alignment film 33 over the organic insulating film 31 and an alignment film 352 included in the element layer on the second substrate 342.

Note that although not illustrated, the alignment film 33 over the organic insulating film 31 and the alignment film 352 included in the element layer on the second substrate 342 may be in contact with each other. In this case, the organic insulating film 31 functions as a spacer; therefore, the cell gap of the liquid crystal display device can be maintained with the organic insulating film 31.

Although the alignment film 33 is provided over the organic insulating film in FIG. 17, one embodiment of the present invention is not limited thereto. Depending on circumstances or conditions, the organic insulating film 31 may be provided over the alignment film 33. In this case, a rubbing step may be performed after the formation of the organic insulating film 31 over the alignment film 33 instead of directly after the formation of the alignment film 33, for example.

When a negative voltage is applied to the conductive film 13 functioning as a gate electrode, an electric field is generated. The electric field is not blocked with the oxide semiconductor film 19a and affects the inorganic insulating film 30; therefore, the surface of the inorganic insulating film 30 is weakly positively charged. Moreover, when a negative voltage is applied to the conductive film 13 functioning as a gate electrode, positively charged particles contained in the air are adsorbed on the surface of the inorganic insulating film 30 and weak positive electric charges are generated on the surface of the inorganic insulating film 30.

The surface of the inorganic insulating film 30 is positively charged, so that an electric field is generated and the electric field affects the interface between the oxide semiconductor film 19a and the inorganic insulating film 30. Thus, the interface between the oxide semiconductor film 19a and the inorganic insulating film 30 is substantially in a state to which a positive bias is applied and therefore the threshold voltage of the transistor shifts in the negative direction.

On the other hand, the transistor 102 illustrated in this embodiment includes the organic insulating film 31 over the inorganic insulating film 30. Since the thickness of the organic insulating film 31 is as large as 500 nm or more, the electric field generated by application of a negative voltage to the conductive film 13 functioning as a gate electrode does not affect the surface of the organic insulating film 31 and the surface of the organic insulating film 31 is not positively charged easily. In addition, even when positively charged particle in the air is adsorbed on the surface of the organic insulating film 31, the electric field of the positively charged particle adsorbed on the surface of the organic insulating film 31 is less likely to affect the interface between the oxide semiconductor film 19a and the inorganic insulating film 30, because the organic insulating film 31 is thick (greater than or equal to 500 nm). Thus, the interface between the oxide semiconductor film 19a and the inorganic insulating film 30 is not substantially a state to which a positive bias is applied and therefore the amount of change in threshold voltage of the transistor is small.

Although water or the like diffuses easily in the organic insulating film 31, water from the outside does not diffuse to a semiconductor device through the organic insulating film 31 because the organic insulating film is isolated in each transistor 102. In addition, a nitride insulating film is included in the inorganic insulating film 30, whereby water diffused from the outside to the organic insulating film 31 can be prevented from diffusing to the oxide semiconductor film 19a.

The alignment film 33 is formed over the common electrode 29, the nitride insulating film 27, and the organic insulating film 31.

Next, a method for manufacturing the transistor 102 and the capacitor 105 in FIG. 17 is described with reference to FIGS. 18A to 18D, FIGS. 19A to 19C, FIGS. 20A to 20C, and FIGS. 21A and 21B.

As illustrated in FIG. 18A, a conductive film 12 to be the conductive film 13 is formed over the first substrate 11. The conductive film 12 is formed by a sputtering method, a chemical vapor deposition (CVD) method such as a metal organic chemical vapor deposition (MOCVD) method, a metal chemical deposition method, an atomic layer deposition (ALD) method, or a plasma-enhanced chemical vapor deposition (PECVD) method, an evaporation method, a pulsed laser deposition (PLD) method, or the like. When a metal organic chemical vapor deposition (MOCVD) method, a metal chemical deposition method, or an atomic layer deposition (ALD) method is employed, the conductive film is less damaged by plasma. Furthermore, in the case where the oxide semiconductor film 155b having conductivity in Embodiment 1 is used as the conductive film 12, the manufacturing method of the oxide semiconductor film 155b having conductivity can be used as appropriate.

Here, a glass substrate is used as the first substrate 11. Furthermore, as the conductive film 12, a 100-nm-thick tungsten film is formed by a sputtering method.

Next, a mask is formed over the conductive film 12 by a photolithography process using a first photomask. Then, as illustrated in FIG. 18B, part of the conductive film 12 is etched with the use of the mask to form the conductive film 13 functioning as a gate electrode. After that, the mask is removed.

Note that the conductive film 13 functioning as a gate electrode may be formed by an electrolytic plating method, a printing method, an ink-jet method, or the like instead of the above formation method.

Here, the tungsten film is etched by a dry etching method to form the conductive film 13 functioning as a gate electrode.

Next, as illustrated in FIG. 18C, over the conductive film 13 functioning as a gate electrode, the nitride insulating film 15 and an oxide insulating film 16 to be the oxide insulating film 17 later are formed. Then, over the oxide insulating film 16, an oxide semiconductor film 18 to be the oxide semiconductor film 19a and the oxide semiconductor film 19b having conductivity later is formed.

The nitride insulating film 15 and the oxide insulating film 16 are each formed by a sputtering method, a chemical vapor deposition (CVD) method such as a metal organic chemical vapor deposition (MOCVD) method, a metal chemical deposition method, an atomic layer deposition (ALD) method, or a plasma-enhanced chemical vapor deposition (PECVD) method, an evaporation method, a pulsed laser deposition (PLD) method, a coating method, a printing method, or the like. When a metal organic chemical vapor deposition (MOCVD) method, a metal chemical deposition method, or an atomic layer deposition (ALD) method is employed, the nitride insulating film 15 and the oxide insulating film 16 are less damaged by plasma. When an atomic layer deposition (ALD) method is employed, coverage of the nitride insulating film 15 and the oxide insulating film 16 can be increased.

Here, as the nitride insulating film 15, a 300-nm-thick silicon nitride film is formed by a plasma CVD method in which silane, nitrogen, and ammonia are used as a source gas.

In the case where a silicon oxide film, a silicon oxynitride film, or a silicon nitride oxide film is formed as the oxide insulating film 16, a deposition gas containing silicon and an oxidizing gas are preferably used as a source gas. Typical examples of the deposition gas containing silicon include silane, disilane, trisilane, and silane fluoride. As the oxidizing gas, oxygen, ozone, dinitrogen monoxide, and nitrogen dioxide can be given as examples.

Moreover, in the case of forming a gallium oxide film as the oxide insulating film 16, a metal organic chemical vapor deposition (MOCVD) method can be employed.

Here, as the oxide insulating film 16, a 50-nm-thick silicon oxynitride film is formed by a plasma CVD method in which silane and dinitrogen monoxide are used as a source gas.

The oxide semiconductor film 18 can be formed by a method that is similar to that of the oxide semiconductor film 155 described in Embodiment 1 as appropriate.

Here, a 35-nm-thick In—Ga—Zn oxide film is formed as the oxide semiconductor film by a sputtering method using an In—Ga—Zn oxide target (In:Ga:Zn=1:1:1).

Then, after a mask is formed over the oxide semiconductor film 18 by a photolithography process using a second photomask, the oxide semiconductor film is partly etched using the mask. Thus, the oxide semiconductor film 19a and an oxide semiconductor film 19c which are isolated from each other as illustrated in FIG. 18D are formed. After that, the mask is removed.

Here, the oxide semiconductor films 19a and 19c are formed in such a manner that a mask is formed over the oxide semiconductor film 18 and part of the oxide semiconductor film 18 is etched by a wet etching method.

Figure 19A:
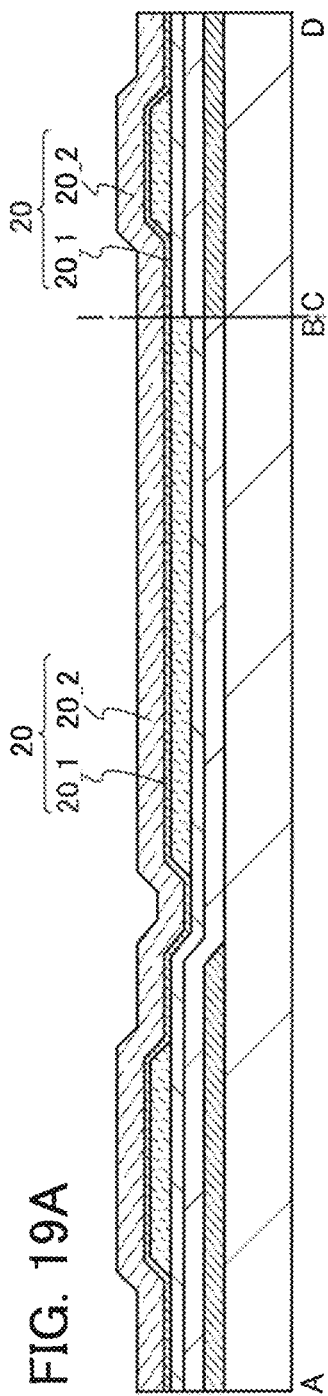
FIGS. 19A to 19C are cross-sectional views illustrating one embodiment of a method for manufacturing a display device.

Next, as illustrated in FIG. 19A, a conductive film 20 to be the conductive films 21a and 21b later is formed. Here, the conductive film 20 is a stack of a conductive film 20_1 and a conductive film 20_2. As the conductive films 20_1, a Cu—X alloy film is used. As the conductive films 20_2, a conductive film including a low-resistance material is used.

The conductive film 20 can be formed by a method similar to that of the conductive film 159 described in Embodiment 1 as appropriate.

Here, a 50-nm-thick Cu—Mn alloy film and a 300-nm-thick copper film are sequentially stacked by a sputtering method.

Figure 19B:
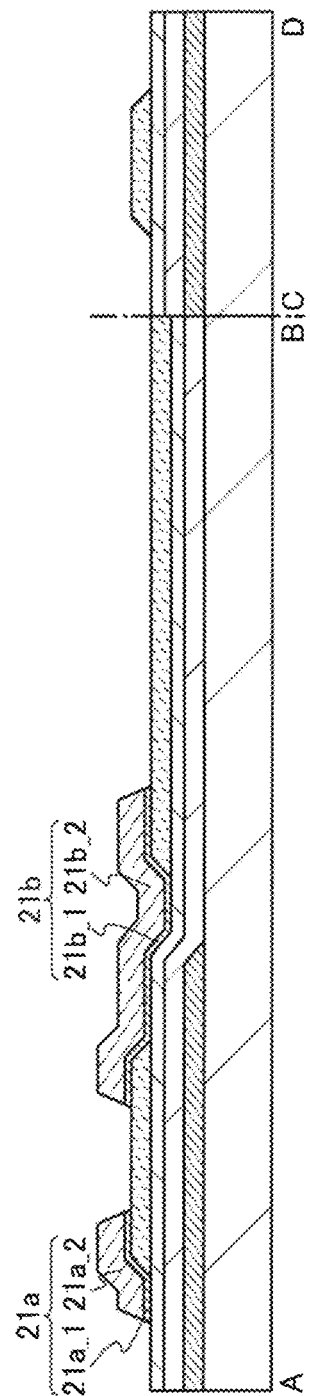

Next, a mask is formed over the conductive film 20 by a photolithography process using a third photomask. Then, the conductive film 20 is etched using the mask, so that the conductive films 21a and 21b serving as a source electrode and a drain electrode are formed as illustrated in FIG. 19B. After that, the mask is removed. The conductive film 21a is a stack of the conductive film 21a_1 formed by etching part of the conductive film 20_1 and the conductive film 21a_2 formed by etching part of the conductive film 20_2. The conductive film 21b is a stack of the conductive film 21b_1 formed by etching part of the conductive film 20_1 and the conductive film 21b_2 formed by etching part of the conductive film 20_2.

Here, a mask is formed over the copper film by a photolithography process. Then, the Cu—Mn film and the copper film are etched with the use of the mask, so that the conductive films 21a and 21b are formed. By using a wet etching method, the Cu—Mn film and the copper film can be etched in one step.

Figure 19C:
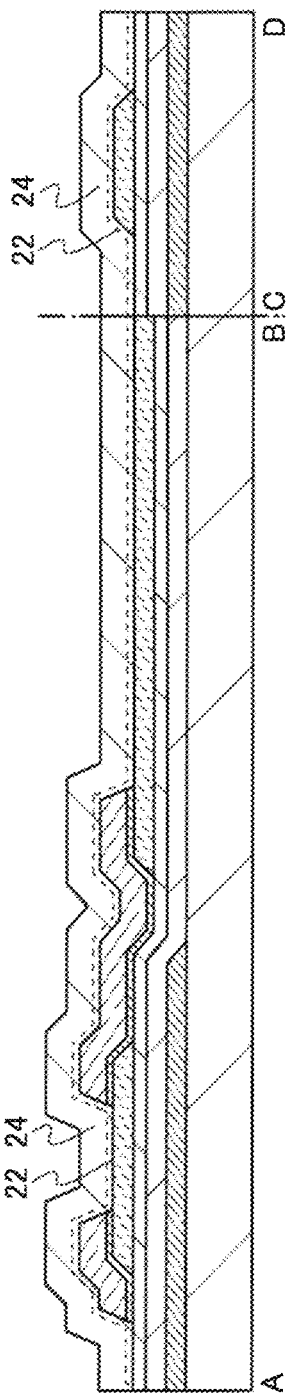

Next, as illustrated in FIG. 19C, an oxide insulating film 22 to be the oxide insulating film 23 later and an oxide insulating film 24 to be the oxide insulating film 25 later are formed over the oxide semiconductor films 19a and 19c and the conductive films 21a and 21b. The oxide insulating film 22 and the oxide insulating film 24 can each be formed by a method similar to those of the nitride insulating film 15 and the oxide insulating film 16 as appropriate.

Note that after the oxide insulating film 22 is formed, the oxide insulating film 24 is preferably formed in succession without exposure to the air. After the oxide insulating film 22 is formed, the oxide insulating film 24 is formed in succession by adjusting at least one of the flow rate of a source gas, pressure, a high-frequency power, and a substrate temperature without exposure to the air, whereby the impurity concentration attributed to the atmospheric component at the interface between the oxide insulating film 22 and the oxide insulating film 24 can be reduced and oxygen in the oxide insulating film 24 can be moved to the oxide semiconductor film 19a; accordingly, the amount of oxygen vacancies in the oxide semiconductor film 19a can be reduced.

The oxide insulating film 22 can be formed using an oxide insulating film containing nitrogen and having a small number of defects which is formed by a CVD method under the conditions where the ratio of an oxidizing gas to a deposition gas is higher than 20 times and lower than 100 times, preferably higher than or equal to 40 times and lower than or equal to 80 times and the pressure in a treatment chamber is lower than 100 Pa, preferably lower than or equal to 50 Pa.

A deposition gas containing silicon and an oxidizing gas are preferably used as the source gas of the oxide insulating film 22. Typical examples of the deposition gas containing silicon include silane, disilane, trisilane, and silane fluoride. As the oxidizing gas, oxygen, ozone, dinitrogen monoxide, and nitrogen dioxide can be given as examples.

With the use of the above conditions, an oxide insulating film which permeates oxygen can be formed as the oxide insulating film 22. Furthermore, by providing the oxide insulating film 22, damage to the oxide semiconductor film 19a can be reduced in the step of forming the oxide insulating film 24.

Here, as the oxide insulating film 22, a 50-nm-thick silicon oxynitride film is formed by a plasma CVD method in which silane with a flow rate of 50 sccm and dinitrogen monoxide with a flow rate of 2000 sccm are used as a source gas, the pressure in the treatment chamber is 20 Pa, the substrate temperature is 220° C., and a high-frequency power of 100 W is supplied to parallel-plate electrodes with the use of a 27.12 MHz high-frequency power source. Under the above conditions, a silicon oxynitride film containing nitrogen and having a small number of defects can be formed.

As the oxide insulating film 24, a silicon oxide film or a silicon oxynitride film is formed under the following conditions: the substrate placed in a treatment chamber of a plasma CVD apparatus that is vacuum-evacuated is held at a temperature higher than or equal to 180° C. and lower than or equal to 280° C., preferably higher than or equal to 200° C. and lower than or equal to 240° C., the pressure is greater than or equal to 100 Pa and less than or equal to 250 Pa, preferably greater than or equal to 100 Pa and less than or equal to 200 Pa with introduction of a source gas into the treatment chamber, and a high-frequency power of greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode provided in the treatment chamber.

A deposition gas containing silicon and an oxidizing gas are preferably used as the source gas of the oxide insulating film 24. Typical examples of the deposition gas containing silicon include silane, disilane, trisilane, and silane fluoride. As the oxidizing gas, oxygen, ozone, dinitrogen monoxide, and nitrogen dioxide can be given as examples.

As the film formation conditions of the oxide insulating film 24, the high-frequency power having the above power density is supplied to the treatment chamber having the above pressure, whereby the degradation efficiency of the source gas in plasma is increased, oxygen radicals are increased, and oxidation of the source gas is promoted; therefore, the oxygen content in the oxide insulating film 24 becomes higher than that in the stoichiometric composition. On the other hand, in the film formed at a substrate temperature within the above temperature range, the bond between silicon and oxygen is weak, and accordingly, part of oxygen in the film is released by heat treatment in a later step. Thus, it is possible to form an oxide insulating film which contains oxygen at a higher proportion than the stoichiometric composition and from which part of oxygen is released by heating. Furthermore, the oxide insulating film 22 is provided over the oxide semiconductor film 19a. Accordingly, in the step of forming the oxide insulating film 24, the oxide insulating film 22 serves as a protective film of the oxide semiconductor film 19a. Consequently, the oxide insulating film 24 can be formed using the high-frequency power having a high power density while damage to the oxide semiconductor film 19a is reduced.

Here, as the oxide insulating film 24, a 400-nm-thick silicon oxynitride film is formed by a plasma CVD method in which silane with a flow rate of 200 sccm and dinitrogen monoxide with a flow rate of 4000 sccm are used as the source gas, the pressure in the treatment chamber is 200 Pa, the substrate temperature is 220° C., and a high-frequency power of 1500 W is supplied to the parallel-plate electrodes with the use of a 27.12 MHz high-frequency power source. Note that the plasma CVD apparatus is a parallel-plate plasma CVD apparatus in which the electrode area is 6000 cm$^2$, and the power per unit area (power density) into which the supplied power is converted is 0.25 W/cm$^2$.

Furthermore, when the conductive films 21a and 21b functioning as a source electrode and a drain electrode is formed, the oxide semiconductor film 19a is damaged by the etching of the conductive film, so that oxygen vacancies are generated on the back channel side of the oxide semiconductor film 19a (the side of the oxide semiconductor film 19a which is opposite to the side facing the conductive film 13 functioning as a gate electrode). However, with the use of the oxide insulating film which contains oxygen at a higher proportion than the stoichiometric composition as the oxide insulating film 24, the oxygen vacancies generated on the back channel side can be repaired by heat treatment. By this, defects contained in the oxide semiconductor film 19a can be reduced, and thus, the reliability of the transistor 102 can be improved.

Figure 20A:
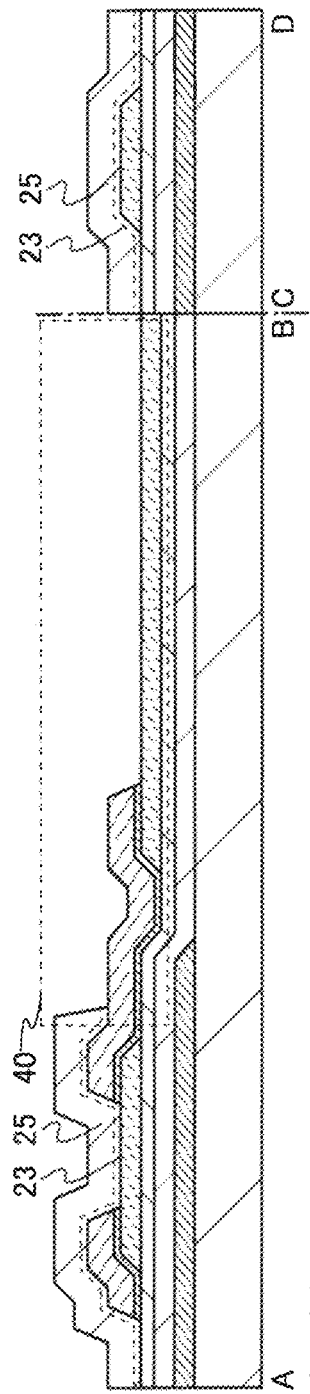
FIGS. 20A to 20C are cross-sectional views illustrating one embodiment of a method for manufacturing a display device.

Then, a mask is formed over the oxide insulating film 24 by a photolithography process using a fourth photomask. Next, as illustrated in FIG. 20A, part of the oxide insulating film 22 and part of the oxide insulating film 24 are etched with the use of the mask to form the oxide insulating film 23 and the oxide insulating film 25 having the opening 40. After that, the mask is removed.

In the process, the oxide insulating films 22 and 24 are preferably etched by a dry etching method. As a result, the oxide semiconductor film 19c is exposed to plasma in the etching treatment; thus, the amount of oxygen vacancies in the oxide semiconductor film 19c can be increased.

Next, heat treatment is performed. The heat treatment is performed typically at a temperature higher than or equal to 150° C. and lower than or equal to 400° C., preferably higher than or equal to 300° C. and lower than or equal to 400° C., further preferably higher than or equal to 320° C. and lower than or equal to 370° C.

An electric furnace, an RTA apparatus, or the like can be used for the heat treatment. With the use of an RTA apparatus, the heat treatment can be performed at a temperature higher than or equal to the strain point of the substrate if the heating time is short. Therefore, the heat treatment time can be shortened.

The heat treatment may be performed under an atmosphere of nitrogen, oxygen, ultra-dry air (air in which a water content is 20 ppm or less, preferably 1 ppm or less, further preferably 10 ppb or less), or a rare gas (argon, helium, or the like). The atmosphere of nitrogen, oxygen, ultra-dry air, or a rare gas preferably does not contain hydrogen, water, and the like.

By the heat treatment, part of oxygen contained in the oxide insulating film 25 can be moved to the oxide semiconductor film 19a, so that the amount of oxygen vacancies contained in the oxide semiconductor film 19a can be further reduced.

In the case where water, hydrogen, or the like enters the oxide insulating film 23 and the oxide insulating film 25 and the nitride insulating film 26 has a barrier property against water, hydrogen, or the like, when the nitride insulating film 26 is formed later and heat treatment is performed, water, hydrogen, or the like contained in the oxide insulating film 23 and the oxide insulating film 25 are moved to the oxide semiconductor film 19a, so that defects are generated in the oxide semiconductor film 19a. However, by the heating, water, hydrogen, or the like contained in the oxide insulating film 23 and the oxide insulating film 25 can be released; thus, variation in electrical characteristics of the transistor 102 can be reduced, and a change in threshold voltage can be suppressed.

Note that when the oxide insulating film 24 is formed over the oxide insulating film 22 while being heated, oxygen can be moved to the oxide semiconductor film 19a to reduce the amount of oxygen vacancies in the oxide semiconductor film 19a; thus, the heat treatment is not necessarily performed.

The heat treatment may be performed after the formation of the oxide insulating films 22 and 24. However, the heat treatment is preferably performed after the formation of the oxide insulating films 23 and 25 because a film having higher conductivity can be formed in such a manner that oxygen is not moved to the oxide semiconductor film 19c and oxygen is released from the oxide semiconductor film 19c because of exposure of the oxide semiconductor film 19c and then oxygen vacancies are generated.

Here, the heat treatment is performed at 350° C. in a mixed atmosphere of nitrogen and oxygen for one hour.

Figure 20B:
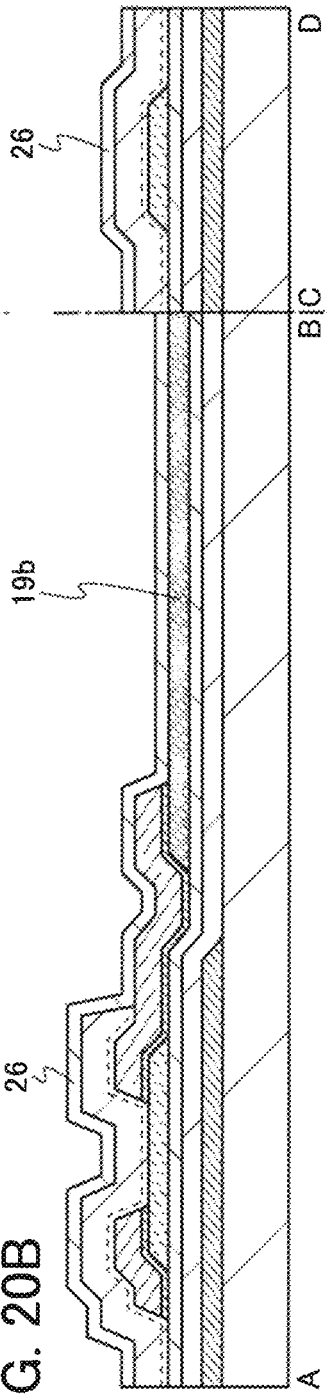

Then, as illustrated in FIG. 20B, the nitride insulating film 26 is formed.

The nitride insulating film 26 can be formed by a method similar to those of the nitride insulating film 15 and the oxide insulating film 16 as appropriate. By forming the nitride insulating film 26 by a sputtering method, a CVD method, or the like, the oxide semiconductor film 19c is exposed to plasma; thus, the amount of oxygen vacancies in the oxide semiconductor film 19c can be increased.

The oxide semiconductor film 19c has improved conductivity, and becomes the oxide semiconductor film 19b having conductivity. When a silicon nitride film is formed by a plasma CVD method as the nitride insulating film 26, hydrogen contained in the silicon nitride film is diffused to the oxide semiconductor film 19c; thus, the conductivity of the oxide semiconductor film can be enhanced. As a manufacturing method of the oxide semiconductor film 19b having conductivity, the manufacturing method of the oxide semiconductor film 155b having conductivity in Embodiment 1 can be used.

In the case where a silicon nitride film is formed by a plasma CVD method as the nitride insulating film 26, the substrate placed in the treatment chamber of the plasma CVD apparatus that is vacuum-evacuated is preferably held at a temperature higher than or equal to 300° C. and lower than or equal to 400° C., further preferably higher than or equal to 320° C. and lower than or equal to 370° C., so that a dense silicon nitride film can be formed.

In the case where a silicon nitride film is formed, a deposition gas containing silicon, nitrogen, and ammonia are preferably used as a source gas. As the source gas, a small amount of ammonia compared to the amount of nitrogen is used, whereby ammonia is dissociated in the plasma and activated species are generated. The activated species cleave a bond between silicon and hydrogen which are contained in a deposition gas containing silicon and a triple bond between nitrogen molecules. As a result, a dense silicon nitride film having few defects, in which bonds between silicon and nitrogen are promoted and bonds between silicon and hydrogen is few, can be formed. On the other hand, when the amount of ammonia is larger than the amount of nitrogen in the source gas, cleavage of a deposition gas containing silicon and cleavage of nitrogen are not promoted, so that a sparse silicon nitride film in which bonds between silicon and hydrogen remain and defects are increased is formed. Therefore, in a source gas, the flow ratio of the nitrogen to the ammonia is set to be preferably greater than or equal to 5 and less than or equal to 50, further preferably greater than or equal to 10 and less than or equal to 50.

Here, in the treatment chamber of a plasma CVD apparatus, a 50-nm-thick silicon nitride film is formed as the nitride insulating film 26 by a plasma CVD method in which silane with a flow rate of 50 sccm, nitrogen with a flow rate of 5000 sccm, and ammonia with a flow rate of 100 sccm are used as the source gas, the pressure in the treatment chamber is 100 Pa, the substrate temperature is 350° C., and a high-frequency power of 1000 W is supplied to parallel-plate electrodes with a high-frequency power supply of 27.12 MHz. Note that the plasma CVD apparatus is a parallel-plate plasma CVD apparatus in which the electrode area is 6000 cm$^2$, and the power per unit area (power density) into which the supplied power is converted is $1.7 \times 10^1$ W/cm$^2$.

Next, heat treatment may be performed. The heat treatment is performed typically at a temperature higher than or equal to 150° C. and lower than or equal to 400° C., preferably higher than or equal to 300° C. and lower than or equal to 400° C., further preferably higher than or equal to 320° C. and lower than or equal to 370° C. As a result, the negative shift of the threshold voltage can be reduced. Moreover, the amount of change in the threshold voltage can be reduced.

Next, although not illustrated, a mask is formed by a photolithography process using a fifth photomask. Then, part of each of the nitride insulating film 15, the oxide insulating film 16, the oxide insulating film 23, the oxide insulating film 25, and the nitride insulating film 26 is etched using the mask to form the nitride insulating film 27 and an opening through which part of a connection terminal formed at the same time as the conductive film 13 is exposed. Alternatively, part of each of the oxide insulating film 23, the oxide insulating film 25, and the nitride insulating film 26 is etched to form the nitride insulating film 27 and an opening through which part of a connection terminal formed at the same time as the conductive films 21a and 21b is exposed.

Figure 20C:
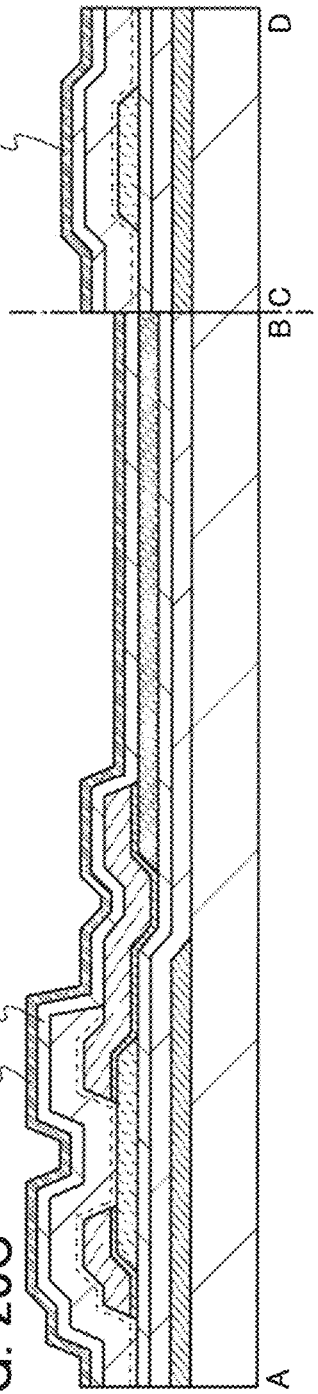

Next, as illustrated in FIG. 20C, a conductive film 28 to be the common electrode 29 later is formed over the nitride insulating film 27.

The conductive film 28 is formed by a sputtering method, a CVD method, an evaporation method, or the like.

Furthermore, in the case where the oxide semiconductor film 155b having conductivity in Embodiment 1 is used as the conductive film 28, the manufacturing method of the oxide semiconductor film 155b having conductivity can be used as appropriate.

Then, a mask is formed over the conductive film 28 by a photolithography process using a sixth photomask. Next, as illustrated in FIG. 21A, part of the conductive film 28 is etched with the use of the mask to form the common electrode 29. Although not illustrated, the common electrode 29 is connected to the connection terminal formed at the same time as the conductive film 13 or the connection terminal formed at the same time as the conductive films 21a and 21b. After that, the mask is removed.

Next, as illustrated in FIG. 21B, the organic insulating film 31 is formed over the nitride insulating film 27. An organic insulating film can be formed by a coating method, a printing method, or the like as appropriate.

In the case where the organic insulating film is formed by a coating method, a photosensitive composition, with which the upper surfaces of the nitride insulating film 27 and the common electrode 29 are coated, is exposed to light and developed by photolithography process using a seventh photomask, and is then subjected to heat treatment. Note that in the case where the upper surfaces of the nitride insulating film 27 and the common electrode 29 are coated with a non-photosensitive composition, a resist, with which the upper surface of the non-photosensitive composition is coated, is processed by a photolithography process using a seventh mask to form a mask, and then the non-photosensitive composition is etched using the mask, whereby the organic insulating film 31 can be formed.

Through the above process, the transistor 102 is manufactured and the capacitor 105 can be manufactured.

In this embodiment, the conductive film 21b including the Cu—X alloy film is formed over the oxide semiconductor film 19b having conductivity, whereby the adhesion between the oxide semiconductor film 19b having conductivity and the conductive film 21b can be increased and the contact resistance between them can be reduced.

The element substrate of the display device described in this embodiment includes an organic insulating film overlapping with a transistor with an inorganic insulating film provided therebetween. Therefore, a display device in which reliability of the transistor can be improved and whose display quality is maintained can be manufactured.

The element substrate of the display device of this embodiment is provided with a common electrode whose upper surface has a zigzag shape and which includes stripe regions extending in a direction intersecting with the conductive film functioning as a signal line. Therefore, the display device can have excellent contrast. In addition, flickers can be reduced in a liquid crystal display device having a low refresh rate.

In the element substrate of the display device of this embodiment, the oxide semiconductor film having conductivity serving as the pixel electrode is formed at the same time as the oxide semiconductor film of the transistor, in which the channel region is formed; therefore, the transistor 102 and the capacitor 105 can be formed using six photomasks. The oxide semiconductor film having conductivity functions as the one of electrodes of the capacitor. The common electrode also functions as the other of electrodes of the capacitor. Thus, a step of forming another conductive film is not needed to form the capacitor, and the number of steps of manufacturing the display device can be reduced. The capacitor has a light-transmitting property. As a result, the area occupied by the capacitor can be increased and the aperture ratio in a pixel can be increased. Moreover, power consumption of the display device can be reduced.

Next, the element layer formed on the second substrate 342 is described. A film having a colored property (hereinafter referred to as a coloring film 346) is formed on the second substrate 342. The coloring film 346 functions as a color filter. Furthermore, a light-blocking film 344 adjacent to the coloring film 346 is formed on the second substrate 342. The light-blocking film 344 functions as a black matrix. The coloring film 346 is not necessarily provided in the case where the liquid crystal display device is a monochrome display device, for example.

The coloring film 346 is a coloring film that transmits light in a specific wavelength range. For example, a red (R) film for transmitting light in a red wavelength range, a green (G) film for transmitting light in a green wavelength range, a blue (B) film for transmitting light in a blue wavelength range, or the like can be used.

The light-blocking film 344 preferably has a function of blocking light in a specific wavelength range, and can be a metal film or an organic insulating film including a black pigment or the like, for example.

An insulating film 348 is formed on the coloring film 346. The insulating film 348 functions as a planarization layer or suppresses diffusion of impurities in the coloring film 346 to the liquid crystal element side.

A conductive film 350 is formed on the insulating film 348. The conductive film 350 is formed using a light-transmitting conductive film. The potential of the conductive film 350 is preferably the same as that of the common electrode 29. In other words, a common potential is preferably applied to the conductive film 350.

When a voltage for driving the liquid crystal molecules is applied to the conductive film 21b, an electric field is generated between the conductive film 21b and the common electrode 29. Liquid crystal molecules between the conductive film 21b and the common electrode 29 align due to the effect of the electric field and thus a flicker is generated.

However, it is possible to suppress an alignment change of liquid crystal molecules in a direction perpendicular to the substrate due to an electric field between the conductive film 21b and the common electrode 29 in such a manner that the conductive film 350 is provided to face the common electrode 29 through the liquid crystal layer 320 so that the common electrode 29 and the conductive film 350 have the same potential. Accordingly, the alignment state of the liquid crystal molecules in the region is stabilized. Thus, flickers can be reduced.

Note that the alignment film 352 is formed on the conductive film 350.

In addition, the liquid crystal layer 320 is formed between the alignment films 33 and 352. The liquid crystal layer 320 is sealed between the first substrate 11 and the second substrate 342 with the use of a sealant (not illustrated). The sealant is preferably in contact with an inorganic material to prevent entry of moisture and the like from the outside.

A spacer may be provided between the alignment films 33 and 352 to maintain the thickness of the liquid crystal layer 320 (also referred to as a cell gap).

Note that the structures, methods, and the like described in this embodiment can be used as appropriate in combination with any of the structures, methods, and the like described in the other embodiments.

Modification Example 1

Figure 22:
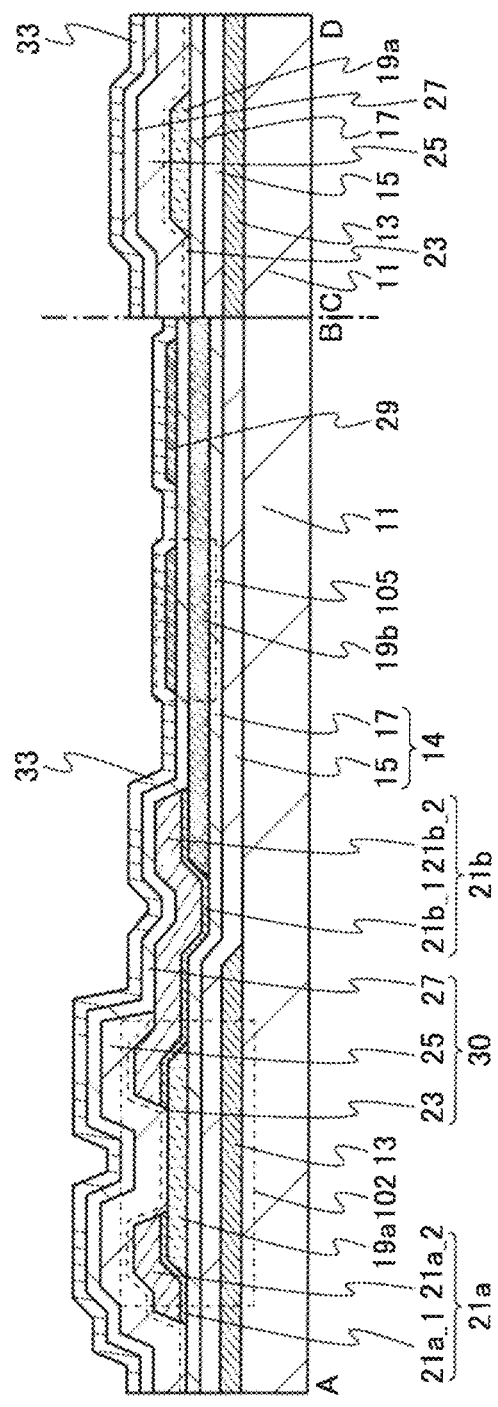
FIG. 22 is a cross-sectional view illustrating one embodiment of a display device.

FIG. 22 illustrates a modification example of the display device in FIG. 17.

In a display device in FIG. 22, an organic resin film is not formed over the inorganic insulating film 30, and the alignment film 33 is in contact with the whole of the inorganic insulating film 30. As a result, the number of photomasks for forming the element portion over the first substrate 11 can be reduced, and simplification of the manufacturing process of the first substrate 11 provided with the element portion can be achieved.

Modification Example 2

Figure 23:
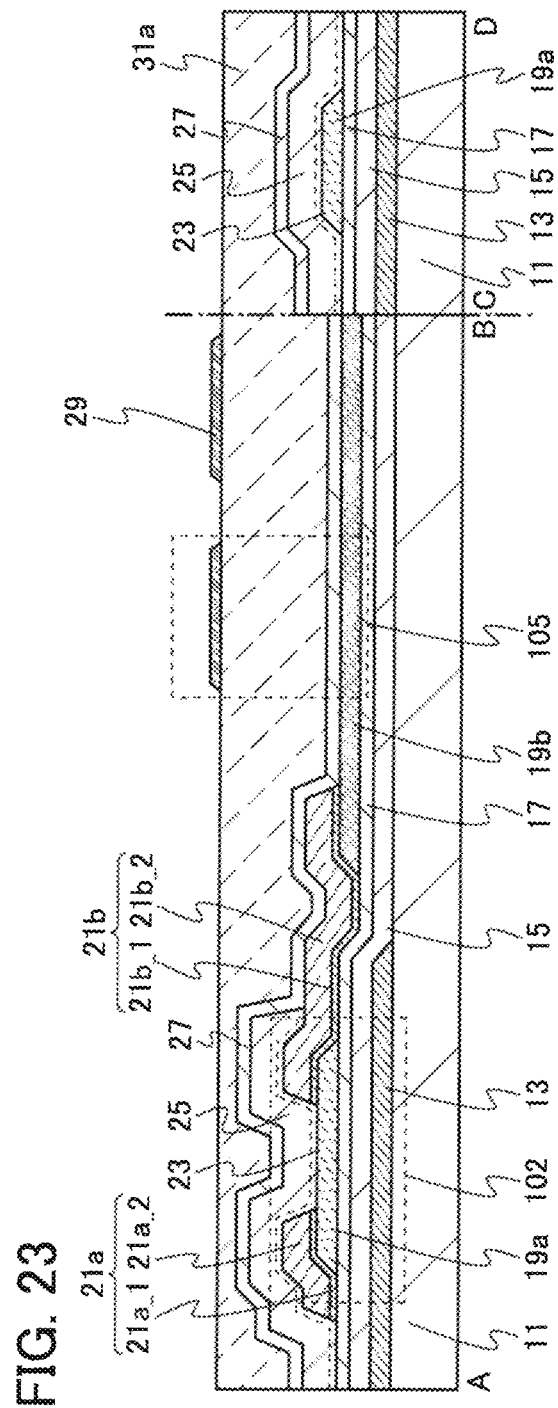
FIG. 23 is a cross-sectional view illustrating one embodiment of a display device.

FIG. 23 illustrates a modification example of the display device in FIG. 17.

In a display device in FIG. 23, a continuous organic resin film 31a that is not divided is formed over the nitride insulating film 27. Furthermore, the common electrode 29 is formed over the organic resin film 31a. The organic resin film 31a serves as a planarization film; thus, irregularity in alignment of liquid crystal molecules included in the liquid crystal layer can be reduced.

Modification Example 3

Figure 24:
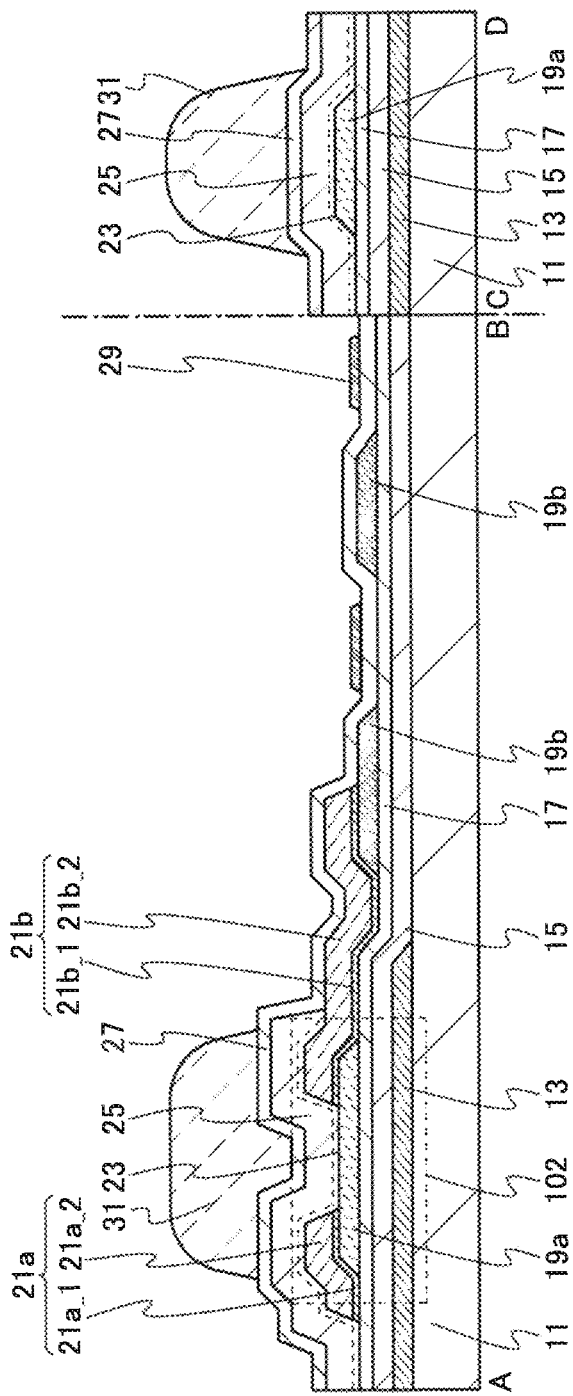
FIG. 24 is a cross-sectional view illustrating one embodiment of a display device.

FIG. 24 illustrates a modification example of the display device in FIG. 17.

The oxide semiconductor film 19b having conductivity that serves as a pixel electrode in FIG. 24 has a slit. Note that the oxide semiconductor film 19b having conductivity may have a comb-like shape.

Modification Example 4

Figure 25:
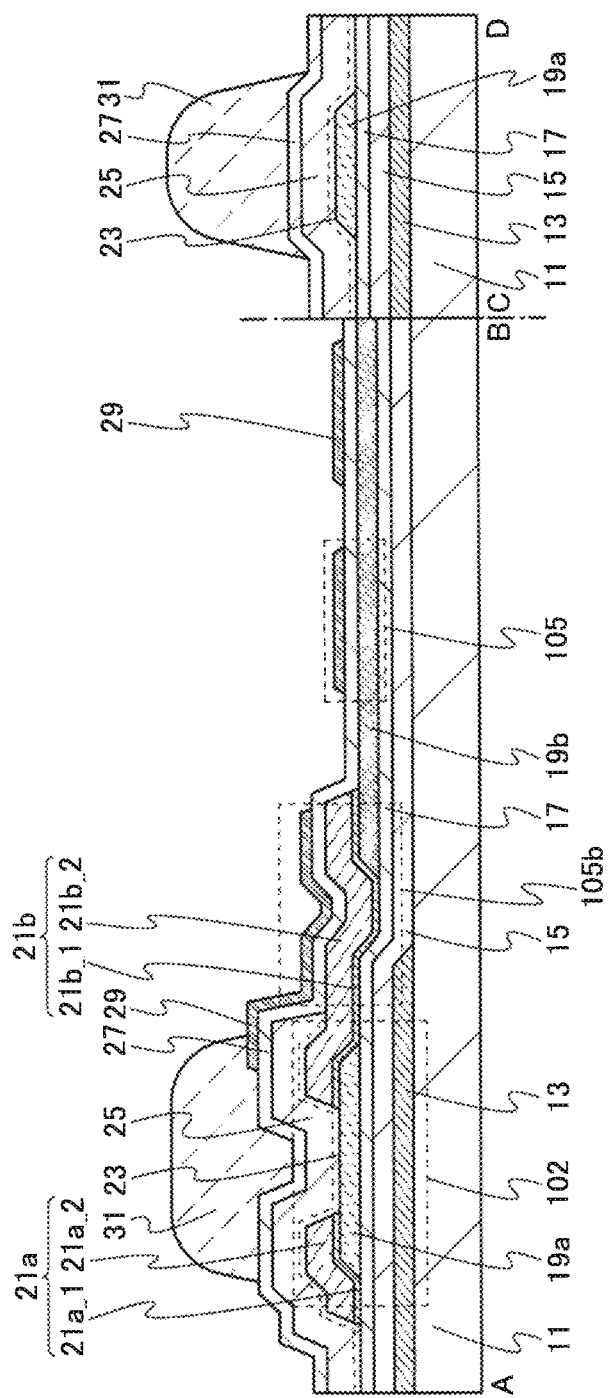
FIG. 25 is a cross-sectional view illustrating one embodiment of a display device.

FIG. 25 illustrates a modification example of the display device in FIG. 17.

The common electrode 29 in FIG. 25 overlaps with the conductive film 21b with the nitride insulating film 27 provided therebetween. The common electrode 29, the nitride insulating film 27, and the conductive film 21b constitute a capacitor 105b. By providing the capacitor 105b, the capacitance value in the pixel can be increased.

Modification Example 5

Figure 26A:
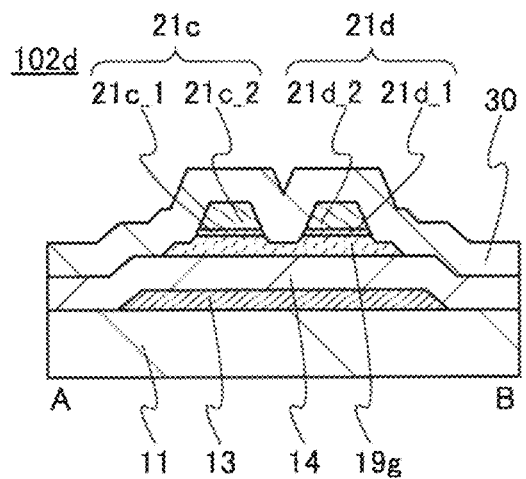
FIGS. 26A and 26B are cross-sectional views each illustrating one embodiment of a transistor.
Figure 26B:
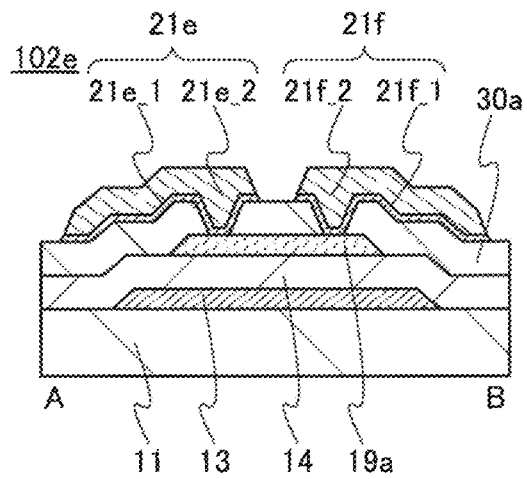

FIGS. 26A and 26B illustrate modification examples of the transistor 102 in FIG. 17.

A transistor 102d illustrated in FIG. 26A includes an oxide semiconductor film 19g and a pair of conductive films 21c and 21d, which are formed with a multi-tone photomask. Note that the conductive film 21c has a stacked-layer structure of a conductive film 21c_1 and a conductive film 21c_2. The conductive film 21d has a stacked-layer structure of a conductive film 21d_1 and a conductive film 21d_2. As the conductive films 21c_1 and 21d_1, a Cu—X alloy film is used. As the conductive films 21c_2 and 21d_2, a conductive film including a low-resistance material is used.

With the use of a multi-tone photomask, a resist mask having a plurality of thicknesses can be formed. After the oxide semiconductor film 19g is formed with the resist mask, the resist mask is exposed to oxygen plasma or the like and is partly removed; accordingly, a resist mask for forming a pair of conductive films is formed. Therefore, the number of steps in the photolithography process in the process of forming the oxide semiconductor film 19g and the pair of conductive films 21c and 21d can be reduced.

Note that outside the pair of conductive films 21c and 21d, the oxide semiconductor film 19g formed with a multi-tone photomask is partly exposed when seen from the above.

A transistor 102e illustrated in FIG. 26B is a channel-protective transistor.

The transistor 102e illustrated in FIG. 26B includes the conductive film 13 functioning as a gate electrode provided over the first substrate 11, the gate insulating film 14 formed over the first substrate 11 and the conductive film 13 functioning as a gate electrode, the oxide semiconductor film 19a overlapping with the conductive film 13 functioning as a gate electrode with the gate insulating film 14 provided therebetween, an inorganic insulating film 30a covering a channel region and side surfaces of the oxide semiconductor film 19a, and conductive films 21e and 21f functioning as a source electrode and a drain electrode in contact with the oxide semiconductor film 19a in an opening of the inorganic insulating film 30a. Note that the conductive film 21e has a stacked-layer structure of a conductive film 21e_1 and a conductive film 21e_2. The conductive film 21f has a stacked-layer structure of a conductive film 21f_1 and a conductive film 21f_2. As the conductive films 21e_1 and 21f_1, a Cu—X alloy film is used. As the conductive films 21e_2 and 21f_2, a conductive film including a low-resistance material is used.

In the channel-protective transistor, the oxide semiconductor film 19a is not damaged by etching for forming the conductive films 21e and 21f because the oxide semiconductor film 19a is covered with the inorganic insulating film 30a. Therefore, defects in the oxide semiconductor film 19a can be reduced.

The structures, methods, and the like described in this embodiment can be used as appropriate in combination with any of the structures, methods, and the like described in the other embodiments.

Embodiment 5

In this embodiment, as an example of a display device, a liquid crystal display device driven in a vertical alignment (VA) mode will be described. First, a top view of a plurality of pixels 103 included in the liquid crystal display device is shown in FIG. 27.

Figure 27:
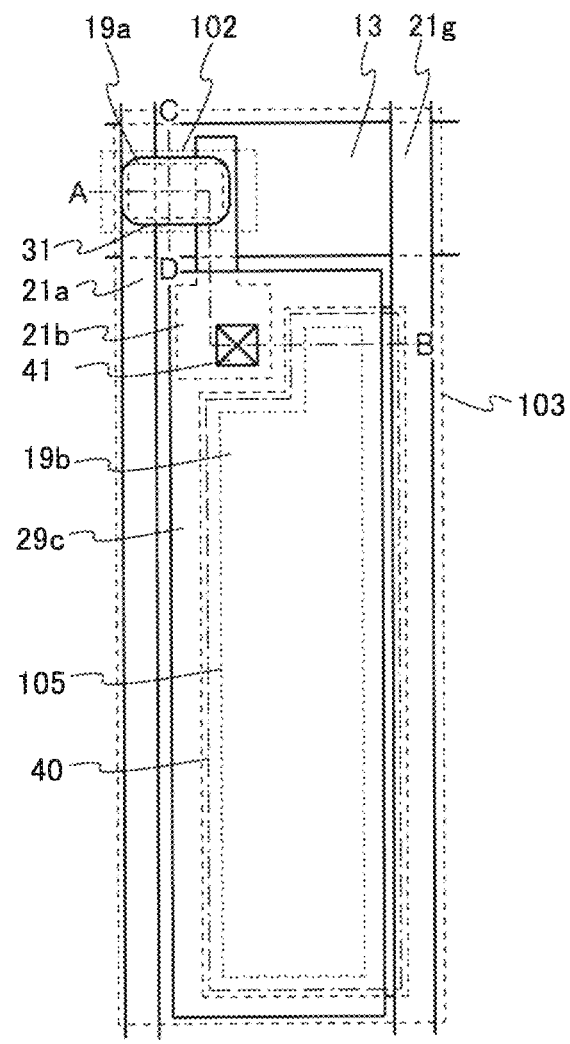
FIG. 27 is a top view illustrating one embodiment of a display device.

In FIG. 27, a conductive film 13 functioning as a scan line extends in a direction substantially perpendicularly to a conductive film functioning as a signal line (in the lateral direction in the drawing). The conductive film 21a functioning as a signal line extends in a direction substantially perpendicularly to the conductive film functioning as a scan line (in the longitudinal direction in the drawing). A conductive film 21g functioning as a capacitor line extends in a direction parallel to the signal line. Note that the conductive film 13 functioning as a scan line is electrically connected to the scan line driver circuit 104 (see FIG. 15A), and the conductive film 21a functioning as a signal line and the conductive film 21g functioning as a capacitor line is electrically connected to the signal line driver circuit 106 (see FIG. 15A).

The transistor 102 is provided in a region where the conductive film functioning as a scan line and the conductive film functioning as a signal line intersect with each other. The transistor 102 includes the conductive film 13 functioning as a gate electrode; a gate insulating film (not illustrated in FIG. 27); the oxide semiconductor film 19a where a channel region is formed, over the gate insulating film; and the conductive films 21a and 21b functioning as a pair of electrodes. The conductive film 13 also functions as a scan line, and a region of the conductive film 13 that overlaps with the oxide semiconductor film 19a functions as the gate electrode of the transistor 102. In addition, the conductive film 21a also functions as a signal line, and a region of the conductive film 21a that overlaps with the oxide semiconductor film 19a functions as the source electrode or the drain electrode of the transistor 102. Furthermore, in the top view of FIG. 27, an end portion of the conductive film functioning as a scan line is positioned on an outer side of an end portion of the oxide semiconductor film 19a. Thus, the conductive film functioning as a scan line functions as a light-blocking film for blocking light from a light source such as a backlight. For this reason, the oxide semiconductor film 19a included in the transistor is not irradiated with light, so that a variation in the electrical characteristics of the transistor can be suppressed.

In addition, the transistor 102 includes the organic insulating film 31 overlapping with the oxide semiconductor film 19a in a manner similar to that in Embodiment 4. The organic insulating film 31 overlaps with the oxide semiconductor film 19a (in particular, a region of the oxide semiconductor film 19a which is between the conductive films 21a and 21b) with an inorganic insulating film (not illustrated in FIG. 27) provided therebetween.

The conductive film 21b is electrically connected to a light-transmitting conductive film 29c that functions as a pixel electrode in an opening 41.

The capacitor 105 is connected to the conductive film 21g functioning as a capacitor line. The capacitor 105 includes an oxide semiconductor film 19d having conductivity formed over the gate insulating film, a dielectric film formed over the transistor 102, and the light-transmitting conductive film 29c functioning as a pixel electrode. The oxide semiconductor film 19d having conductivity formed over the gate insulating film has a light-transmitting property. That is, the capacitor 105 has a light-transmitting property.

Owing to the light-transmitting property of the capacitor 105, the capacitor 105 can be formed large (in a large area) in the pixel 103. Thus, a display device with a large-capacitance capacitor as well as an aperture ratio increased to typically 55% or more, preferably 60% or more can be provided. For example, in a high-resolution display device such as a liquid crystal display device, the area of a pixel is small and accordingly the area of a capacitor is also small. For this reason, the amount of charges accumulated in the capacitor is small in the high-resolution display device. However, since the capacitor 105 of this embodiment has a light-transmitting property, when the capacitor 105 is provided in a pixel, a sufficient capacitance value can be obtained in the pixel and the aperture ratio can be improved. Typically, the capacitor 105 can be favorably used for a high-resolution display device with a pixel density of 200 pixels per inch (ppi) or more, 300 ppi or more, or furthermore, 500 ppi or more.

Furthermore, according to one embodiment of the present invention, the aperture ratio can be improved even in a high-resolution display device, which makes it possible to use light from a light source such as a backlight efficiently, so that power consumption of the display device can be reduced.

Figure 28:
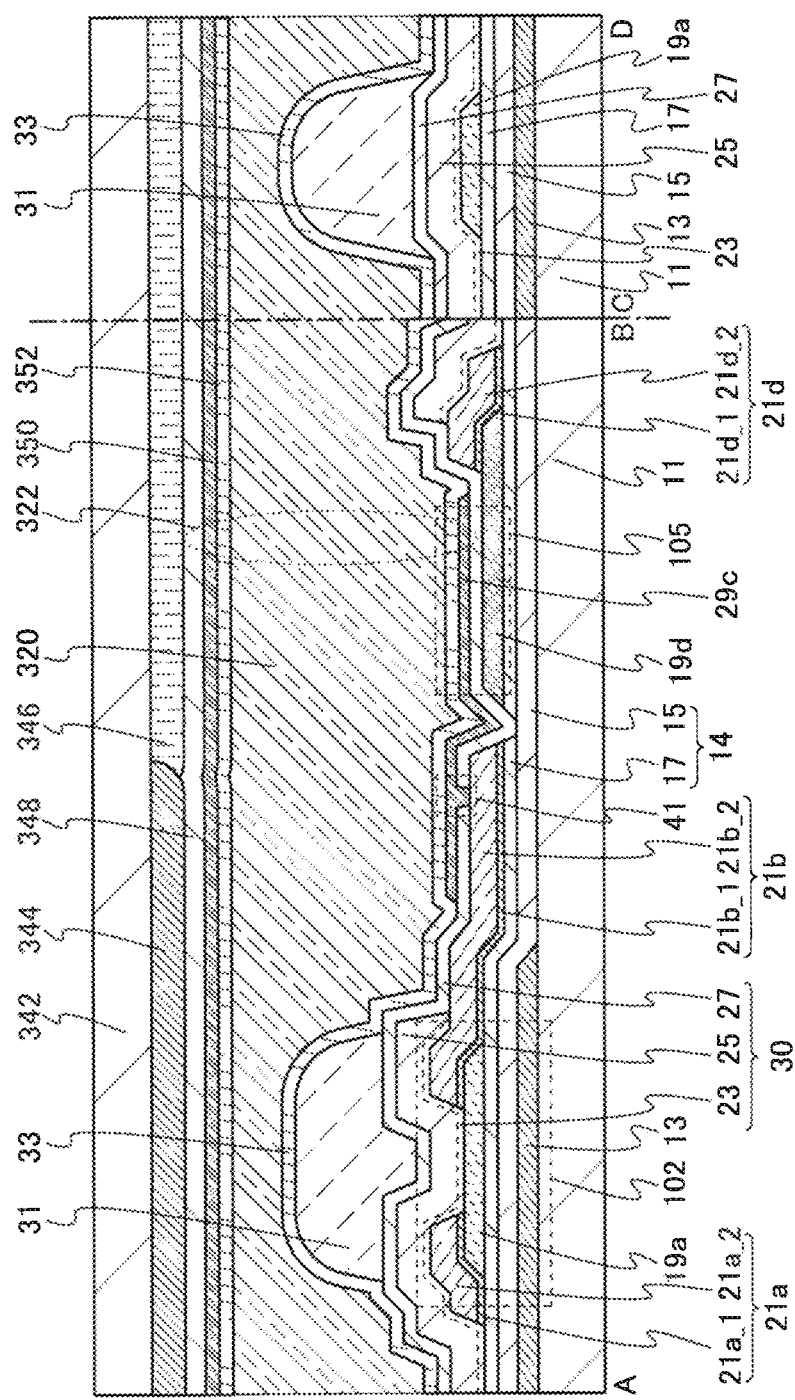
FIG. 28 is a cross-sectional view illustrating one embodiment of a display device.

Next, FIG. 28 is a cross-sectional view taken along dashed-dotted lines A-B and C-D in FIG. 27. The transistor 102 illustrated in FIG. 27 is a channel-etched transistor. Note that the transistor 102 in the channel length direction, a connection portion between the transistor 102 and the light-transmitting conductive film 29c functioning as a pixel electrode, and the capacitor 105 are illustrated in the cross-sectional view taken along dashed-dotted line A-B, and the transistor 102 in the channel width direction is illustrated in the cross-sectional view taken along dashed-dotted line C-D.

Since the liquid crystal display device described in this embodiment is driven in a VA mode, a liquid crystal element 322 includes the light-transmitting conductive film 29c functioning as a pixel electrode included in the element layer of the first substrate 11, the conductive film 350 included in the element layer of the second substrate 342, and the liquid crystal layer 320.

In addition, the transistor 102 in FIG. 28 has a structure similar to that of the transistor 102 in Embodiment 4. The light-transmitting conductive film 29c functioning as a pixel electrode connected to one of the conductive films 21a and 21b functioning as a source electrode and a drain electrode (here, connected to the conductive film 21b) is formed over the nitride insulating film 27. In the opening 41 of the nitride insulating film 27, the conductive film 21b is connected to the light-transmitting conductive film 29c functioning as a pixel electrode.

The light-transmitting conductive film 29c functioning as a pixel electrode can be formed using as appropriate a material and a manufacturing method similar to those of the common electrode 29 in Embodiment 4.

The capacitor 105 in FIG. 28 includes the oxide semiconductor film 19*d* having conductivity formed over the oxide insulating film 17, the nitride insulating film 27, and the light-transmitting conductive film 29*c* functioning as a pixel electrode.

Over the transistor 102 in this embodiment, the oxide insulating films 23 and 25 which are isolated from each other are formed. The oxide insulating films 23 and 25 which are isolated from each other overlap with the oxide semiconductor film 19*a*.

In addition, the organic insulating film 31 overlapping with the oxide semiconductor film 19*a* is provided over the nitride insulating film 27. The organic insulating film 31 overlapping with the oxide semiconductor film 19*a* is provided over the transistor 102, whereby the surface of the oxide semiconductor film 19*a* can be made apart from the surface of the organic insulating film 31. Thus, the surface of the oxide semiconductor film 19*a* is not affected by the electric field of positively charged particles adsorbed on the surface of the organic insulating film 31 and therefore the reliability of the transistor 102 can be improved.

In the capacitor 105, the oxide semiconductor film 19*d* having conductivity is different from that in Embodiment 4 and is not connected to the conductive film 21*b*. In contrast, the oxide semiconductor film 19*d* having conductivity is in contact with a conductive film 21*d*. The conductive film 21*d* serves as a capacitor line. The oxide semiconductor film 19*d* having conductivity can be formed in a manner similar to that of the oxide semiconductor film 19*b* having conductivity in Embodiment 4. That is, the oxide semiconductor film 19*d* having conductivity is a metal oxide film containing the same metal element as the oxide semiconductor film 19*a*.

Next, a method for manufacturing the transistor 102 and the capacitor 105 in FIG. 28 is described with reference to FIGS. 29A to 29C and FIGS. 30A to 30C.

Figure 29A:
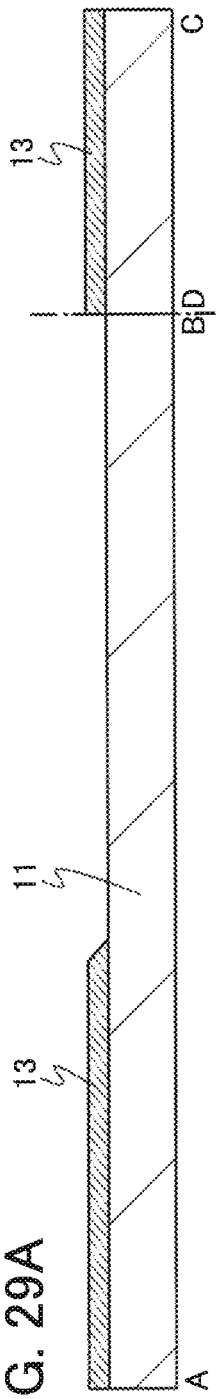
FIGS. 29A to 29C are cross-sectional views illustrating one embodiment of a method for manufacturing a display device.
Figure 29B:
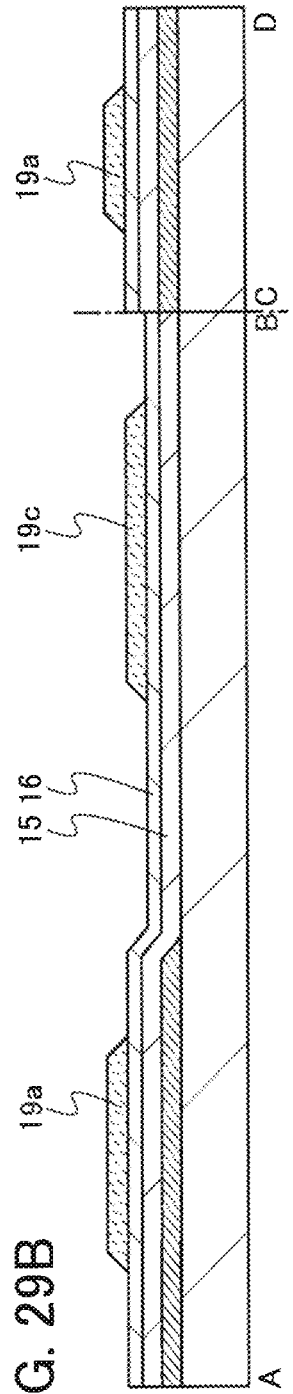

A conductive film is formed over the first substrate 11 and then etched using a mask formed through the first photolithography process in Embodiment 4, whereby the conductive film 13 functioning as a gate electrode is formed over the first substrate 11 (see FIG. 29A).

Next, the nitride insulating film 15 and the oxide insulating film 16 are formed over the first substrate 11 and the conductive film 13 functioning as a gate electrode. Next, an oxide semiconductor film is formed over the oxide insulating film 16 and then etched using a mask formed through the second photolithography process in Embodiment 4, whereby the oxide semiconductor films 19*a* and 19*c* are formed (see FIG. 29B).

Figure 29C:
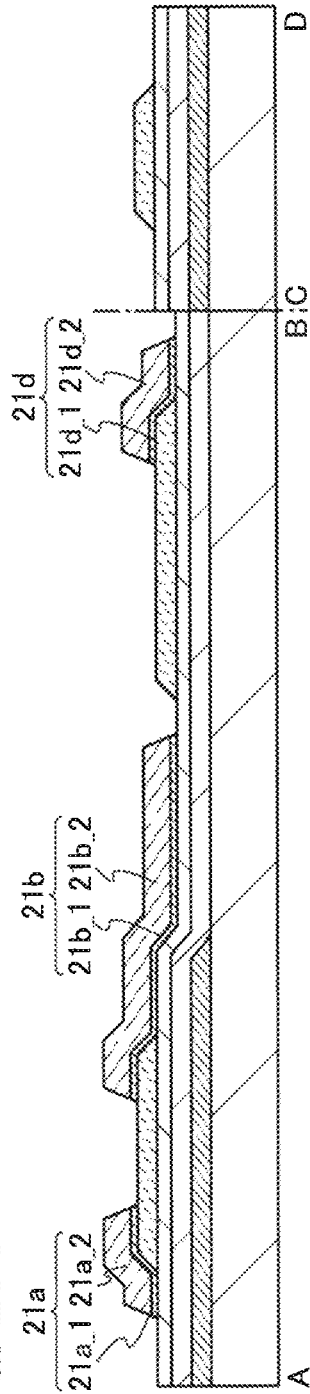

Next, a conductive film is formed over the oxide insulating film 16 and the oxide semiconductor films 19*a* and 19*c* and then etched using a mask formed through the third photolithography process in Embodiment 4, whereby the conductive films 21*a*, 21*b*, and 21*d* are formed (see FIG. 29C). At this time, the conductive film 21*b* is formed so as not to be in contact with the oxide semiconductor film 19*c*. The conductive film 21*d* is formed so as to be in contact with the oxide semiconductor film 19*c*. In the conductive film 21*d*, as in the conductive films 21*a* and 21*b*, the conductive film 21*d*_1 and the conductive film 21*d*_2 are stacked.

Next, an oxide insulating film is formed over the oxide insulating film 16, the oxide semiconductor films 19*a* and 19*c*, and the conductive films 21*a*, 21*b*, and 21*d* and then etched using a mask formed through the fourth photolithography process in Embodiment 4, whereby the oxide insulating films 23 and 25 having the opening 40 are formed (see FIG. 30A).

Next, a nitride insulating film is formed over the oxide insulating film 17, the oxide semiconductor films 19*a* and 19*c*, the conductive films 21*a*, 21*b*, and 21*d*, and the oxide insulating films 23 and 25 and then etched using a mask formed through the fifth photolithography process in Embodiment 4, whereby the nitride insulating film 27 having the opening 41 through which part of the conductive film 21*b* is exposed is formed (see FIG. 30B).

Through the above steps, the oxide semiconductor film 19*c* becomes the oxide semiconductor film 19*d* having conductivity. When a silicon nitride film is formed later by a plasma CVD method as the nitride insulating film 27, hydrogen contained in the silicon nitride film is diffused to the oxide semiconductor film 19*c*; thus, the conductivity of the oxide semiconductor film 19*d* having conductivity can be enhanced.

Next, a conductive film is formed over the conductive film 21*b* and the nitride insulating film 27 and then etched using a mask formed through the sixth photolithography process in Embodiment 4, whereby the conductive film 29*c* connected to the conductive film 21*b* is formed (see FIG. 30C).

From the above, as for a semiconductor device including an oxide semiconductor film, a semiconductor device with improved electrical characteristics can be obtained.

On an element substrate of the semiconductor device described in this embodiment, one electrode of the capacitor is formed at the same time as the oxide semiconductor film of the transistor. In addition, the light-transmitting conductive film functioning as a pixel electrode is used as the other electrode of the capacitor. Thus, a step of forming another conductive film is not needed to form the capacitor, and the number of steps of manufacturing the display device can be reduced. Furthermore, since the pair of electrodes has a light-transmitting property, the capacitor has a light-transmitting property. As a result, the area occupied by the capacitor can be increased and the aperture ratio in a pixel can be increased.

Modification Example 1

In this embodiment, a display device that can be manufactured with a small number of masks as compared with that of the semiconductor device described in Embodiment 4 is described with reference to FIG. 31.

Figure 31:
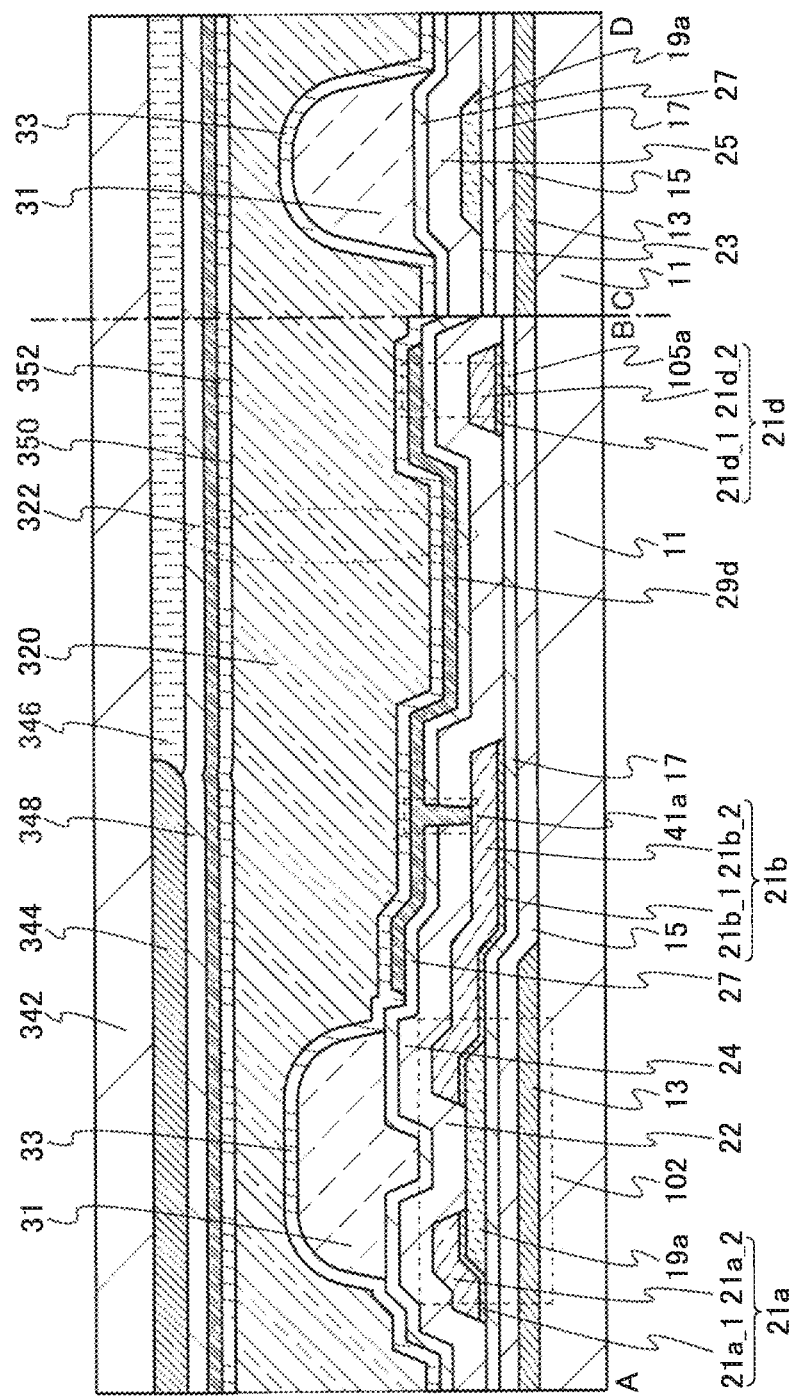
FIG. 31 is a cross-sectional view illustrating one embodiment of a display device.

In the display device illustrated in FIG. 31, the number of masks can be reduced by not etching the oxide insulating film 22 and the oxide insulating film 24 formed over the transistor 102. In addition, the nitride insulating film 27 is formed over the oxide insulating film 24, and an opening 41*a* through which part of the conductive film 21*b* is exposed is formed in the oxide insulating films 22 and 24 and the nitride insulating film 27. A light-transmitting conductive film 29*d* functioning as a pixel electrode, which is connected to the conductive film 21*b* in the opening 41*a*, is formed over the nitride insulating film 27.

The conductive film 21*d* is formed over the oxide insulating film 17. Since the conductive film 21*d* is formed at the same time as the conductive films 21*a* and 21*b* are formed, an additional photomask is not needed to form the conductive film 21*d*. The conductive film 21*d* functions as a capacitor line. That is, a capacitor 105*a* includes the conductive film 21*d*, the oxide insulating film 22, the oxide insulating film 24, the nitride insulating film 27, and the light-transmitting conductive film 29d functioning as a pixel electrode.

The structures, methods, and the like described in this embodiment can be used as appropriate in combination with any of the structures, methods, and the like described in the other embodiments.

Embodiment 6

In this embodiment, a display device which is different from the display devices in Embodiment 4 and a manufacturing method thereof are described with reference to drawings. This embodiment is different from Embodiment 4 in that the transistor has a structure in which an oxide semiconductor film is provided between different gate electrodes, that is, a dual-gate structure. Note that the structures similar to those in Embodiment 4 are not described repeatedly here.

A specific structure of an element layer formed over the first substrate 11 included in the display device is described. The transistor provided in the display device of this embodiment is different from that in Embodiment 4 in that a conductive film 29b functioning as a gate electrode and overlapping part of or the whole of each of the conductive film 13 functioning as a gate electrode, the oxide semiconductor film 19a, the conductive films 21a and 21b, and the oxide insulating film 25 is provided. The conductive film 29b functioning as a gate electrode is connected to the conductive film 13 functioning as a gate electrode in the opening 41a.

Figure 32:
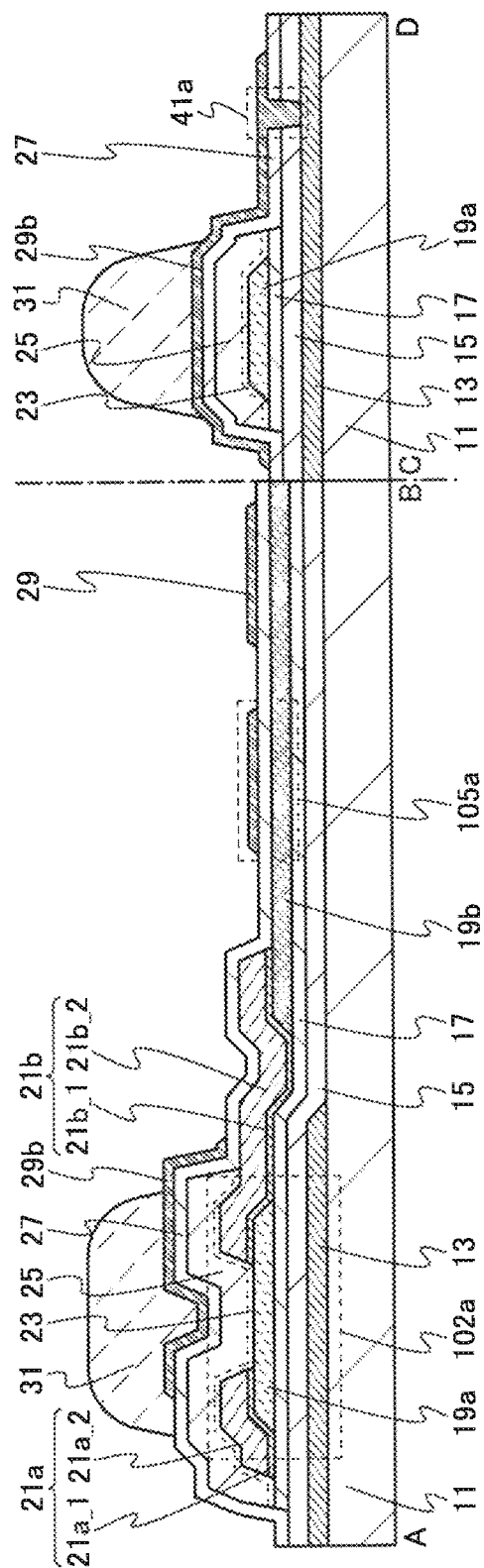
FIG. 32 is a cross-sectional view illustrating one embodiment of a display device.

A transistor 102a illustrated in FIG. 32 is a channel-etched transistor. Note that the transistor 102a in the channel length direction and the capacitor 105a are illustrated in a cross-sectional view in a portion A-B, and the transistor 102a in the channel width direction and a connection portion between the conductive film 13 functioning as a gate electrode and the conductive film 29b functioning as a gate electrode are illustrated in a cross-sectional view in a portion C-D.

The transistor 102a in FIG. 32 has a dual-gate structure and includes the conductive film 13 functioning as a gate electrode over the first substrate 11. In addition, the transistor 102a includes the nitride insulating film 15 formed over the first substrate 11 and the conductive film 13 functioning as a gate electrode, the oxide insulating film 17 formed over the nitride insulating film 15, the oxide semiconductor film 19a overlapping with the conductive film 13 functioning as a gate electrode with the nitride insulating film 15 and the oxide insulating film 17 provided therebetween, and the conductive films 21a and 21b functioning as a source electrode and a drain electrode which are in contact with the oxide semiconductor film 19a. Moreover, the oxide insulating film 23 is formed over the oxide insulating film 17, the oxide semiconductor film 19a, and the conductive films 21a and 21b functioning as a source electrode and a drain electrode, and the oxide insulating film 25 is formed over the oxide insulating film 23. The nitride insulating film 27 is formed over the nitride insulating film 15, the oxide insulating film 23, the oxide insulating film 25, and the conductive film 21b. The oxide semiconductor film 19b having conductivity is formed over the oxide insulating film 17. The oxide semiconductor film 19b having conductivity is connected to one of the conductive films 21a and 21b functioning as a source electrode and a drain electrode, here, connected to the conductive film 21b. The common electrode 29 and the conductive film 29b functioning as a gate electrode are formed over the nitride insulating film 27.

As illustrated in the cross-sectional view in a portion C-D, the conductive film 29b functioning as a gate electrode is connected to the conductive film 13 functioning as a gate electrode in the opening 41a provided in the nitride insulating film 15 and the nitride insulating film 27. That is, the conductive film 13 functioning as a gate electrode and the conductive film 29b functioning as a gate electrode have the same potential.

Thus, by applying voltage at the same potential to each gate electrode of the transistor 102a, variation in the initial characteristics can be reduced, and degradation of the transistor 102a after the—GBT stress test and a change in the rising voltage of on-state current at different drain voltages can be suppressed. In addition, a region where carriers flow in the oxide semiconductor film 19a becomes larger in the film thickness direction, so that the amount of carrier movement is increased. As a result, the on-state current of the transistor 102a is increased, and the field-effect mobility is increased. Typically, the field-effect mobility is greater than or equal to 20 cm$^2$/V·s.

Over the transistor 102a in this embodiment, the oxide insulating films 23 and 25 are formed. The oxide insulating films 23 and 25 overlap with the oxide semiconductor film 19a. In the cross-sectional view in the channel width direction, end portions of the oxide insulating films 23 and 25 are positioned on an outer side of an end portion of the oxide semiconductor film 19a. Furthermore, in the channel width direction in FIG. 32, the conductive film 29b functioning as a gate electrode is positioned at end portions of the oxide insulating films 23 and 25.

An end portion processed by etching or the like of the oxide semiconductor film is damaged by processing, to produce defects and also contaminated by the attachment of an impurity, or the like. Thus, the end portion of the oxide semiconductor film is easily activated by application of a stress such as an electric field, thereby easily becoming n-type (having a low resistance). Therefore, the end portion of the oxide semiconductor film 19a overlapping with the conductive film 13 functioning as a gate electrode easily becomes n-type. When the end portion which becomes n-type is provided between the conductive films 21a and 21b functioning as a source electrode and a drain electrode, the region which becomes n-type functions as a carrier path, resulting in a parasitic channel. However, as illustrated in the cross-sectional view in a portion C-D, when the conductive film 29b functioning as a gate electrode faces a side surface of the oxide semiconductor film 19a with the oxide insulating films 23 and 25 provided therebetween in the channel width direction, due to the electric field of the conductive film 29b functioning as a gate electrode, generation of a parasitic channel on the side surface of the oxide semiconductor film 19a or in a region including the side surface and the vicinity of the side surface is suppressed. As a result, a transistor which has excellent electrical characteristics such as a sharp increase in the drain current at the threshold voltage is obtained.

On an element substrate of the display device described in this embodiment, the oxide semiconductor film having conductivity functioning as the pixel electrode is formed at the same time as the oxide semiconductor film of the transistor. The oxide semiconductor film having conductivity also functions as one of electrodes of the capacitor. The common electrode also functions as the other of electrodes of the capacitor. Thus, a step of forming another conductive film is not needed to form the capacitor, and the number of steps of manufacturing the semiconductor device can be reduced. The capacitor has a light-transmitting property. As a result, the area occupied by the capacitor can be increased and the aperture ratio in a pixel can be increased.

Details of the transistor 102a are described below. Note that the components with the same reference numerals as those in Embodiment 4 are not described here.

The conductive film 29b functioning as a gate electrode can be formed using a material similar to that of the common electrode 29 in Embodiment 4.

Next, a method for manufacturing the transistor 102a and the capacitor 105a in FIG. 32 is described with reference to FIGS. 18A to 18D, FIGS. 19A to 19C, FIGS. 20A and 20B, and FIGS. 33A to 33C.

As in Embodiment 4, through the steps illustrated in FIGS. 18A to 20B, the conductive film 13 functioning as a gate electrode, the nitride insulating film 15, the oxide insulating film 16, the oxide semiconductor film 19a, the oxide semiconductor film 19b having conductivity, the conductive films 21a and 21b functioning as a source electrode and a drain electrode, the oxide insulating film 22, the oxide insulating film 24, and the nitride insulating film 26 are formed over the first substrate 11. In these steps, photolithography processes using the first photomask to the fourth photomask are performed.

Next, a mask is formed over the nitride insulating film 26 through a photolithography process using a fifth photomask, and then part of the nitride insulating film 26 is etched using the mask; thus, the nitride insulating film 27 having the opening 41a is formed as illustrated in FIG. 33A.

Next, as illustrated in FIG. 33B, the conductive film 28 to be the common electrode 29 and the conductive film 29b functioning as a gate electrode is formed over the conductive film 13 functioning as a gate electrode, and the nitride insulating film 27.

Then, a mask is formed over the conductive film 28 by a photolithography process using a sixth photomask. Next, as illustrated in FIG. 33C, part of the conductive film 28 is etched with the use of the mask to form the common electrode 29 and the conductive film 29b functioning as a gate electrode. After that, the mask is removed.

Through the above process, the transistor 102a is manufactured and the capacitor 105a can also be manufactured.

In the transistor described in this embodiment, when the conductive film 29b functioning as a gate electrode faces a side surface of the oxide semiconductor film 19a with the oxide insulating films 23 and 25 provided therebetween in the channel width direction, due to the electric field of the conductive film 29b functioning as a gate electrode, generation of a parasitic channel on the side surface of the oxide semiconductor film 19a or in a region including the side surface and the vicinity of the side surface is suppressed. As a result, a transistor which has excellent electrical characteristics such as a sharp increase in the drain current at the threshold voltage is obtained.

The element substrate of the display device of this embodiment is provided with a common electrode including a stripe region extending in a direction intersecting with a signal line. Therefore, the display device can have excellent contrast.

On an element substrate of the display device described in this embodiment, the oxide semiconductor film having conductivity functioning as the pixel electrode is formed at the same time as the oxide semiconductor film of the transistor. The oxide semiconductor film having conductivity functions as the one of electrodes of the capacitor. The common electrode also functions as the other of electrodes of the capacitor. Thus, a step of forming another conductive film is not needed to form the capacitor, and the number of steps of manufacturing the display device can be reduced. The capacitor has a light-transmitting property. As a result, the area occupied by the capacitor can be increased and the aperture ratio in a pixel can be increased.

The structures, methods, and the like described in this embodiment can be used as appropriate in combination with any of the structures, methods, and the like described in the other embodiments.

Embodiment 7

In this embodiment, a display device including a transistor in which the number of defects in an oxide semiconductor film can be further reduced as compared with the above embodiments is described with reference to drawings. The transistor described in this embodiment is different from any of the transistors in Embodiments 4 to 6 in that a multilayer film including a plurality of oxide semiconductor films is provided. Here, details are described using the transistor in Embodiment 4.

FIGS. 34A and 34B each show a cross-sectional view of an element substrate included in a display device. FIGS. 34A and 34B are cross-sectional views taken along dashed-dotted lines A-B and C-D in FIG. 16.

A transistor 102b in FIG. 34A includes a multilayer film 37a overlapping with the conductive film 13 functioning as a gate electrode with the nitride insulating film 15 and the oxide insulating film 17 provided therebetween, and the conductive films 21a and 21b functioning as a source electrode and a drain electrode in contact with the multilayer film 37a. The oxide insulating film 23, the oxide insulating film 25, and the nitride insulating film 27 are formed over the nitride insulating film 15, the oxide insulating film 17, the multilayer film 37a, and the conductive films 21a and 21b functioning as a source electrode and a drain electrode.

The capacitor 105b in FIG. 34A includes a multilayer film 37b formed over the oxide insulating film 17, the nitride insulating film 27 in contact with the multilayer film 37b, and the common electrode 29 in contact with the nitride insulating film 27. The multilayer film 37b functions as a pixel electrode.

In the transistor 102b described in this embodiment, the multilayer film 37a includes the oxide semiconductor film 19a and an oxide semiconductor film 39a. That is, the multilayer film 37a has a two-layer structure. In addition, part of the oxide semiconductor film 19a functions as a channel region. Moreover, the oxide insulating film 23 is formed in contact with the multilayer film 37a, and the oxide insulating film 25 is formed in contact with the oxide insulating film 23. That is, the oxide semiconductor film 39a is provided between the oxide semiconductor film 19a and the oxide insulating film 23.

The oxide semiconductor film 39a is an oxide film containing one or more elements that constitute the oxide semiconductor film 19a. Thus, interface scattering is unlikely to occur at the interface between the oxide semiconductor films 19a and 39a. Thus, the transistor can have high field-effect mobility because the movement of carriers is not hindered at the interface.

The oxide semiconductor film 39a is typically an In—Ga oxide film, an In—Zn oxide film, or an In-M-Zn oxide film (M represents Al, Ga, Y, Zr, Sn, La, Ce, or Nd). The energy at the conduction band bottom of the oxide semiconductor film 39a is closer to a vacuum level than that of the oxide semiconductor film 19a is, and typically, the difference between the energy at the conduction band bottom of the oxide semiconductor film 39a and the energy at the conduction band bottom of the oxide semiconductor film 19a is any one of 0.05 eV or more, 0.07 eV or more, 0.1 eV or more, or 0.15 eV or more, and any one of 2 eV or less, 1 eV or less, 0.5 eV or less, or 0.4 eV or less. That is, the difference between the electron affinity of the oxide semiconductor film 39a and the electron affinity of the oxide semiconductor film 19a is any one of 0.05 eV or more, 0.07 eV or more, 0.1 eV or more, or 0.15 eV or more, and any one of 2 eV or less, 1 eV or less, 0.5 eV or less, or 0.4 eV or less.

The oxide semiconductor film 39a preferably contains In because carrier mobility (electron mobility) can be increased.

When the oxide semiconductor film 39a contains a larger amount of Al, Ga, Y, Zr, Sn, La, Ce, or Nd in an atomic ratio than the amount of In in an atomic ratio, any of the following effects may be obtained: (1) the energy gap of the oxide semiconductor film 39a is widened; (2) the electron affinity of the oxide semiconductor films film 39a is reduced; (3) scattering of impurities from the outside is reduced; (4) an insulating property increases as compared to the oxide semiconductor film 19a; and (5) oxygen vacancies are less likely to be generated because Al, Ga, Y, Zr, Sn, La, Ce, or Nd is a metal element strongly bonded to oxygen.

In the case where the oxide semiconductor film 39a is an In-M-Zn oxide film, the proportions of In and M when the summation of In and M is assumed to be 100 atomic % are preferably as follows: the atomic percentage of In is less than 50 atomic % and the atomic percentage of M is greater than 50 atomic %; further preferably, the atomic percentage of In is less than 25 atomic % and the atomic percentage of M is greater than 75 atomic %.

Furthermore, in the case where each of the oxide semiconductor films 19a and 39a is an In-M-Zn oxide film (M represents Al, Ga, Y, Zr, Sn, La, Ce, or Nd), the proportion of M atoms (M represents Al, Ga, Y, Zr, Sn, La, Ce, or Nd) in the oxide semiconductor film 39a is higher than that in the oxide semiconductor film 19a. As a typical example, the proportion of Min the oxide semiconductor film 39a is 1.5 times or more, preferably twice or more, further preferably three times or more as high as that in the oxide semiconductor film 19a.

Furthermore, in the case where each of the oxide semiconductor film 19a and the oxide semiconductor film 39a is an In-M-Zn oxide film (M represents Al, Ga, Y, Zr, Sn, La, Ce, or Nd), when In:M:Zn=$x_1$:$y_1$:$z_1$ [atomic ratio] is satisfied in the oxide semiconductor film 39a and In:M:Zn=$x_2$:$y_2$:$z_2$ [atomic ratio] is satisfied in the oxide semiconductor film 19a, $y_1/x_1$ is higher than $y_2/x_2$. Preferably, $y_1/x_1$ is 1.5 times or more as high as $y_2/x_2$. Further preferably, $y_1/x_1$ is twice or more as high as $y_2/x_2$. Still further preferably, $y_1/x_1$ is three times or more as high as $y_2/x_2$.

In the case where the oxide semiconductor film 19a is an In-M-Zn oxide film (M is Al, Ga, Y, Zr, Sn, La, Ce, or Nd) and a target having the atomic ratio of metal elements of In:M:Zn=$x_1$:$y_1$:$z_1$ is used for forming the oxide semiconductor film 19a, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a CAAC-OS film to be described later as the oxide semiconductor film 19a is easily formed. Typical examples of the atomic ratio of the metal elements of the target are In:M:Zn=1:1:1, In:M:Zn=1:1:1.2, and In:M:Zn=3:1:2.

In the case where the oxide semiconductor film 39a is an In-M-Zn oxide film (M is Al, Ga, Y, Sn, La, Ce, or Nd) and a target having the atomic ratio of metal elements of In:M:Zn=$x_2$:$y_2$:$z_2$ is used for forming the oxide semiconductor film 39a, $x_2/y_2$ is preferably less than $x_1/y_1$, and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, a CAAC-OS film to be described later as the oxide semiconductor film 39a is easily formed. Typical examples of the atomic ratio of the metal elements of the target are In:M:Zn=1:3:2, In:M:Zn=1:3:4, In:M:Zn=1:3:6, In:M:Zn=1:3:8, In:M:Zn=1:4:4, In:M:Zn=1:4:5, In:M:Zn=1:4:6, In:M:Zn=1:4:7, In:M:Zn=1:4:8, In:M:Zn=1:5:5, In:M:Zn=1:5:6, In:M:Zn=1:5:7, In:M:Zn=1:5:8, and In:M:Zn=1:6:8.

Note that the proportion of each metal element in the atomic ratio of each of the oxide semiconductor films 19a and the oxide semiconductor film 39a varies within a range of ±40% of that in the above atomic ratio as an error.

The oxide semiconductor film 39a also functions as a film that relieves damage to the oxide semiconductor film 19a at the time of forming the oxide insulating film 25 later.

The thickness of the oxide semiconductor film 39a is greater than or equal to 3 nm and less than or equal to 100 nm, preferably greater than or equal to 3 nm and less than or equal to 50 nm.

Furthermore, the oxide semiconductor film 39a can have a crystal structure of the oxide semiconductor film 19a as appropriate.

Note that the oxide semiconductor films 19a and 39a may each be a mixed film including two or more of the following: a region having an amorphous structure, a region having a microcrystalline structure, a region having a polycrystalline structure, a CAAC-OS region, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure in some cases. Furthermore, in some cases, the mixed film has a stacked-layer structure in which two or more of the following regions are stacked: a region having an amorphous structure, a region having a microcrystalline structure, a region having a polycrystalline structure, a CAAC-OS region, and a region having a single-crystal structure.

Here, the oxide semiconductor film 39a is formed between the oxide semiconductor film 19a and the oxide insulating film 23. Thus, if carrier traps are formed between the oxide semiconductor film 39a and the oxide insulating film 23 by impurities and defects, electrons flowing in the oxide semiconductor film 19a are less likely to be captured by the carrier traps because there is a distance between the carrier traps and the oxide semiconductor film 19a. Accordingly, the amount of on-state current of the transistor can be increased, and the field-effect mobility can be increased. When the electrons are captured by the carrier traps, the electrons become negative fixed charges. As a result, a threshold voltage of the transistor changes. However, by the distance between the oxide semiconductor film 19a and the carrier traps, capture of electrons by the carrier traps can be reduced, and accordingly, the amount of change in the threshold voltage can be reduced.

Impurities from the outside can be blocked by the oxide semiconductor film 39a, and accordingly, the amount of impurities that are transferred from the outside to the oxide semiconductor film 19a can be reduced. Furthermore, an oxygen vacancy is less likely to be formed in the oxide semiconductor film 39a. Consequently, the impurity concentration and the number of oxygen vacancies in the oxide semiconductor film 19a can be reduced.

Note that the oxide semiconductor films 19a and 39a are not only formed by simply stacking each film, but also are formed to have a continuous junction (here, in particular, a structure in which the energy of the bottom of the conduction band is changed continuously between each film). In other words, a stacked-layer structure in which there exist no impurity that forms a defect level such as a trap center or a recombination center at the interface between the films is provided. If an impurity exists between the oxide semiconductor films 19a and 39a which are stacked, a continuity of the energy band is damaged, and the carrier is captured or recombined at the interface and then disappears.

In order to form such a continuous energy band, it is necessary to form films continuously without being exposed to air, with use of a multi-chamber deposition apparatus (sputtering apparatus) including a load lock chamber. Each chamber in the sputtering apparatus is preferably evacuated to be a high vacuum state (to the degree of about $5\times10^{-7}$ Pa to $1\times10^{-4}$ Pa) with an adsorption vacuum evacuation pump such as a cryopump in order to remove water or the like, which serves as an impurity against the oxide semiconductor film, as much as possible. Alternatively, a turbo molecular pump and a cold trap are preferably combined so as to prevent a backflow of a gas, especially a gas containing carbon or hydrogen from an exhaust system to the inside of the chamber.

As in a transistor 102c in FIG. 34B, a multilayer film 38a may be provided instead of the multilayer film 37a.

In addition, as in a capacitor 105c in FIG. 34B, a multilayer film 38b may be provided instead of the multilayer film 37b.

The multilayer film 38a includes an oxide semiconductor film 49a, the oxide semiconductor film 19a, and the oxide semiconductor film 39a. That is, the multilayer film 38a has a three-layer structure. Furthermore, the oxide semiconductor film 19a functions as a channel region.

The oxide semiconductor film 49a can be formed using a material and a formation method similar to those of the oxide semiconductor film 39a.

The multilayer film 38b includes an oxide semiconductor film 49b having conductivity, an oxide semiconductor film 19f having conductivity, and an oxide semiconductor film 39b having conductivity. In other words, the multilayer film 38b has a three-layer structure. The multilayer film 38b functions as a pixel electrode.

The oxide semiconductor film 49b can be formed using a material and a formation method similar to those of the oxide semiconductor film 39b as appropriate.

In addition, the oxide insulating film 17 and the oxide semiconductor film 49a are in contact with each other. That is, the oxide semiconductor film 49a is provided between the oxide insulating film 17 and the oxide semiconductor film 19a.

The multilayer film 38a and the oxide insulating film 23 are in contact with each other. In addition, the oxide semiconductor film 39a and the oxide insulating film 23 are in contact with each other. That is, the oxide semiconductor film 39a is provided between the oxide semiconductor film 19a and the oxide insulating film 23.

It is preferable that the thickness of the oxide semiconductor film 49a be smaller than that of the oxide semiconductor film 19a. When the thickness of the oxide semiconductor film 49a is greater than or equal to 1 nm and less than or equal to 5 nm, preferably greater than or equal to 1 nm and less than or equal to 3 nm, the amount of change in the threshold voltage of the transistor can be reduced.

In the transistor described in this embodiment, the oxide semiconductor film 39a is provided between the oxide semiconductor film 19a and the oxide insulating film 23. Thus, if carrier traps are formed between the oxide semiconductor film 39a and the oxide insulating film 23 by impurities and defects, electrons flowing in the oxide semiconductor film 19a are less likely to be captured by the carrier traps because there is a distance between the carrier traps and the oxide semiconductor film 19a. Accordingly, the amount of on-state current of the transistor can be increased, and the field-effect mobility can be increased. When the electrons are captured by the carrier traps, the electrons become negative fixed charges. As a result, a threshold voltage of the transistor changes. However, by the distance between the oxide semiconductor film 19a and the carrier traps, capture of electrons by the carrier traps can be reduced, and accordingly, the amount of change in the threshold voltage can be reduced.

Impurities from the outside can be blocked by the oxide semiconductor film 39a, and accordingly, the amount of impurities that are transferred from the outside to the oxide semiconductor film 19a can be reduced. Furthermore, an oxygen vacancy is less likely to be formed in the oxide semiconductor film 39a. Consequently, the impurity concentration and the number of oxygen vacancies in the oxide semiconductor film 19a can be reduced.

Furthermore, the oxide semiconductor film 49a is provided between the oxide insulating film 17 and the oxide semiconductor film 19a, and the oxide semiconductor film 39a is provided between the oxide semiconductor film 19a and the oxide insulating film 23. Thus, it is possible to reduce the concentration of silicon or carbon in the vicinity of the interface between the oxide semiconductor film 49a and the oxide semiconductor film 19a, the concentration of silicon or carbon in the oxide semiconductor film 19a, or the concentration of silicon or carbon in the vicinity of the interface between the oxide semiconductor film 39a and the oxide semiconductor film 19a. Consequently, in the multilayer film 38a, the absorption coefficient derived from a constant photocurrent method is lower than $1\times10^{-3}$/cm, preferably lower than $1\times10^{-4}$/cm, and thus density of localized levels is extremely low.

The transistor 102c having such a structure includes very few defects in the multilayer film 38a including the oxide semiconductor film 19a; thus, the electrical characteristics of the transistor can be improved, and typically, the on-state current can be increased and the field-effect mobility can be improved. Moreover, in a BT stress test and a BT photostress test which are examples of a stress test, the amount of change in threshold voltage is small, and thus, reliability is high.

The structures, methods, and the like described in this embodiment can be used as appropriate in combination with any of the structures, methods, and the like described in the other embodiments.

Embodiment 8

In this embodiment, a light-emitting device provided with part of the element layer that is formed over the first substrate 11 in Embodiments 4 to 7 is described with reference to FIGS. 35 and 36. Note that here, part of the element layer described in Embodiments 4 and 5 is used;

however, an element layer having another structure can be used in the light-emitting device as appropriate.

Figure 35:
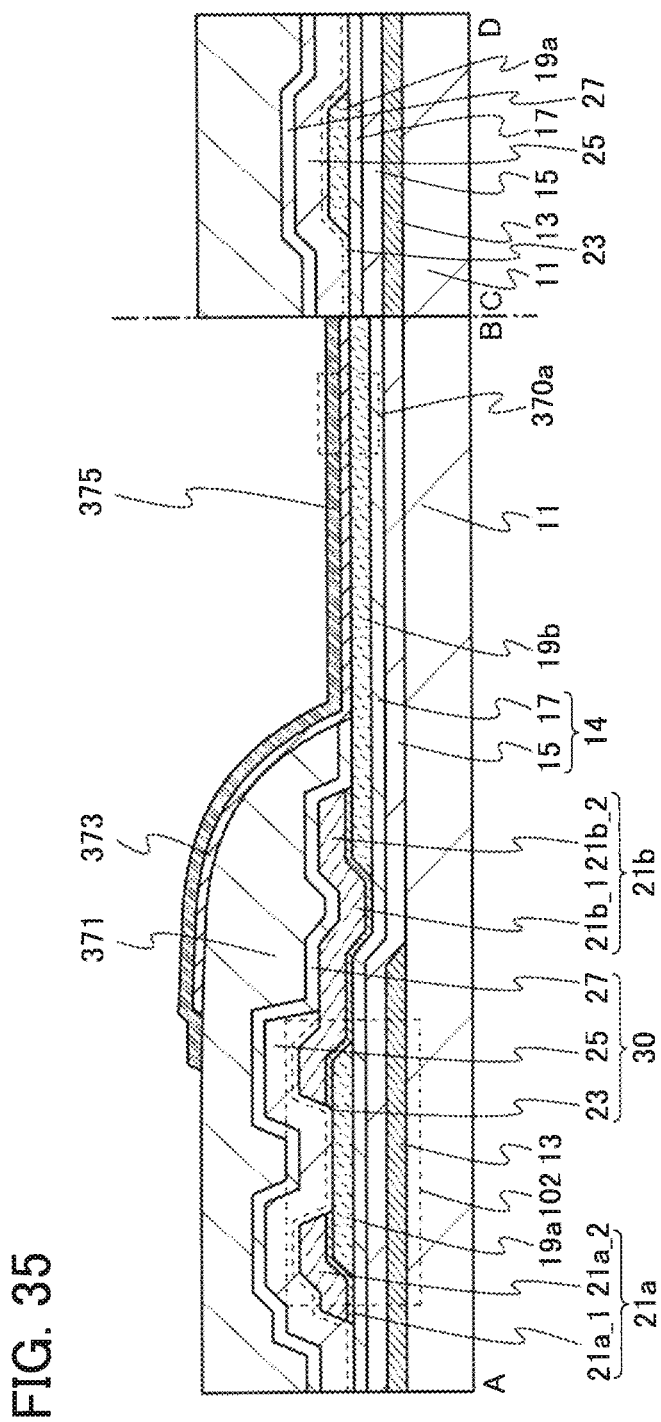
FIG. 35 is a cross-sectional view illustrating one embodiment of a display device.

A light-emitting device in FIG. 35 includes, in addition to the element layer formed over the first substrate 11 in FIG. 17 of Embodiment 4, an insulating film 371 provided over the inorganic insulating film 30, an EL layer 373 provided over the inorganic insulating film 30 and the oxide semiconductor film 19b having conductivity, and a conductive film 375 provided over the EL layer 373 and the insulating film 371. The oxide semiconductor film 19b having conductivity, the EL layer 373, and the conductive film 375 constitute a light-emitting element 370a.

Figure 36:
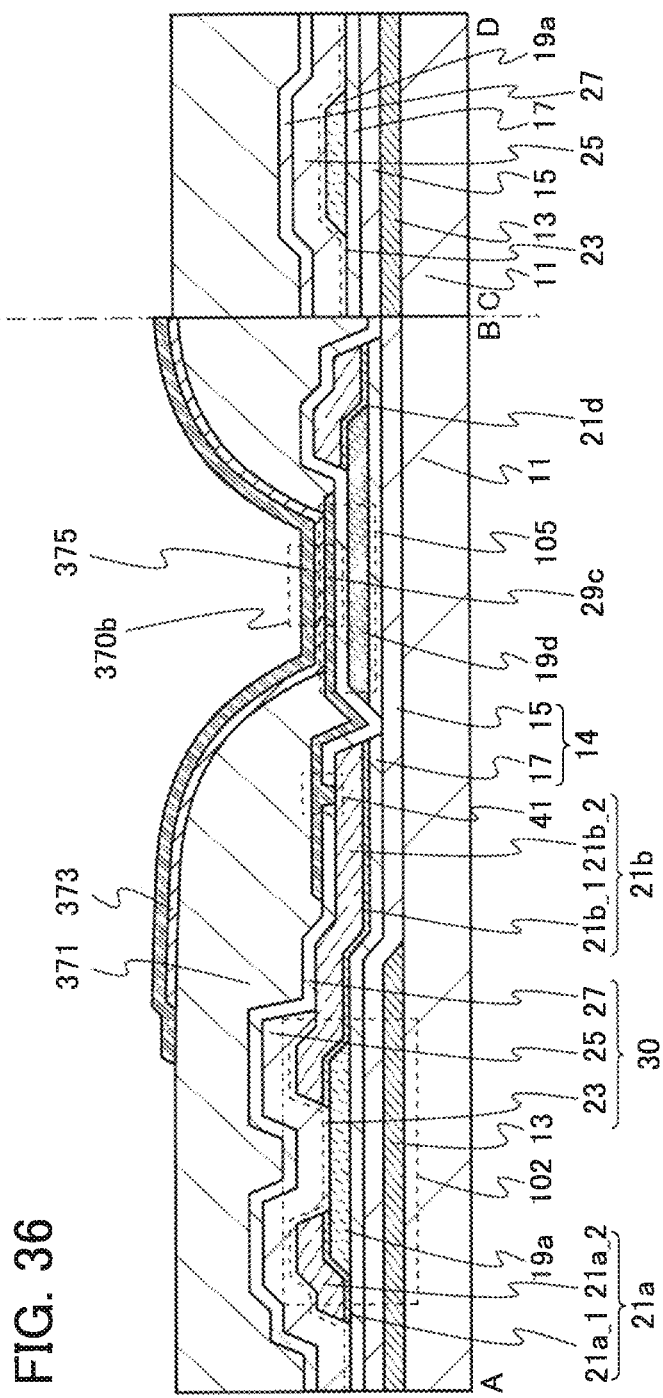
FIG. 36 is a cross-sectional view illustrating one embodiment of a display device.

A light-emitting device in FIG. 36 includes, in addition to the element layer formed over the first substrate 11 in FIG. 28 of Embodiment 5, the insulating film 371 provided over the inorganic insulating film 30 and the light-transmitting conductive film 29c, the EL layer 373 provided over the inorganic insulating film 30 and the light-transmitting conductive film 29c, and the conductive film 375 provided over the EL layer 373 and the insulating film 371. The light-transmitting conductive film 29c, the EL layer 373, and the conductive film 375 constitute a light-emitting element 370b.

On the element substrate of the light-emitting device in this embodiment, the oxide semiconductor film having conductivity serving as the pixel electrode is formed at the same time as the oxide semiconductor film of the transistor. Thus, the light-emitting device can be manufactured through fewer steps than the conventional case.

Alternatively, on the element substrate of the light-emitting device in this embodiment, the oxide semiconductor film having conductivity serving as the electrode of the capacitor is formed at the same time as the oxide semiconductor film of the transistor. The oxide semiconductor film having conductivity serves as one electrode of the capacitor. Thus, a step of forming another conductive film is not needed to form the capacitor, and the number of steps of manufacturing the light-emitting device can be reduced. Furthermore, the other electrode of the capacitor is formed using a light-transmitting conductive film serving as an electrode. Thus, the capacitor has light-transmitting properties. As a result, the area occupied by the capacitor can be increased and the aperture ratio in a pixel can be increased.

The structures, methods, and the like described in this embodiment can be used as appropriate in combination with any of the structures, methods, and the like described in the other embodiments.

Embodiment 9

In this embodiment, one embodiment that can be applied to an oxide semiconductor film in the transistor included in the display device described in the above embodiment is described.

<Structure of Oxide Semiconductor>

A structure of an oxide semiconductor is described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and a microcrystalline oxide semiconductor.

<CAAC-OS>

First, a CAAC-OS is described. Note that a CAAC-OS can be referred to as an oxide semiconductor including c-axis aligned nanocrystals (CANC).

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 37A:
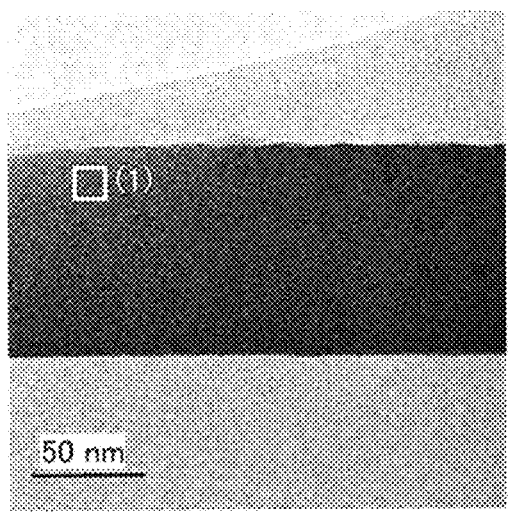
FIGS. 37A to 37D are Cs-corrected high-resolution TEM images of a cross section of a CAAC-OS and a cross-sectional schematic view of a CAAC-OS.

A CAAC-OS observed with TEM is described below. FIG. 37A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 37B:
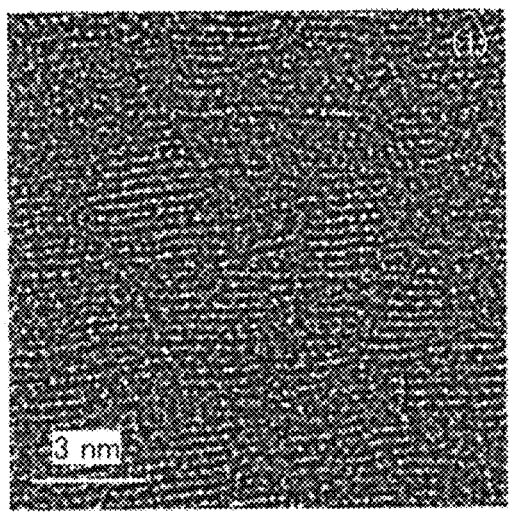

FIG. 37B is an enlarged Cs-corrected high-resolution TEM image of a region (1) in FIG. 37A. FIG. 37B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 37C:
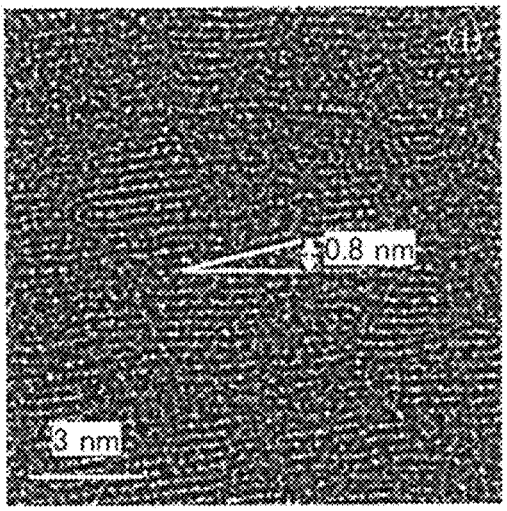

As shown in FIG. 37B, the CAAC-OS has a characteristic atomic arrangement. The characteristic atomic arrangement is denoted by an auxiliary line in FIG. 37C. FIGS. 37B and 37C prove that the size of a pellet is approximately 1 nm to 3 nm, and the size of a space caused by tilt of the pellets is approximately 0.8 nm. Therefore, the pellet can also be referred to as a nanocrystal (nc).

Figure 37D:
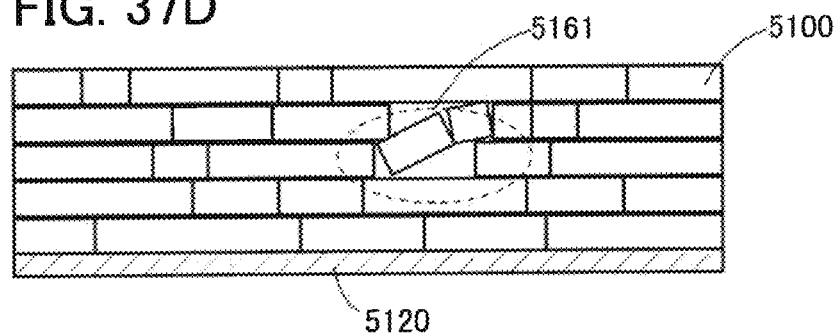

Here, according to the Cs-corrected high-resolution TEM images, the schematic arrangement of pellets 5100 of a CAAC-OS over a substrate 5120 is illustrated by such a structure in which bricks or blocks are stacked (see FIG. 37D). The part in which the pellets are tilted as observed in FIG. 37C corresponds to a region 5161 shown in FIG. 37D.

FIG. 38A shows a Cs-corrected high-resolution TEM image of a plane of the CAAC-OS observed from a direction substantially perpendicular to the sample surface. FIGS. 38B, 38C, and 38D are enlarged Cs-corrected high-resolution TEM images of regions (1), (2), and (3) in FIG. 38A, respectively. FIGS. 38B, 38C, and 38D indicate that metal atoms are arranged in a triangular, quadrangular, or hexagonal configuration in a pellet. However, there is no regularity of arrangement of metal atoms between different pellets.

Figure 39A:
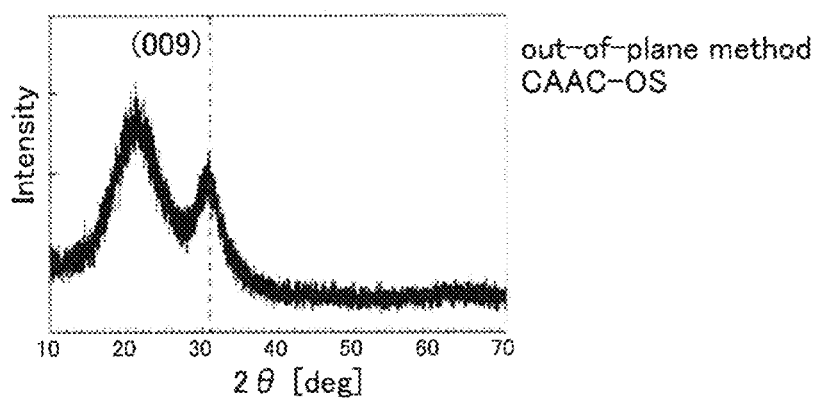
FIGS. 39A to 39C show structural analysis of a CAAC-OS and a single crystal oxide semiconductor by XRD.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle ($2\theta$) of around 31° as shown in FIG. 39A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 39B:
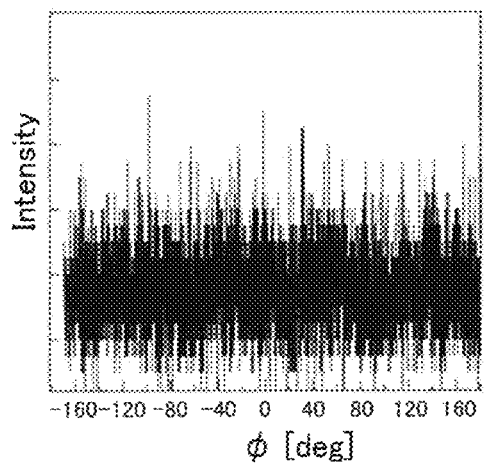
Figure 39C:
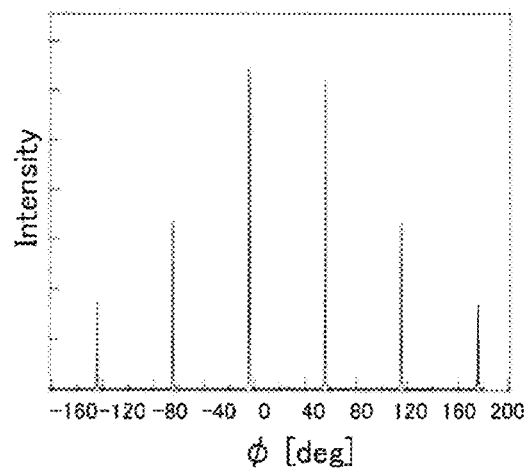

On the other hand, in structural analysis of the CAAC-OS by an in-plane method in which an X-ray is incident on a sample in a direction substantially perpendicular to the c-axis, a peak appears when 2θ is around 56°. This peak is attributed to the (110) plane of the InGaZnO$_4$ crystal. In the case of the CAAC-OS, when analysis (φ scan) is performed with 2θ fixed at around 56° and with the sample rotated using a normal vector of the sample surface as an axis (φ axis), as shown in FIG. 39B, a peak is not clearly observed. In contrast, in the case of a single crystal oxide semiconductor of InGaZnO$_4$, when φ scan is performed with 2θ fixed at around 56°, as shown in FIG. 39C, six peaks which are derived from crystal planes equivalent to the (110) plane are observed. Accordingly, the structural analysis using XRD shows that the directions of a-axes and b-axes are different in the CAAC-OS.

Next, a CAAC-OS analyzed by electron diffraction is described. For example, when an electron beam with a probe diameter of 300 nm is incident on a CAAC-OS including an InGaZnO$_4$ crystal in a direction parallel to the sample surface, a diffraction pattern (also referred to as a selected-area transmission electron diffraction pattern) shown in FIG. 40A might be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 40B shows a diffraction pattern obtained in such a manner that an electron beam with a probe diameter of 300 nm is incident on the same sample in a direction perpendicular to the sample surface. As shown in FIG. 40B, a ring-like diffraction pattern is observed. Thus, the electron diffraction also indicates that the a-axes and b-axes of the pellets included in the CAAC-OS do not have regular alignment. The first ring in FIG. 40B is considered to be derived from the (010) plane, the (100) plane, and the like of the InGaZnO$_4$ crystal. The second ring in FIG. 40B is considered to be derived from the (110) plane and the like.

Moreover, the CAAC-OS is an oxide semiconductor having a low density of defect states. Defects in the oxide semiconductor are, for example, a defect due to impurity and oxygen vacancies. Therefore, the CAAC-OS can be regarded as an oxide semiconductor with a low impurity concentration, or an oxide semiconductor having a small number of oxygen vacancies.

The impurity contained in the oxide semiconductor might serve as a carrier trap or serve as a carrier generation source. Furthermore, oxygen vacancies in the oxide semiconductor serve as carrier traps or serve as carrier generation sources when hydrogen is captured therein.

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

An oxide semiconductor having a low density of defect states (a small number of oxygen vacancies) can have a low carrier density. Such an oxide semiconductor is referred to as a highly purified intrinsic or substantially highly purified intrinsic oxide semiconductor. A CAAC-OS has a low impurity concentration and a low density of defect states. That is, a CAAC-OS is likely to be highly purified intrinsic or substantially highly purified intrinsic oxide semiconductor. Thus, a transistor including a CAAC-OS rarely has negative threshold voltage (is rarely normally on). The highly purified intrinsic or substantially highly purified intrinsic oxide semiconductor has few carrier traps. An electric charge trapped by the carrier traps in the oxide semiconductor takes a long time to be released. The trapped electric charge may behave like a fixed electric charge. Thus, the transistor which includes the oxide semiconductor having a high impurity concentration and a high density of defect states might have unstable electrical characteristics. However, a transistor including a CAAC-OS has small variation in electrical characteristics and high reliability.

Since the CAAC-OS has a low density of defect states, carriers generated by light irradiation or the like are less likely to be trapped in defect states. Therefore, in a transistor using the CAAC-OS, change in electrical characteristics due to irradiation with visible light or ultraviolet light is small.

<Microcrystalline Oxide Semiconductor>

Next, a microcrystalline oxide semiconductor is described.

A microcrystalline oxide semiconductor has a region in which a crystal part is observed and a region in which a crystal part is not clearly observed in a high-resolution TEM image. In most cases, the size of a crystal part included in the microcrystalline oxide semiconductor is greater than or equal to 1 nm and less than or equal to 100 nm, or greater than or equal to 1 nm and less than or equal to 10 nm. An oxide semiconductor including a nanocrystal (nc) that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS). In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an amorphous oxide semiconductor. Note that there is no regularity of crystal orientation between different pellets in the nc-OS. Therefore, the nc-OS has a higher density of defect states than the CAAC-OS.

<Amorphous Oxide Semiconductor>

Next, an amorphous oxide semiconductor is described.

The amorphous oxide semiconductor is an oxide semiconductor having disordered atomic arrangement and no crystal part and exemplified by an oxide semiconductor which exists in an amorphous state as quartz.

In a high-resolution TEM image of the amorphous oxide semiconductor, crystal parts cannot be found.

When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and only a halo pattern appears when the amorphous oxide semiconductor is subjected to nanobeam electron diffraction.

There are various understandings of an amorphous structure. For example, a structure whose atomic arrangement does not have ordering at all is called a completely amorphous structure. Meanwhile, a structure which has ordering until the nearest neighbor atomic distance or the second-nearest neighbor atomic distance but does not have long-range ordering is also called an amorphous structure. Therefore, the strictest definition does not permit an oxide semiconductor to be called an amorphous oxide semiconductor as long as even a negligible degree of ordering is present in an atomic arrangement. At least an oxide semiconductor having long-term ordering cannot be called an amorphous oxide semiconductor. Accordingly, because of the presence of crystal part, for example, a CAAC-OS and an nc-OS cannot be called an amorphous oxide semiconductor or a completely amorphous oxide semiconductor.

<Amorphous-Like Oxide Semiconductor>

Note that an oxide semiconductor may have a structure intermediate between the nc-OS and the amorphous oxide semiconductor. The oxide semiconductor having such a structure is specifically referred to as an amorphous-like oxide semiconductor (a-like OS).

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS (sample A), an nc-OS (sample B), and a CAAC-OS (sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 41:
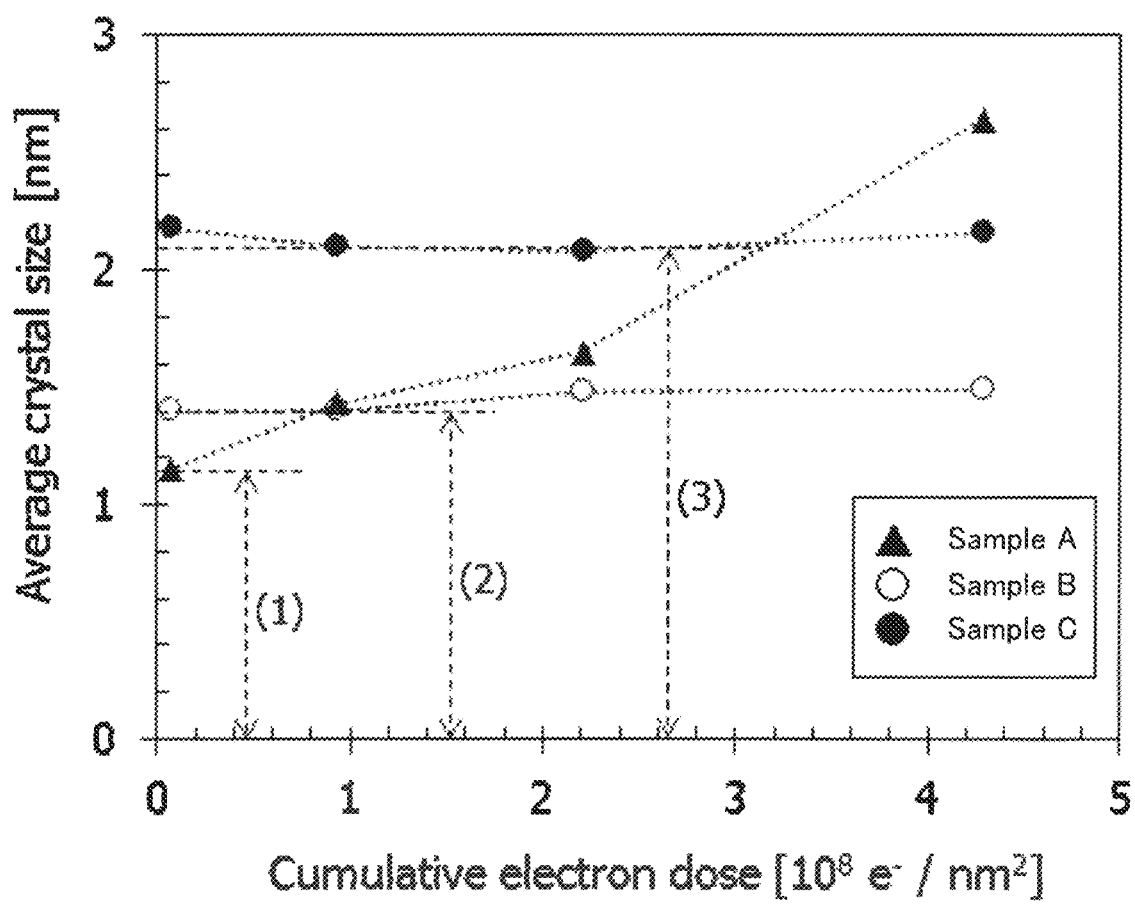
FIG. 41 shows a change of crystal parts of an In—Ga—Zn oxide owing to electron irradiation.

FIG. 41 shows change in the average size of crystal parts (at 22 points to 45 points) in each sample. Note that the crystal part size corresponds to the length of a lattice fringe. FIG. 41 indicates that the crystal part size in the a-like OS increases with an increase in the cumulative electron dose. Specifically, as shown by (1) in FIG. 41, a crystal part of approximately 1.2 nm (also referred to as an initial nucleus) at the start of TEM observation grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. Specifically, as shown by (2) and (3) in FIG. 41, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:

Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, a microcrystalline oxide semiconductor, and a CAAC-OS, for example.

<Deposition Model>

Examples of deposition models of a CAAC-OS and an nc-OS are described below.

Figure 42A:
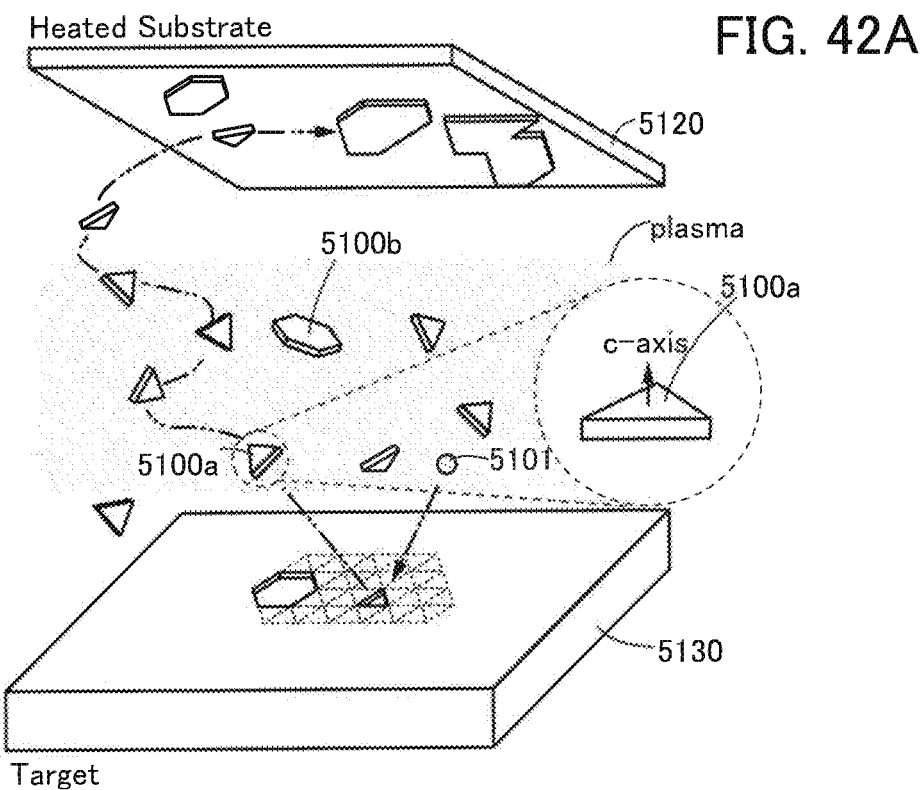
FIGS. 42A and 42B are schematic views showing deposition models of a CAAC-OS and an nc-OS.

FIG. 42A is a schematic view of the inside of a deposition chamber where a CAAC-OS is deposited by a sputtering method.

A target 5130 is attached to a backing plate. A plurality of magnets is provided to face the target 5130 with the backing plate positioned therebetween. The plurality of magnets generates a magnetic field. A sputtering method in which the disposition rate is increased by utilizing a magnetic field of magnets is referred to as a magnetron sputtering method.

The substrate 5120 is placed to face the target 5130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5130, and plasma is observed. The magnetic field forms a high-density plasma region in the vicinity of the target 5130. In the high-density plasma region, the deposition gas is ionized, so that an ion 5101 is generated. Examples of the ion 5101 include an oxygen cation (O$^+$) and an argon cation (Ar$^+$).

Figure 43A:
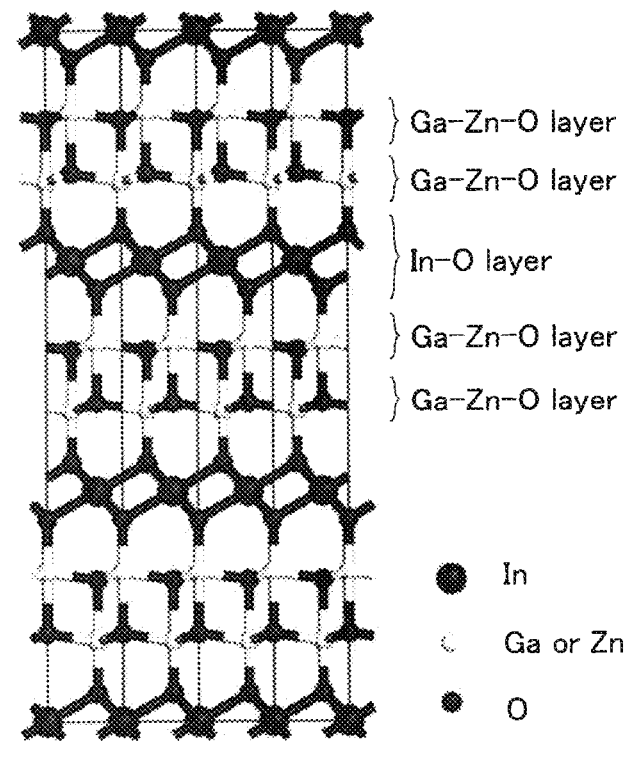
FIGS. 43A to 43C show an InGaZnO$_4$ crystal and a pellet.

Here, the target 5130 has a polycrystalline structure which includes a plurality of crystal grains and in which a cleavage plane exists in at least one crystal grain. FIG. 43A shows a structure of an InGaZnO$_4$ crystal included in the target 5130 as an example. Note that FIG. 43A shows a structure of the case where the InGaZnO$_4$ crystal is observed from a direction parallel to the b-axis. FIG. 43A indicates that oxygen atoms in a Ga—Zn—O layer are positioned close to those in an adjacent Ga—Zn—O layer. The oxygen atoms have negative charge, whereby repulsive force is generated between the two adjacent Ga—Zn—O layers. As a result, the InGaZnO$_4$ crystal has a cleavage plane between the two adjacent Ga—Zn—O layers.

The ion 5101 generated in the high-density plasma region is accelerated toward the target 5130 side by an electric field, and then collides with the target 5130. At this time, a pellet 5100a and a pellet 5100b which are flat-plate-like (pellet-like) sputtered particles are separated and sputtered from the cleavage plane. Note that structures of the pellet 5100a and the pellet 5100b may be distorted by an impact of collision of the ion 5101.

The pellet 5100a is a flat-plate-like (pellet-like) sputtered particle having a triangle plane, e.g., regular triangle plane. The pellet 5100b is a flat-plate-like (pellet-like) sputtered particle having a hexagon plane, e.g., regular hexagon plane. Note that flat-plate-like (pellet-like) sputtered particles such as the pellet 5100a and the pellet 5100b are collectively called pellets 5100. The shape of a flat plane of the pellet 5100 is not limited to a triangle or a hexagon. For example, the flat plane may have a shape formed by combining two or more triangles. For example, a quadrangle (e.g., rhombus) may be formed by combining two triangles (e.g., regular triangles).

Figure 43B:
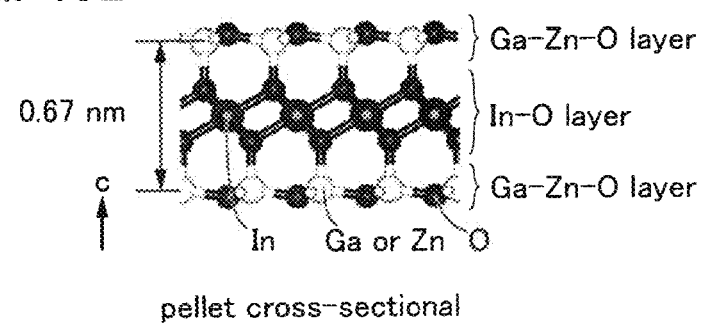
Figure 43C:
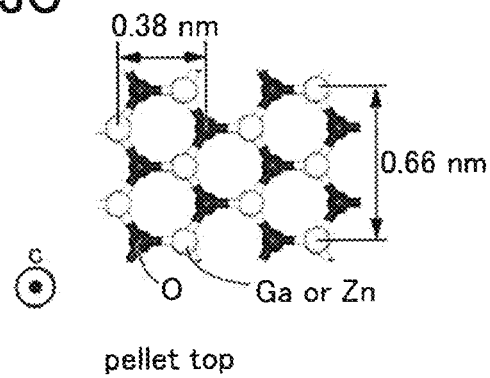

The thickness of the pellet 5100 is determined depending on the kind of deposition gas and the like. The thicknesses of the pellets 5100 are preferably uniform; the reason for this is described later. In addition, the sputtered particle preferably has a pellet shape with a small thickness as compared to a dice shape with a large thickness. For example, the thickness of the pellet 5100 is greater than or equal to 0.4 nm and less than or equal to 1 nm, preferably greater than or equal to 0.6 nm and less than or equal to 0.8 nm. In addition, for example, the width of the pellet 5100 is greater than or equal to 1 nm and less than or equal to 3 nm, preferably greater than or equal to 1.2 nm and less than or equal to 2.5 nm. The pellet 5100 corresponds to the initial nucleus in the description of (1) in FIG. 41. For example, when the ion 5101 collides with the target 5130 including an In—Ga—Zn oxide, the pellet 5100 that includes three layers of a Ga—Zn—O layer, an In—O layer, and a Ga—Zn—O layer as shown in FIG. 43B is separated. Note that FIG. 43C shows the structure of the separated pellet 5100 which is observed from a direction parallel to the c-axis. The pellet 5100 has a nanometer-sized sandwich structure including two Ga—Zn—O layers and an In—O layer.

The pellet 5100 may receive a charge when passing through the plasma, so that side surfaces thereof are negatively or positively charged. In the pellet 5100, for example, an oxygen atom positioned on its side surface may be negatively charged. When the side surfaces are charged with the same polarity, charges repel each other, and accordingly, the pellet 5100 can maintain a flat-plate (pellet) shape. In the case where a CAAC-OS is an In—Ga—Zn oxide, there is a possibility that an oxygen atom bonded to an indium atom is negatively charged. There is another possibility that an oxygen atom bonded to an indium atom, a gallium atom, or a zinc atom is negatively charged. In addition, the pellet 5100 may grow by being bonded with an indium atom, a gallium atom, a zinc atom, an oxygen atom, or the like when passing through plasma. A difference in size between (2) and (1) in FIG. 41 corresponds to the amount of growth in plasma. Here, in the case where the temperature of the substrate 5120 is at around room temperature, the pellet 5100 on the substrate 5120 hardly grows; thus, an nc-OS is formed (see FIG. 42B). An nc-OS can be deposited when the substrate 5120 has a large size because the deposition of an nc-OS can be carried out at room temperature. Note that in order that the pellet 5100 grows in plasma, it is effective to increase deposition power in sputtering. High deposition power can stabilize the structure of the pellet 5100.

Figure 42B:
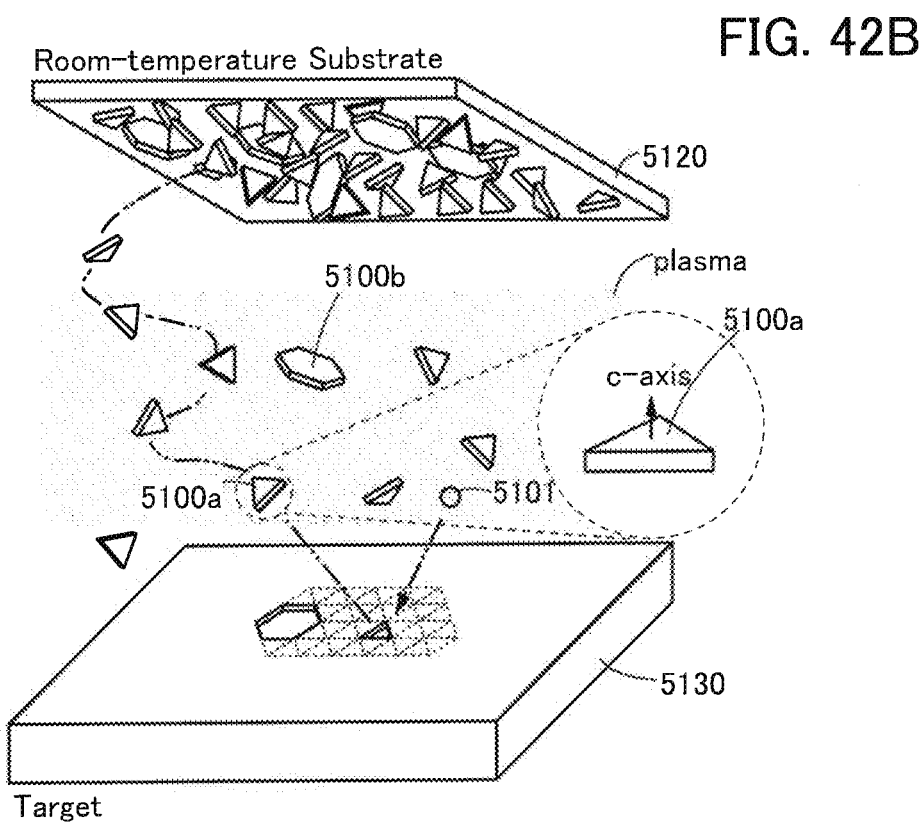

As shown in FIGS. 42A and 42B, the pellet 5100 flies like a kite in plasma and flutters up to the substrate 5120. Since the pellets 5100 are charged, when the pellet 5100 gets close to a region where another pellet 5100 has already been deposited, repulsion is generated. Here, above the substrate 5120, a magnetic field in a direction parallel to the top surface of the substrate 5120 (also referred to as a horizontal magnetic field) is generated. A potential difference is given between the substrate 5120 and the target 5130, and accordingly, current flows from the substrate 5120 toward the target 5130. Thus, the pellet 5100 is given a force (Lorentz force) on the top surface of the substrate 5120 by an effect of the magnetic field and the current. This is explainable with Fleming's left-hand rule.

The mass of the pellet 5100 is larger than that of an atom. Therefore, to move the pellet 5100 over the top surface of the substrate 5120, it is important to apply some force to the pellet 5100 from the outside. One kind of the force may be force which is generated by the action of a magnetic field and current. In order to apply a sufficient force to the pellet 5100 so that the pellet 5100 moves over a top surface of the substrate 5120, it is preferable to provide, on the top surface, a region where the magnetic field in a direction parallel to the top surface of the substrate 5120 is 10 G or higher, preferably 20 G or higher, further preferably 30 G or higher, still further preferably 50 G or higher. Alternatively, it is preferable to provide, on the top surface, a region where the magnetic field in a direction parallel to the top surface of the substrate 5120 is 1.5 times or higher, preferably twice or higher, further preferably 3 times or higher, still further preferably 5 times or higher as high as the magnetic field in a direction perpendicular to the top surface of the substrate 5120.

At this time, the magnets and the substrate 5120 are moved or rotated relatively, whereby the direction of the horizontal magnetic field on the top surface of the substrate 5120 continues to change. Therefore, the pellet 5100 can be moved in various directions on the top surface of the substrate 5120 by receiving forces in various directions.

Furthermore, as shown in FIG. 42A, when the substrate 5120 is heated, resistance between the pellet 5100 and the substrate 5120 due to friction or the like is low. As a result, the pellet 5100 glides above the top surface of the substrate 5120. The glide of the pellet 5100 is caused in a state where its flat plane faces the substrate 5120. Then, when the pellet 5100 reaches the side surface of another pellet 5100 that has been already deposited, the side surfaces of the pellets 5100 are bonded. At this time, the oxygen atom on the side surface of the pellet 5100 is released. With the released oxygen atom, oxygen vacancies in a CAAC-OS might be filled; thus, the CAAC-OS has a low density of defect states. Note that the temperature of the top surface of the substrate 5120 is, for example, higher than or equal to 100° C. and lower than 500° C., higher than or equal to 150° C. and lower than 450° C., or higher than or equal to 170° C. and lower than 400° C. Hence, even when the substrate 5120 has a large size, it is possible to deposit a CAAC-OS.

Furthermore, the pellet 5100 is heated on the substrate 5120, whereby atoms are rearranged, and the structure distortion caused by the collision of the ion 5101 can be reduced. The pellet 5100 whose structure distortion is reduced is substantially single crystal. Even when the pellets 5100 are heated after being bonded, expansion and contraction of the pellet 5100 itself hardly occur, which is caused by turning the pellet 5100 into substantially single crystal. Thus, formation of defects such as a grain boundary due to expansion of a space between the pellets 5100 can be prevented, and accordingly, generation of crevasses can be prevented.

The CAAC-OS does not have a structure like a board of a single crystal oxide semiconductor but has arrangement with a group of pellets 5100 (nanocrystals) like stacked bricks or blocks. Furthermore, a grain boundary does not exist between the pellets 5100. Therefore, even when deformation such as shrink occurs in the CAAC-OS owing to heating during deposition, heating or bending after deposition, it is possible to relieve local stress or release distortion. Therefore, this structure is suitable for a flexible semiconductor device. Note that the nc-OS has arrangement in which pellets 5100 (nanocrystals) are randomly stacked.

When the target 5130 is sputtered with the ion 5101, in addition to the pellets 5100, zinc oxide or the like may be separated. The zinc oxide is lighter than the pellet 5100 and thus reaches the top surface of the substrate 5120 before the pellet 5100. As a result, the zinc oxide forms a zinc oxide layer 5102 with a thickness greater than or equal to 0.1 nm and less than or equal to 10 nm, greater than or equal to 0.2 nm and less than or equal to 5 nm, or greater than or equal to 0.5 nm and less than or equal to 2 nm. FIGS. 44A to 44D are cross-sectional schematic views.

Figure 44A:
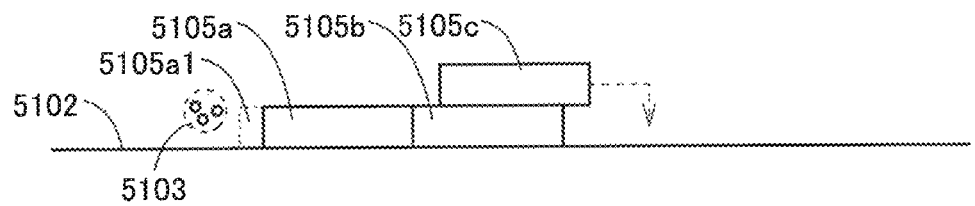
FIGS. 44A to 44D are schematic views illustrating a deposition model of a CAAC-OS.

As illustrated in FIG. 44A, a pellet 5105a and a pellet 5105b are deposited over the zinc oxide layer 5102. Here, side surfaces of the pellet 5105a and the pellet 5105b are in contact with each other. In addition, a pellet 5105c is deposited over the pellet 5105b, and then glides over the pellet 5105b. Furthermore, a plurality of particles 5103 separated from the target together with the zinc oxide is crystallized by heat from the substrate 5120 to form a region 5105a1 on another side surface of the pellet 5105a. Note that the plurality of particles 5103 may contain oxygen, zinc, indium, gallium, or the like.

Figure 44B:
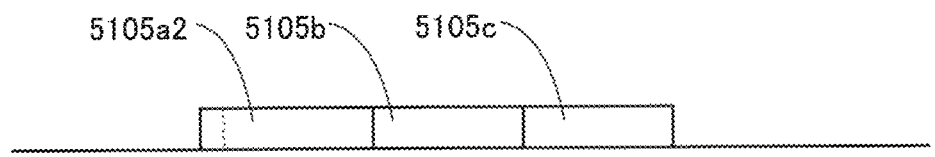

Then, as illustrated in FIG. 44B, the region 5105a1 grows to part of the pellet 5105a to form a pellet 5105a2. In addition, a side surface of the pellet 5105c is in contact with another side surface of the pellet 5105b.

Figure 44C:
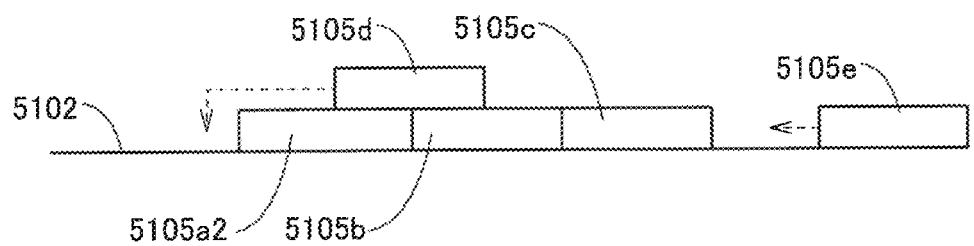

Next, as illustrated in FIG. 44C, a pellet 5105d is deposited over the pellet 5105a2 and the pellet 5105b, and then glides over the pellet 5105a2 and the pellet 5105b. Furthermore, a pellet 5105e glides toward another side surface of the pellet 5105c over the zinc oxide layer 5102.

Figure 44D:
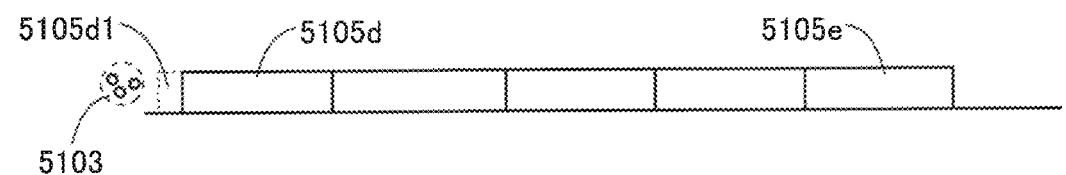

Then, as illustrated in FIG. 44D, the pellet 5105d is placed so that a side surface of the pellet 5105d is in contact with a side surface of the pellet 5105a2. Furthermore, a side surface of the pellet 5105e is in contact with another side surface of the pellet 5105c. A plurality of particles 5103 separated from the target 5130 together with the zinc oxide is crystallized by heat from the substrate 5120 to form a region 5105d1 on another side surface of the pellet 5105d.

As described above, deposited pellets are placed to be in contact with each other and then growth is caused at side surfaces of the pellets, whereby a CAAC-OS is formed over the substrate 5120. Therefore, each pellet of the CAAC-OS is larger than that of the nc-OS. A difference in size between (3) and (2) in FIG. 41 corresponds to the amount of growth after deposition.

When spaces between pellets are extremely small, the pellets may form a large pellet. The large pellet has a single crystal structure. For example, the size of the pellet may be greater than or equal to 10 nm and less than or equal to 200 nm, greater than or equal to 15 nm and less than or equal to 100 nm, or greater than or equal to 20 nm and less than or equal to 50 nm, when seen from the above. In this case, in an oxide semiconductor used for a minute transistor, a channel formation region might be fit inside the large pellet. That is, the region having a single crystal structure can be used as the channel formation region. Furthermore, when the size of the pellet is increased, the region having a single crystal structure can be used as the channel formation region, the source region, and the drain region of the transistor.

In this manner, when the channel formation region or the like of the transistor is formed in a region having a single crystal structure, the frequency characteristics of the transistor can be increased in some cases.

As shown in such a model, the pellets 5100 are considered to be deposited on the substrate 5120. Thus, a CAAC-OS can be deposited even when a formation surface does not have a crystal structure; therefore, a growth mechanism in this case is different from epitaxial growth. In addition, laser crystallization is not needed for formation of a CAAC-OS, and a uniform film can be formed even over a large-sized glass substrate or the like. For example, even when the top surface (formation surface) of the substrate 5120 has an amorphous structure (e.g., the top surface is formed of amorphous silicon oxide), a CAAC-OS can be formed.

In addition, it is found that in formation of the CAAC-OS, the pellets 5100 are arranged in accordance with the top surface shape of the substrate 5120 that is the formation surface even when the formation surface has unevenness. For example, in the case where the top surface of the substrate 5120 is flat at the atomic level, the pellets 5100 are arranged so that flat planes parallel to the a-b plane face downwards. In the case where the thicknesses of the pellets 5100 are uniform, a layer with a uniform thickness, flatness, and high crystallinity is formed. By stacking n layers (n is a natural number), the CAAC-OS can be obtained.

In the case where the top surface of the substrate 5120 has unevenness, a CAAC-OS in which n layers (n is a natural number) in each of which the pellets 5100 are arranged along the unevenness are stacked is formed. Since the substrate 5120 has unevenness, a gap is easily generated between the pellets 5100 in the CAAC-OS in some cases. Note that, even in such a case, owing to intermolecular force, the pellets 5100 are arranged so that a gap between the pellets is as small as possible even on the unevenness surface. Therefore, even when the formation surface has unevenness, a CAAC-OS with high crystallinity can be obtained.

Since a CAAC-OS is deposited in accordance with such a model, the sputtered particle preferably has a pellet shape with a small thickness. Note that when the sputtered particles have a dice shape with a large thickness, planes facing the substrate 5120 vary; thus, the thicknesses and orientations of the crystals cannot be uniform in some cases.

According to the deposition model described above, a CAAC-OS with high crystallinity can be formed even on a formation surface with an amorphous structure.

<Cleavage Plane>

A cleavage plane that has been mentioned in the deposition model of the CAAC-OS is described below.

Figure 45A:
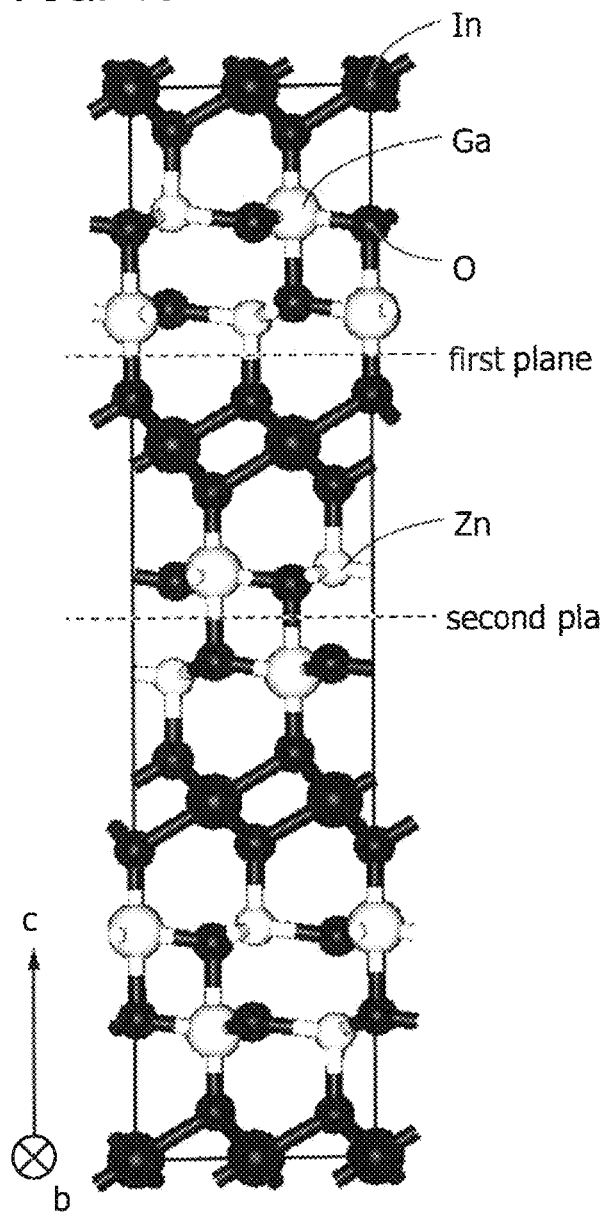
FIGS. 45A and 45B illustrate an InGaZnO$_4$ crystal.
Figure 45B:
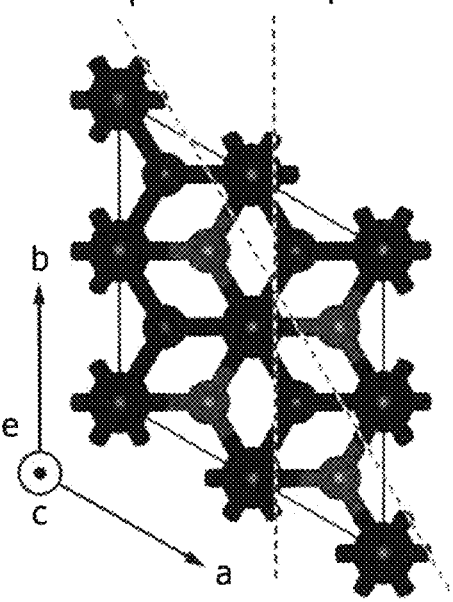

First, a cleavage plane of the target is described with reference to FIGS. 45A and 45B. FIGS. 45A and 45B show the crystal structure of InGaZnO$_4$. Note that FIG. 45A shows the structure of the case where an InGaZnO$_4$ crystal is observed from a direction parallel to the b-axis when the c-axis is in an upward direction. Furthermore, FIG. 45B shows the structure of the case where the InGaZnO$_4$ crystal is observed from a direction parallel to the c-axis.

Energy needed for cleavage at each crystal plane of the InGaZnO$_4$ crystal is calculated by the first principles calculation. Note that a pseudo potential and a density functional theory program (CASTEP) using the plane wave basis are used for the calculation. An ultrasoft type pseudo potential is used as the pseudo potential. Furthermore, GGA/PBE is used as the functional. Cut-off energy is 400 eV.

Energy of a structure in an initial state is obtained after structural optimization including a cell size is performed. Furthermore, energy of a structure after the cleavage at each plane is obtained after structural optimization of atomic order is performed in a state where the cell size is fixed.

On the basis of the structure of the InGaZnO$_4$ crystal in FIGS. 45A and 45B, a structure cleaved at any one of a first plane, a second plane, a third plane, and a fourth plane is formed and subjected to structural optimization calculation in which the cell size is fixed. Here, the first plane is a crystal plane between a Ga—Zn—O layer and an In—O layer and is parallel to the (001) plane (or the a-b plane) (see FIG. 45A). The second plane is a crystal plane between a Ga—Zn—O layer and a Ga—Zn—O layer and is parallel to the (001) plane (or the a-b plane) (see FIG. 45A). The third plane is a crystal plane parallel to the (110) plane (see FIG. 45B). The fourth plane is a crystal plane parallel to the (100) plane (or the b-c plane) (see FIG. 45B).

Under the above conditions, the energy of the structure at each plane after the cleavage is calculated. Next, a difference between the energy of the structure after the cleavage and the energy of the structure in the initial state is divided by the area of the cleavage plane; thus, cleavage energy that serves as a measure of easiness of cleavage at each plane is calculated. Note that the energy of a structure is calculated based on atoms and electrons included in the structure. That is, kinetic energy of the electrons and interactions between the atoms, between the atom and the electron, and between the electrons are considered in the calculation.

As calculation results, the cleavage energy of the first plane is 2.60 J/m$^2$, that of the second plane is 0.68 J/m$^2$, that of the third plane is 2.18 J/m$^2$, and that of the fourth plane is 2.12 J/m$^2$ (see Table 1).

TABLE 1

|  | Cleavage energy [J/m$^2$] |
|---|---|
| First plane | 2.60 |
| Second plane | 0.68 |
| Third plane | 2.18 |
| Fourth plane | 2.12 |

From the calculations, in the structure of the InGaZnO$_4$ crystal in FIGS. 45A and 45B, the cleavage energy of the second plane is the lowest. In other words, a plane between a Ga—Zn—O layer and a Ga—Zn—O layer is cleaved most easily (cleavage plane). Therefore, in this specification, the cleavage plane indicates the second plane, which is a plane where cleavage is performed most easily.

Since the cleavage plane is the second plane between the Ga—Zn—O layer and the Ga—Zn—O layer, the InGaZnO$_4$ crystals in FIG. 45A can be separated at a plane equivalent to two second planes. Thus, in the case where an ion or the like is made to collide with a target, a wafer-like unit (we call this a pellet) that is cleaved at a plane with the lowest cleavage energy is thought to be blasted off as the minimum unit. In that case, a pellet of InGaZnO$_4$ includes three layers: a Ga—Zn—O layer, an In—O layer, and a Ga—Zn—O layer.

The cleavage energies of the third plane (crystal plane parallel to the (110) plane) and the fourth plane (crystal plane parallel to the (100) plane (or the b-c plane)) are lower than that of the first plane (crystal plane between the Ga—Zn—O layer and the In—O layer and crystal plane parallel to the (001) plane (or the a-b plane)), which suggests that most of the flat planes of the pellets have triangle shapes or hexagonal shapes.

Figure 46A:
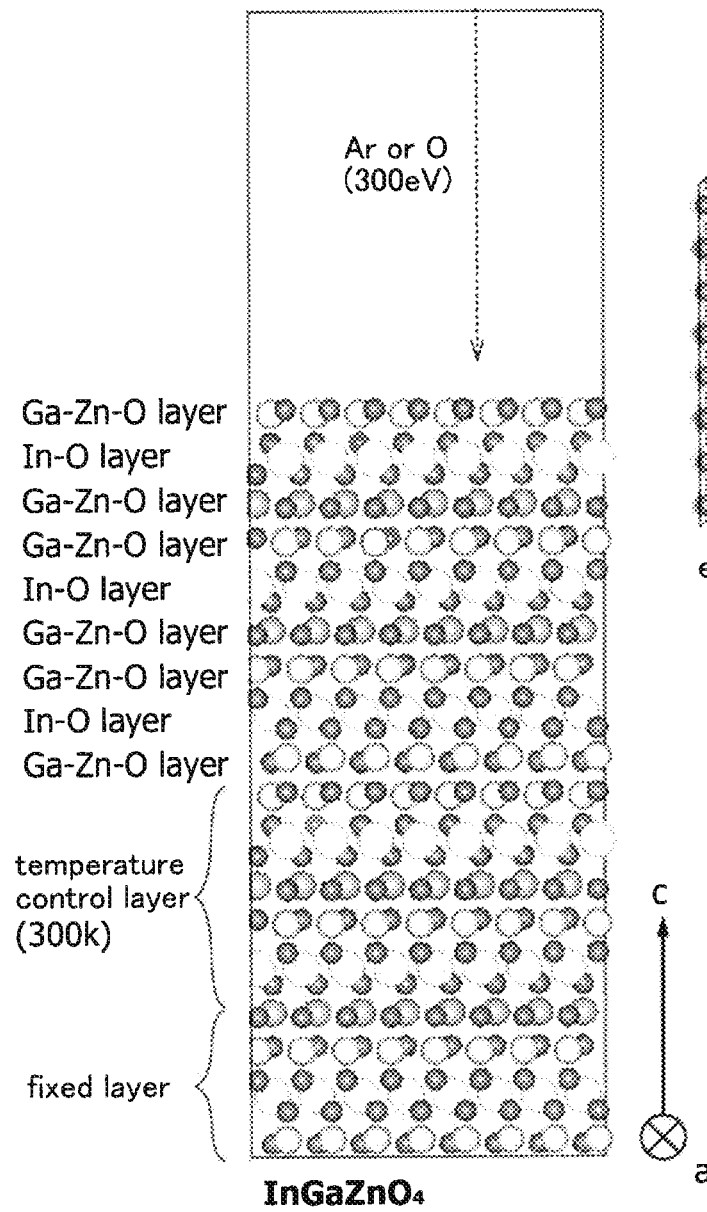
FIGS. 46A and 46B show a structure and the like of InGaZnO$_4$ before collision of an atom.
Figure 46B:
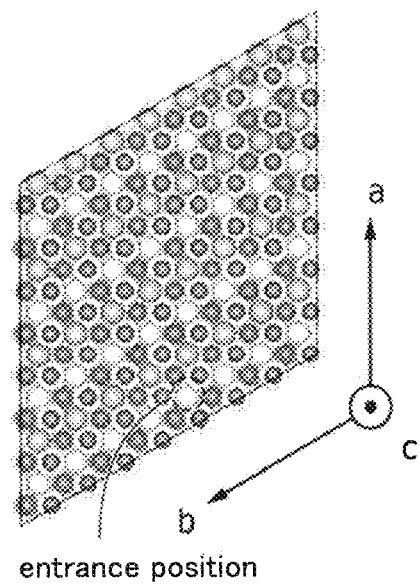

Next, through classical molecular dynamics calculation, on the assumption of an InGaZnO$_4$ crystal having a homologous structure as a target, a cleavage plane is examined in the case where the target is sputtered using argon (Ar) or oxygen (O). FIG. 46A shows a cross-sectional structure of an InGaZnO$_4$ crystal (2688 atoms) used for the calculation, and FIG. 46B shows a top structure thereof. Note that a fixed layer in FIG. 46A prevents the positions of the atoms from moving. A temperature control layer in FIG. 46A is a layer whose temperature is constantly set to fixed temperature (300 K).

For the classical molecular dynamics calculation, Materials Explorer 5.0 manufactured by Fujitsu Limited is used. Note that the initial temperature, the cell size, the time step size, and the number of steps are set to be 300 K, a certain size, 0.01 fs, and ten million, respectively. In calculation, an atom to which an energy of 300 eV is applied is made to enter a cell from a direction perpendicular to the a-b plane of the InGaZnO$_4$ crystal under the conditions.

Figure 47A:
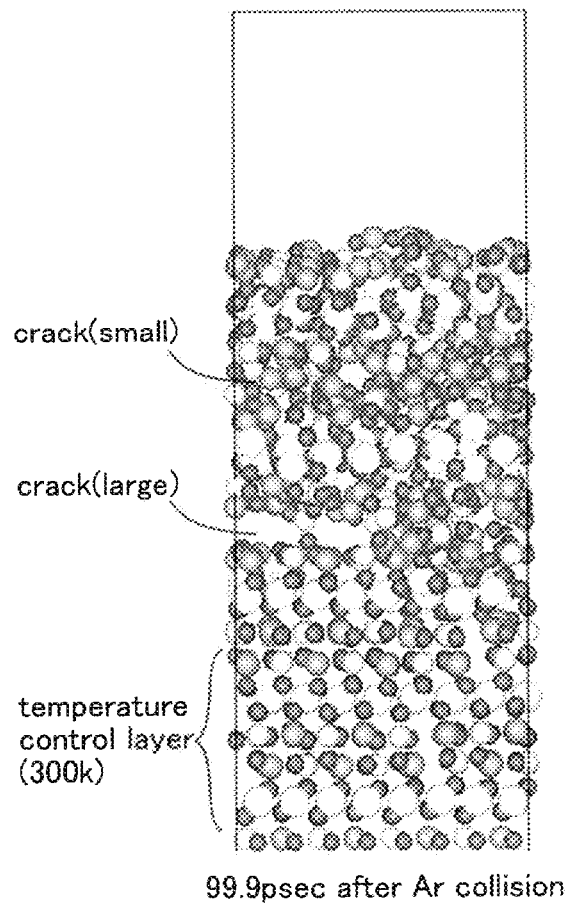
FIGS. 47A and 47B show a structure and the like of InGaZnO$_4$ after collision of an atom.
Figure 47B:
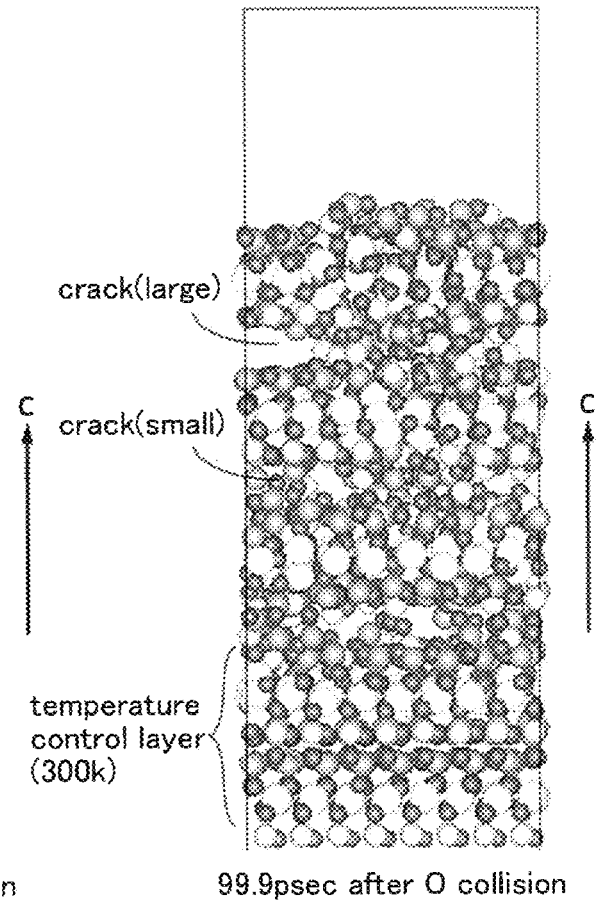

FIG. 47A shows atomic order when 99.9 picoseconds have passed after argon enters the cell including the InGaZnO$_4$ crystal in FIGS. 46A and 46B. FIG. 47B shows atomic order when 99.9 picoseconds have passed after oxygen enters the cell. Note that in FIGS. 47A and 47B, part of the fixed layer in FIG. 46A is omitted.

According to FIG. 47A, in a period from entry of argon into the cell to when 99.9 picoseconds have passed, a crack is formed from the cleavage plane corresponding to the second plane in FIG. 45A. Thus, in the case where argon collides with the InGaZnO$_4$ crystal and the uppermost surface is the second plane (the zero-th), a large crack is found to be formed in the second plane (the second).

On the other hand, according to FIG. 47B, in a period from entry of oxygen into the cell to when 99.9 picoseconds have passed, a crack is found to be formed from the cleavage plane corresponding to the second plane in FIG. 45A. Note that in the case where oxygen collides with the cell, a large crack is found to be formed in the second plane (the first) of the InGaZnO$_4$ crystal.

Accordingly, it is found that an atom (ion) collides with a target including an InGaZnO$_4$ crystal having a homologous structure from the upper surface of the target, the InGaZnO$_4$ crystal is cleaved along the second plane, and a flat-plate-like sputtered particle (pellet) is separated. It is also found that the pellet formed in the case where oxygen collides with the cell is smaller than that formed in the case where argon collides with the cell.

The above calculation suggests that the separated pellet includes a damaged region. In some cases, the damaged region included in the pellet can be repaired in such a manner that a defect caused by the damage reacts with oxygen.

Here, a difference in size of the pellet depending on atoms that are made to collide is studied.

FIG. 48A shows trajectories of the atoms from 0 picosecond to 0.3 picoseconds after argon enters the cell including the InGaZnO$_4$ crystal in FIGS. 46A and 46B. Accordingly, FIG. 48A corresponds to a period from FIGS. 46A and 46B to FIG. 47A.

According to FIG. 48A, when argon collides with gallium (Ga) of the first layer (Ga—Zn—O layer), gallium collides with zinc (Zn) of the third layer (Ga—Zn—O layer) and then, zinc reaches the vicinity of the sixth layer (Ga—Zn—O layer). Note that argon which collides with gallium is sputtered to the outside. Accordingly, in the case where argon collides with the target including the InGaZnO$_4$ crystal, a crack is thought to be formed in the second plane (the second) in FIG. 46A.

FIG. 48B shows trajectories of the atoms from 0 picosecond to 0.3 picoseconds after oxygen enters the cell including the InGaZnO$_4$ crystal in FIGS. 46A and 46B. Accordingly, FIG. 48B corresponds to a period from FIGS. 46A and 46B to FIG. 47A.

On the other hand, according to FIG. 48B, when oxygen collides with gallium (Ga) of the first layer (Ga—Zn—O layer), gallium collides with zinc (Zn) of the third layer (Ga—Zn—O layer) and then, zinc does not reach the fifth layer (In—O layer). Note that oxygen which collides with gallium is sputtered to the outside. Accordingly, in the case where oxygen collides with the target including the InGaZnO$_4$ crystal, a crack is thought to be formed in the second plane (the first) in FIG. 46A.

This calculation also shows that the InGaZnO$_4$ crystal with which an atom (ion) collides is separated from the cleavage plane.

In addition, a difference in depth of a crack is examined in view of conservation laws. The energy conservation law and the law of conservation of momentum can be represented by Formula (1) and Formula (2). Here, E represents energy of argon or oxygen before collision (300 eV), $m_A$ represents mass of argon or oxygen, $v_A$ represents the speed of argon or oxygen before collision, $v'_A$ represents the speed of argon or oxygen after collision, $m_{Ga}$ represents mass of gallium, $v_{Ga}$ represents the speed of gallium before collision, and $v'_{Ga}$ represents the speed of gallium after collision.

$$E = \tfrac{1}{2} m_A v_A^2 + \tfrac{1}{2} m_A v_{Ga}^2 \tag{1}$$

$$m_A v_A + m_{Ga} v_{Ga} = m'_A v'_A + m'_{Ga} v'_{Ga} \tag{2}$$

On the assumption that collision of argon or oxygen is elastic collision, the relationship among $v_A$, $v'_A$, $v_{Ga}$, and $v'_{Ga}$ can be represented by Formula (3).

$$v'_A - v'_{Ga} = -(v_A - v_{Ga}) \tag{3}$$

From Formulae (1), (2), and (3), on the assumption that $v_{Ga}$ is 0, the speed of gallium $v'_{Ga}$ after collision of argon or oxygen can be represented by Formula (4).

$$v'_{Ga} = \frac{\sqrt{m_A}}{m_A + m_{Ga}} \cdot 2\sqrt{2E} \tag{4}$$

In Formula (4), mass of argon or oxygen is substituted into $m_A$, and the speeds after collision of the atoms are compared. In the case where argon and oxygen have the same energy before collision, the speed of gallium when argon collides with gallium was found to be 1.24 times the speed of gallium when oxygen collides with gallium. Thus, the energy of gallium when argon collides with gallium is higher than the energy of gallium when oxygen collides with gallium by the square of the speed.

The speed (energy) of gallium after collision when argon collides with gallium is found to be higher than the speed (energy) of gallium after collision when oxygen collides with gallium. Accordingly, a crack is considered to be formed at a deeper position in the case where argon collides with gallium than in the case where oxygen collides with gallium.

The above calculation shows that when sputtering is performed using a target including the InGaZnO$_4$ crystal having a homologous structure, separation occurs from the cleavage plane to form a pellet. On the other hand, even when sputtering is performed on a region having another structure of a target without the cleavage plane, a pellet is not formed, and a sputtered particle with an atomic-level size that is minuter than a pellet is formed. Because the sputtered particle is smaller than the pellet, the sputtered particle is thought to be removed through a vacuum pump connected to a sputtering apparatus. Therefore, a model in which particles with a variety of sizes and shapes fly to a substrate and are deposited hardly applies to the case where sputtering is performed using a target including the InGaZnO$_4$ crystal having a homologous structure. The model in FIG. 43A where sputtered pellets are deposited to form a CAAC-OS is a reasonable model.

The CAAC-OS deposited in this manner has density substantially equal to that of a single crystal OS. For example, the density of the single crystal OS having a homologous structure of InGaZnO$_4$ is 6.36 g/cm$^3$, and the density of the CAAC-OS having substantially the same atomic ratio is approximately 6.3 g/cm$^3$.

Figure 49A:
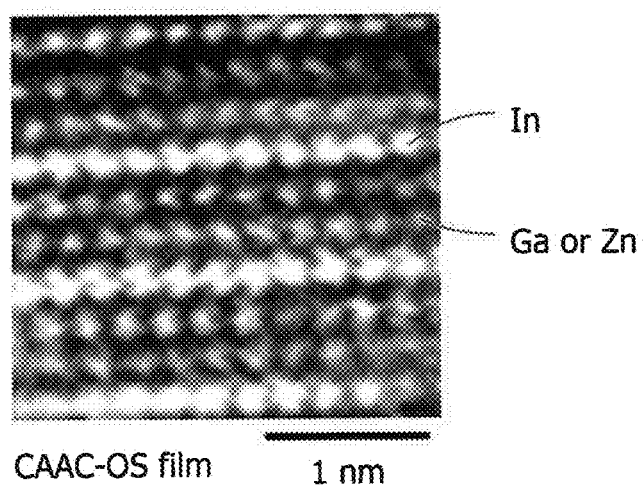
FIGS. 49A and 49B are cross-sectional HAADF-STEM images of a CAAC-OS and a target.
Figure 49B:
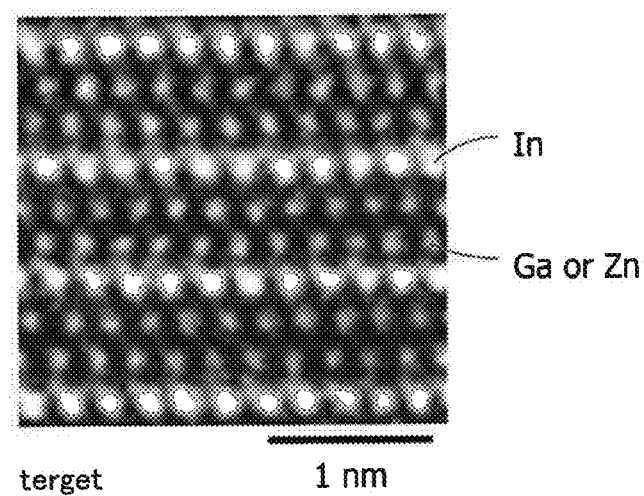

FIGS. 49A and 49B show atomic order of cross sections of an In—Ga—Zn oxide (see FIG. 49A) that is a CAAC-OS deposited by sputtering and a target thereof (see FIG. 49B). For observation of atomic order, a high-angle annular dark field scanning transmission electron microscopy (HAADF-STEM) is used. In the case of observation by HAADF-STEM, the intensity of an image of each atom is proportional to the square of its atomic number. Thus, Zn (atomic number: 30) and Ga (atomic number: 31), whose atomic numbers are close to each other, are hardly distinguished from each other. A Hitachi scanning transmission electron microscope HD-2700 is used for the HAADF-STEM.

When FIG. 49A and FIG. 49B are compared, it is found that the CAAC-OS and the target each have a homologous structure and atomic order in the CAAC-OS correspond to that in the target. Thus, as illustrated in the deposition model in FIG. 43A, the crystal structure of the target is transferred, so that a CAAC-OS is deposited.

<Oxide Semiconductor Film and Oxide Conductor Film>

Figure 50:
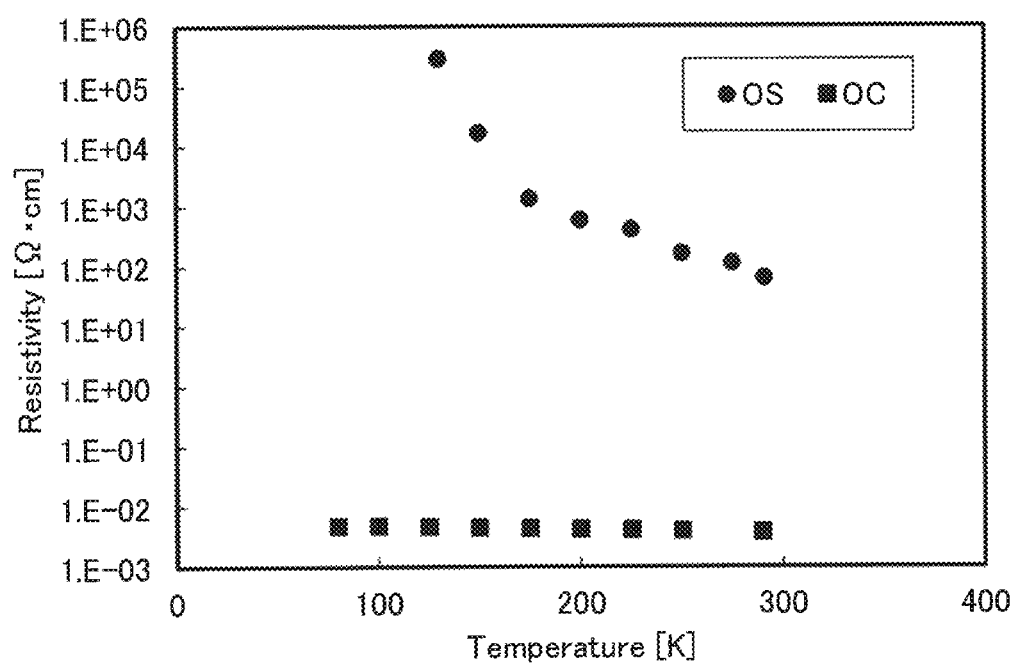
FIG. 50 shows temperature dependence of resistivity of an oxide semiconductor film.

The temperature dependence of resistivity of a film formed with an oxide semiconductor (hereinafter referred to as an oxide semiconductor film (OS)) and that of a film formed with an oxide conductor (hereinafter referred to as an oxide conductor film (OC)), such as the oxide semiconductor films 19$b$ and 155$b$ having conductivity, is described with reference to FIG. 50. In FIG. 50, the horizontal axis represents measurement temperature, and the vertical axis represents resistivity. Measurement results of the oxide semiconductor film (OS) are plotted as circles, and measurement results of the oxide conductor film (OC) are plotted as squares.

Note that a sample including the oxide semiconductor film (OS) was prepared by forming a 35-nm-thick In—Ga—Zn oxide film over a glass substrate by a sputtering method using a sputtering target with an atomic ratio of In:Ga:Zn=1:1:1.2, forming a 20-nm-thick In—Ga—Zn oxide film over the 35-nm-thick In—Ga—Zn oxide film by a sputtering method using a sputtering target with an atomic ratio of In:Ga:Zn=1:4:5, performing heat treatment at 450° C. in a nitrogen atmosphere and then performing heat treatment at 450° C. in an atmosphere of a mixed gas of nitrogen and oxygen, and forming a silicon oxynitride film over the oxide films by a plasma CVD method.

A sample including the oxide conductor film (OC) is prepared by forming a 100-nm-thick In—Ga—Zn oxide film over a glass substrate by a sputtering method using a sputtering target with an atomic ratio of In:Ga:Zn=1:1:1, performing heat treatment at 450° C. in a nitrogen atmosphere and then performing heat treatment at 450° C. in an atmosphere of a mixed gas of nitrogen and oxygen, and forming a silicon nitride film over the oxide film by a plasma CVD method.

As can be seen from FIG. 50, the temperature dependence of resistivity of the oxide conductor film (OC) is lower than the temperature dependence of resistivity of the oxide semiconductor film (OS). Typically, the range of variation of resistivity of the oxide conductor film (OC) at temperatures from 80 K to 290 K is from more than −20% to less than +20%. Alternatively, the range of variation of resistivity at temperatures from 150 K to 250 K is from more than −10% to less than +10%. In other words, the oxide conductor is a degenerate semiconductor and it is suggested that the conduction band edge agrees with or substantially agrees with the Fermi level. Therefore, the oxide conductor film (OC) can be used for a resistor, an electrode of a capacitor, a pixel electrode, a common electrode, a wiring, or the like.

Note that the structures, methods, and the like described in this embodiment can be used as appropriate in combination with any of the structures, methods, and the like described in the other embodiments.

Embodiment 10

In this embodiment, structural examples of electronic devices each using a display device of one embodiment of the present invention will be described. In addition, in this embodiment, a display module using a display device of one embodiment of the present invention will be described with reference to FIG. 51.

Figure 51:
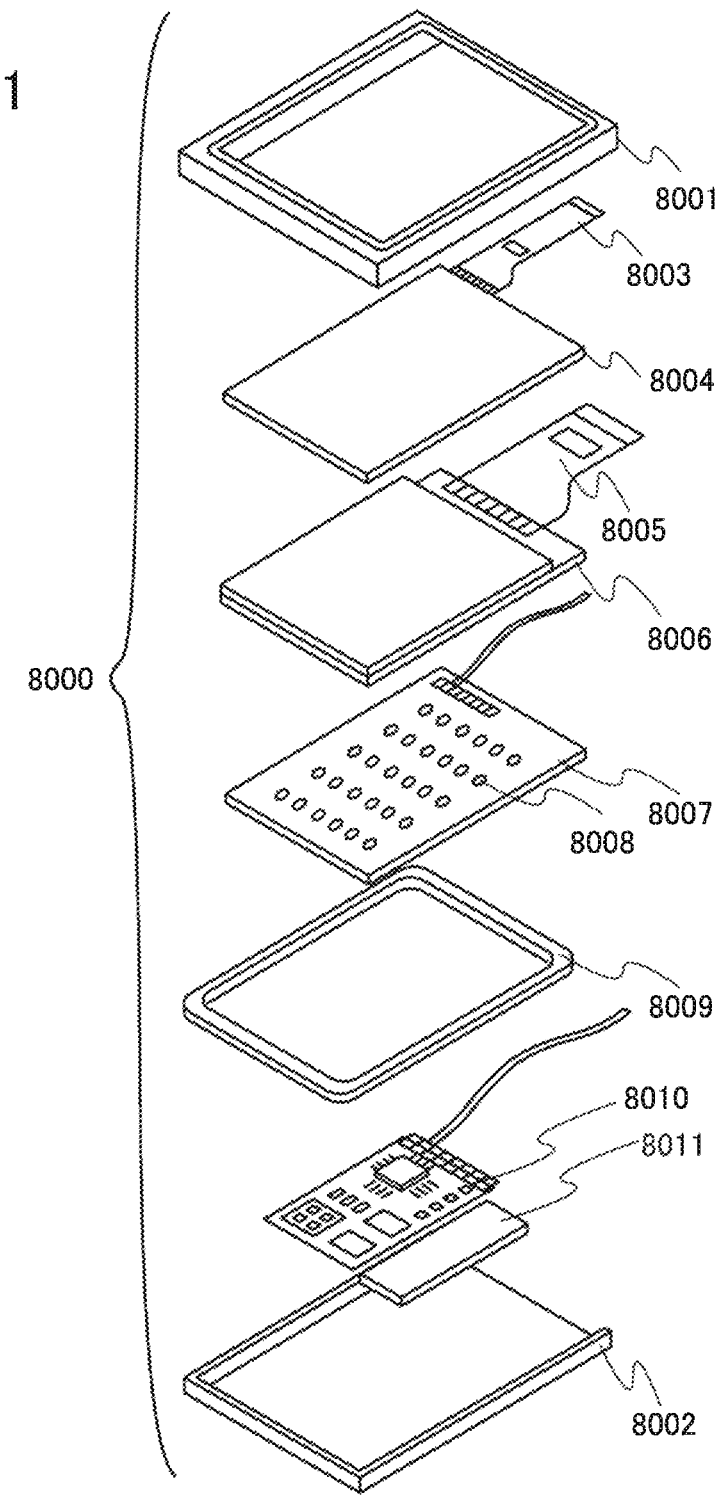
FIG. 51 illustrates a display module.

In a display module 8000 in FIG. 51, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002. Note that the backlight unit 8007, the battery 8011, the touch panel 8004, and the like are not provided in some cases.

The display device of one embodiment of the present invention can be used for the display panel 8006, for example.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and may be formed so as to overlap with the display panel 8006. A counter substrate (sealing substrate) of the display panel 8006 can have a touch panel function. A photosensor may be provided in each pixel of the display panel 8006 to form an optical touch panel. An electrode for a touch sensor may be provided in each pixel of the display panel 8006 so that a capacitive touch panel is obtained.

The backlight unit 8007 includes a light source 8008. The light source 8008 may be provided at an end portion of the backlight unit 8007 and a light diffusing plate may be used.

The frame 8009 protects the display panel 8006 and also functions as an electromagnetic shield for blocking electromagnetic waves generated by the operation of the printed board 8010. The frame 8009 can function as a radiator plate too.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIGS. 52A to 52E are each an external view of an electronic device including a display device of one embodiment of the present invention.

Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like.

Figure 52A:
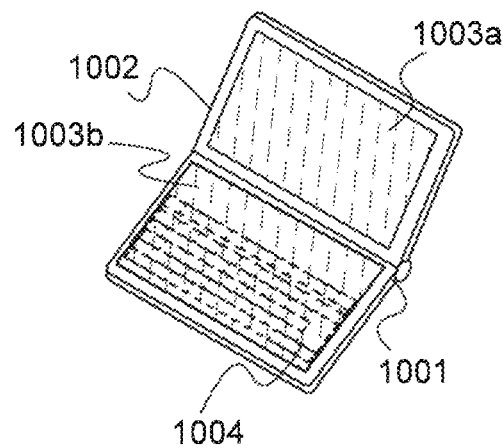
FIGS. 52A to 52E are each an external view of an electronic device of one embodiment.

FIG. 52A illustrates a portable information terminal including a main body 1001, a housing 1002, display portions 1003a and 1003b, and the like. The display portion 1003b is a touch panel. By touching a keyboard button 1004 displayed on the display portion 1003b, a screen can be operated, and text can be input. It is needless to say that the display portion 1003a may be a touch panel. A liquid crystal panel or an organic light-emitting panel is fabricated using any of the transistors described in the above embodiments as a switching element and used in the display portion 1003a or 1003b, whereby a highly reliable portable information terminal can be provided.

The portable information terminal illustrated in FIG. 52A can have a function of displaying a variety of information (e.g., a still image, a moving image, and a text image); a function of displaying a calendar, a date, the time, and the like on the display portion; a function of operating or editing the information displayed on the display portion; a function of controlling processing by various kinds of software (programs); and the like. Furthermore, an external connection terminal (an earphone terminal, a USB terminal, or the like), a recording medium insertion portion, and the like may be provided on the back surface or the side surface of the housing.

The portable information terminal illustrated in FIG. 52A may transmit and receive data wirelessly. Through wireless communication, desired book data or the like can be purchased and downloaded from an e-book server.

Figure 52B:
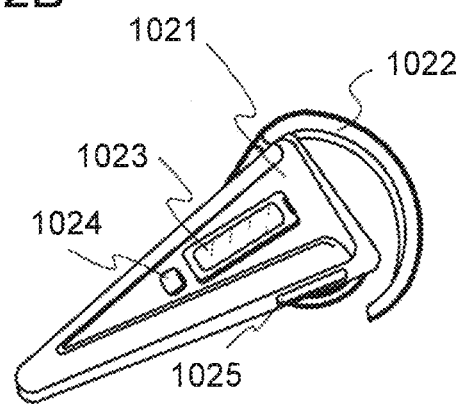

FIG. 52B illustrates a portable music player including, in a main body 1021, a display portion 1023, a fixing portion 1022 with which the portable music player can be worn on the ear, a speaker, an operation button 1024, an external memory slot 1025, and the like. A liquid crystal panel or an organic light-emitting panel is fabricated using any of the transistors described in the above embodiments as a switching element and used in the display portion 1023, whereby a highly reliable portable music player can be provided.

Furthermore, when the portable music player illustrated in FIG. 52B has an antenna, a microphone function, or a wireless communication function and is used with a mobile phone, a user can talk on the phone wirelessly in a hands-free way while driving a car or the like.

Figure 52C:
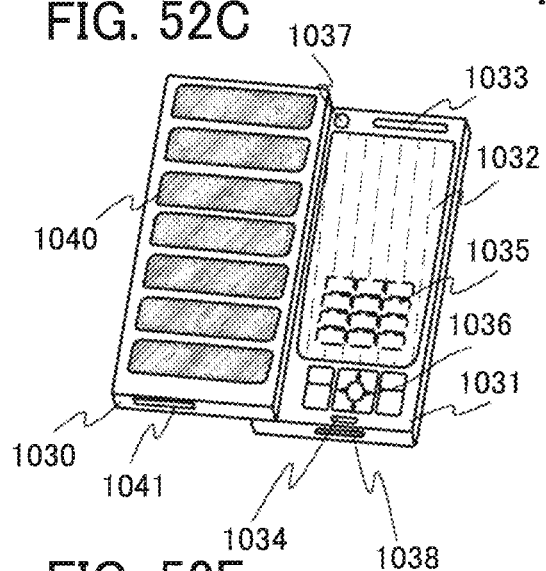

FIG. 52C illustrates a mobile phone, which includes two housings, a housing 1030 and a housing 1031. The housing 1031 includes a display panel 1032, a speaker 1033, a microphone 1034, a pointing device 1036, a camera 1037, an external connection terminal 1038, and the like. The housing 1030 is provided with a solar cell 1040 for charging the mobile phone, an external memory slot 1041, and the like. In addition, an antenna is incorporated in the housing 1031. Any of the transistors described in the above embodiments is used in the display panel 1032, whereby a highly reliable mobile phone can be provided.

Furthermore, the display panel 1032 includes a touch panel. A plurality of operation keys 1035 that are displayed as images are indicated by dotted lines in FIG. 52C. Note that a boosting circuit by which voltage output from the solar cell 1040 is increased to be sufficiently high for each circuit is also included.

In the display panel 1032, the direction of display is changed as appropriate depending on the application mode. In addition, the mobile phone has the camera 1037 and the display panel 1032 on the same surface side, and thus it can be used as a video phone. The speaker 1033 and the microphone 1034 can be used for videophone calls, recording, and playing sound, etc., as well as voice calls. Moreover, the housings 1030 and 1031 in a state where they are developed as illustrated in FIG. 52C can shift, to a state where one is lapped over the other by sliding. Therefore, the size of the mobile phone can be reduced, which makes the mobile phone suitable for being carried around.

The external connection terminal 1038 can be connected to an AC adaptor and a variety of cables such as a USB cable, whereby charging and data communication with a personal computer or the like are possible. Furthermore by inserting a recording medium into the external memory slot 1041, a larger amount of data can be stored and moved.

In addition, in addition to the above functions, an infrared communication function, a television reception function, or the like may be provided.

Figure 52D:
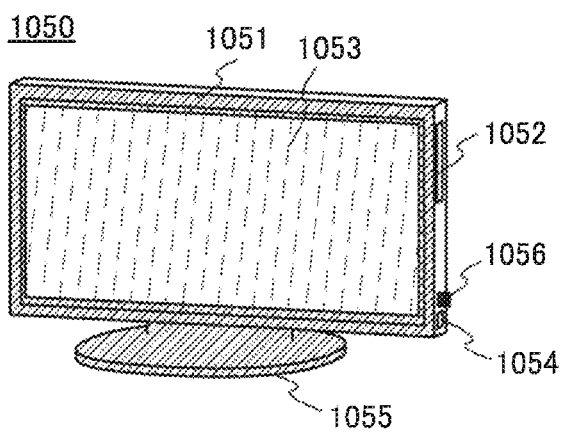

FIG. 52D illustrates an example of a television set. In a television set 1050, a display portion 1053 is incorporated in a housing 1051. Images can be displayed on the display portion 1053. Moreover, a CPU is incorporated in a stand 1055 supporting the housing 1051. Any of the transistors described in the above embodiments is used in the display portion 1053 and the CPU, whereby the television set 1050 can have high reliability.

The television set 1050 can be operated with an operation switch of the housing 1051 or a separate remote controller. In addition, the remote controller may be provided with a display portion for displaying data output from the remote controller.

Note that the television set 1050 is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) information communication can be performed.

Furthermore, the television set 1050 is provided with an external connection terminal 1054, a storage medium recording and reproducing portion 1052, and an external memory slot. The external connection terminal 1054 can be connected to various types of cables such as a USB cable, and data communication with a personal computer or the like is possible. A disk storage medium is inserted into the storage medium recording and reproducing portion 1052, and reading data stored in the storage medium and writing data to the storage medium can be performed. In addition, an image, a video, or the like stored as data in an external memory 1056 inserted into the external memory slot can be displayed on the display portion 1053.

Furthermore, in the case where the off-state leakage current of the transistor described in the above embodiments is extremely small, when the transistor is used in the external memory 1056 or the CPU, the television set 1050 can have high reliability and sufficiently reduced power consumption.

Figure 52E:
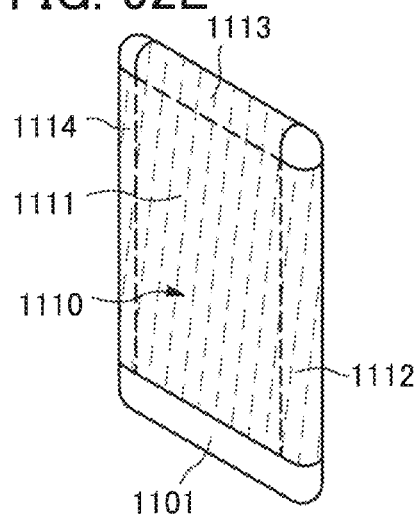

The portable information terminal illustrated in FIG. 52E includes a housing 1101 and a display panel 1110 which is provided so that an image can be displayed on a surface of the housing 1101.

The housing 1101 has a top surface, a rear surface, a first side surface, a second side surface in contact with the first side surface, a third side surface opposite to the first side surface, and a fourth side surface opposite to the second side surface.

The display panel 1110 includes a first display region 1111 overlapping with the top surface of the housing 1101, a second display region 1112 overlapping with one of the side surfaces of the housing 1101, a third display region 1113 overlapping with another one of the side surfaces of the housing 1101, and a fourth display region 1114 opposite to the second display region 1112.

Among the four side surfaces of the housing 1101, at least a region overlapping with the display panel 1110 preferably has a curved surface. For example, it is preferable that there be no corner portion between the top surface and the side surface and between the side surface and the rear surface, and that these surfaces form a continuous surface. Furthermore, the side surface is preferably a curved surface such that the inclination of a tangent line is continuous from the top surface to the rear surface of the housing 1101.

In addition to the display panel 1110, a hardware button, an external connection terminal, and the like may be provided on the surface of the housing 1101. It is preferable that a touch sensor be provided at a position overlapping with the display panel 1110, specifically, in regions overlapping with the display regions.

With the portable information terminal in FIG. 52E, display can be performed not only on a surface parallel to the top surface of the housing but also on a side surface of the housing. In particular, a display region is preferably provided along two or more side surfaces of the housing because the variety of display is further increased.

Note that the structures, methods, and the like described in this embodiment can be used as appropriate in combination with any of the structures, methods, and the like described in the other embodiments.

Example 1

In this example, a cross-sectional shape of a stacked-layer structure of an oxide semiconductor film, a conductive film, and an insulating film was observed. In addition, composition of metal elements in the conductive film was analyzed. Details of samples manufactured in this example are described below.
<Sample A1>

First, a substrate was prepared. As the substrate, a glass substrate was used. Then, an insulating film 601 was deposited over the substrate.

As the insulating film 601, a 50-nm-thick silicon nitride film, a 300-nm-thick silicon nitride film, a 50-nm-thick silicon nitride film, and a 50-nm-thick silicon oxynitride film were successively formed in a PECVD apparatus.

Next, a multilayer film 603 was formed over the insulating film 601. In the multilayer film 603, a 35-nm-thick first IGZO film, a 10-nm-thick second IGZO film, and a 20-nm-thick IGO film are stacked.

A formation method of the multilayer film 603 is described below. The 35-nm-thick first IGZO film was formed under the following conditions: the substrate temperature was 300° C.; a metal oxide target (In:Ga:Zn=1:1:1 [atomic ratio]) was used as a sputtering target; oxygen of 33 vol % (diluted with argon) was supplied as a sputtering gas into a treatment chamber of a sputtering apparatus; the pressure in the treatment chamber was controlled to 0.4 Pa; and a power of 200 W was supplied. Then, the 10-nm-thick second IGZO film was formed under the following conditions: the substrate temperature was 200° C.; a metal oxide target (In:Ga:Zn=1:3:6 [atomic ratio]) was used as a sputtering target; oxygen of 33 vol % (diluted with argon) was supplied as a sputtering gas into a treatment chamber of a sputtering apparatus; the pressure in the treatment chamber was controlled to 0.4 Pa; and a power of 200 W was supplied. Then, the 20-nm-thick IGO film was formed under the following conditions: the substrate temperature was 170° C.; a metal oxide target (In:Ga=7:93 [atomic ratio]) was used as a sputtering target; oxygen of 75 vol % (diluted with argon) was supplied as a sputtering gas into a treatment chamber of a sputtering apparatus; the pressure in the treatment chamber was controlled to 0.4 Pa; and a power of 200 W was supplied. Next, a mask was formed over the first IGZO film, the second IGZO film, and the IGO film through a photolithography process and etching treatment was performed, whereby the multilayer film 603 was formed.

After that, the mask was removed.

Next, heat treatment was performed at 450° C. in a nitrogen atmosphere for one hour, and after that, another heat treatment was performed in a mixed gas atmosphere of oxygen and nitrogen at 450° C. for one hour.

Then, a conductive film 605 was formed over the multilayer film 603. In the conductive film 605, a 30-nm-thick first Cu—Mn alloy film, a 200-nm-thick Cu film, and a 100-nm-thick second Cu—Mn alloy film are stacked.

A formation method of the conductive film 605 is described below. The first Cu—Mn alloy film was formed by a sputtering method under the following conditions: the substrate temperature was room temperature; an Ar gas at a flow rate of 100 sccm was supplied to a treatment chamber; the pressure in the treatment chamber was controlled to 0.4 Pa; and a power of 2000 W was supplied to a target with a direct current (DC) power source. Note that the composition of the target was Cu:Mn=90:10 [atomic %]. Then, the Cu film was formed by a sputtering method under the following conditions: the substrate temperature was 100° C.; an Ar gas at a flow rate of 75 sccm was supplied to a treatment chamber; the pressure in the treatment chamber was controlled to 1.0 Pa; and a power of 15000 W was supplied to a target with a direct current (DC) power source. Then, the second Cu—Mn alloy film was formed under the conditions similar to those of the first Cu—Mn alloy film. Next, a resist mask was formed over the second Cu—Mn alloy film, an etchant was applied over the resist mask, and wet etching treatment was performed, whereby the conductive film 605 was formed. As the etchant, an etchant including an organic acid solution and hydrogen peroxide water was used.

After that, the mask was removed.

Next, an insulating film 607 was formed over the conductive film 605. As the insulating film 607, a 50-nm-thick silicon oxynitride film and a 400-nm-thick silicon oxynitride film were successively formed in a PECVD apparatus in vacuum.

Next, heat treatment was performed at 350° C. in a mixed gas atmosphere of oxygen and nitrogen for one hour.

Through the above process, Sample A1 was formed.

Figure 53A:
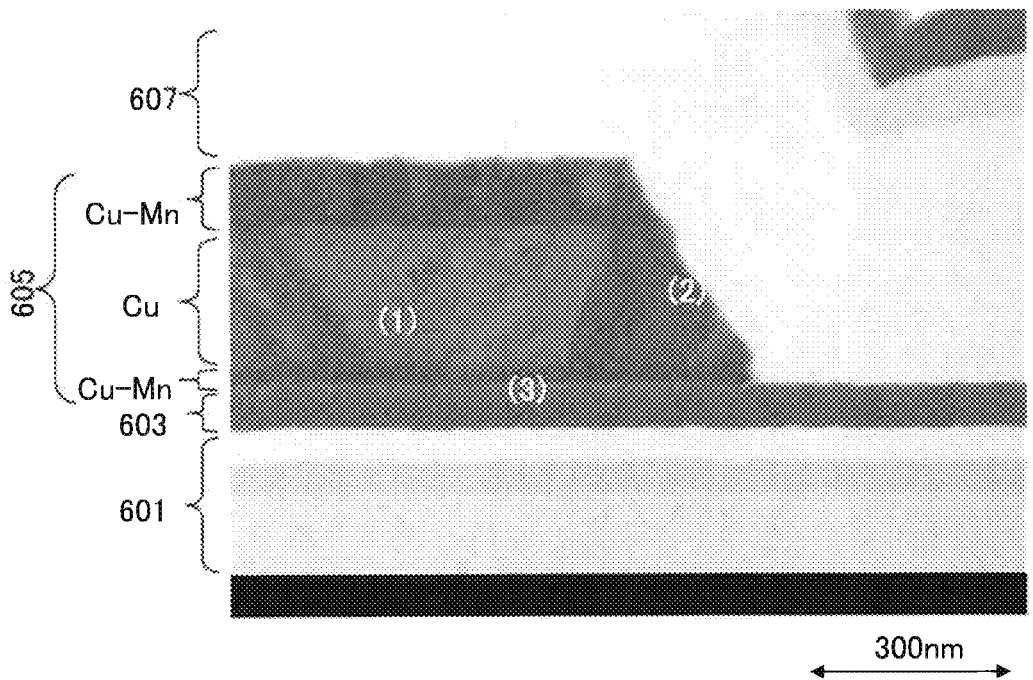
FIGS. 53A and 53B show a STEM image of Sample and a result of EDX analysis.

Next, a cross section of Sample A1 was observed by a scanning transmission electron microscope (STEM). FIG. 53A shows a cross-sectional observation image of Sample A1. Note that the image in FIG. 53A is a phase contrast image (TE image).

From the result of the cross-sectional observation image of FIG. 53A, it is observed that the conductive film 605 of Sample A1 formed in this example can have a favorable cross-sectional shape over the multilayer film 603.

Figure 53B:
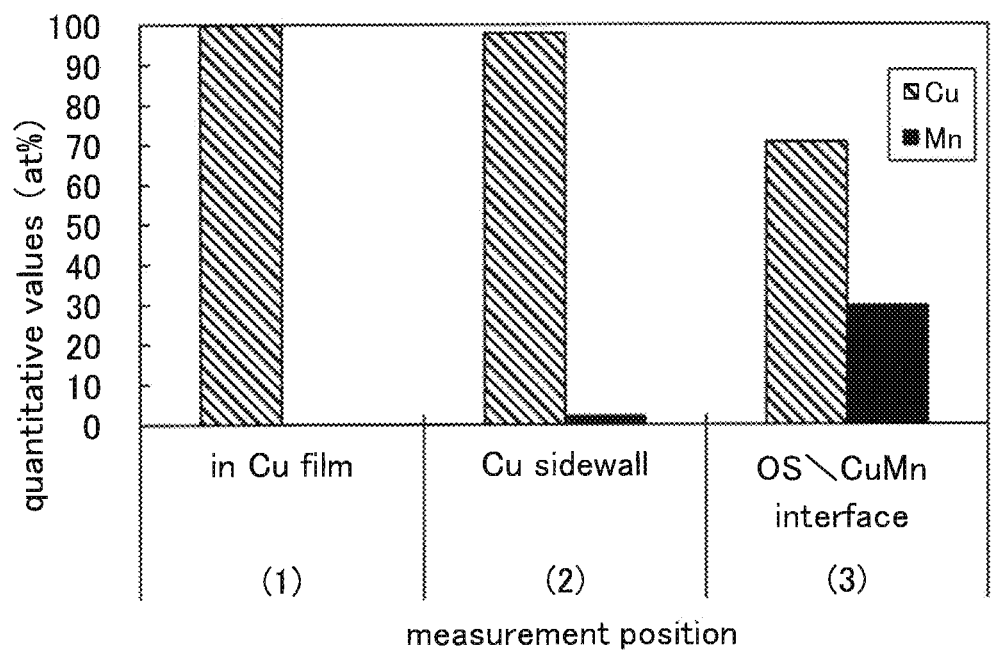

Next, in regions (1), (2), and (3) in FIG. 53A, energy dispersive x-ray spectroscopy (EDX) was performed. FIG. 53B shows the composition of Cu and Mn obtained by EDX analysis. FIG. 53B indicates that Mn is not detected inside the Cu film ((1) in FIG. 53A), and on the other hand, Mn of 2 atoms % to 4 atoms % is detected on the sidewall of the Cu film ((2) in FIG. 53A).

REFERENCE NUMERALS

11: substrate, 12: conductive film, 13: conductive film, 14: gate insulating film, 15: nitride insulating film, 16: oxide insulating film, 17: oxide insulating film, 18: oxide semiconductor film, 19a: oxide semiconductor film, 19b: oxide semiconductor film, 19c: oxide semiconductor film, 19d: oxide semiconductor film, 19f: oxide semiconductor film, 19g: oxide semiconductor film, 20: conductive film, 20_1: conductive film, 20_2: conductive film, 21a: conductive film, 21a_1: conductive film, 21a_2: conductive film, 21b: conductive film, 21b_1: conductive film, 21b_2: conductive film, 21c: conductive film, 21c_1: conductive film, 21c_2: conductive film, 21d: conductive film, 21d_1: conductive film, 21d_2: conductive film, 21e: conductive film, 21e_1: conductive film, 21e_2: conductive film, 21f: conductive film, 21f_1: conductive film, 21f_2: conductive film, 21g: conductive film, 22: oxide insulating film, 23: oxide insulating film, 24: oxide insulating film, 25: oxide insulating film, 26: nitride insulating film, 27: nitride insulating film, 28: conductive film, 29: common electrode, 29b: conductive film, 29c: conductive film, 29d: conductive film, 30: inorganic insulating film, 30a: inorganic insulating film, 31: organic insulating film, 31a: organic resin film, 33: alignment film, 37a: multilayer film, 37b: multilayer film, 38a: multilayer film, 38b: multilayer film, 39a: oxide semiconductor film, 39b: oxide semiconductor film, 40: opening, 41: opening, 41a: opening, 49a: oxide semiconductor film, 49b: oxide semiconductor film, 101: pixel portion, 102: transistor, 102a: transistor, 102b: transistor, 102c: transistor, 102d: transistor, 102e: transistor, 103: pixel, 103a: pixel, 103b: pixel, 103c: pixel, 104: scan line driver circuit, 105: capacitor, 105a: capacitor, 105b: capacitor, 105c: capacitor, 106: signal line driver circuit, 107: scan line, 109: signal line, 115: capacitor line, 121: liquid crystal element, 131: light-emitting element, 133: transistor, 135: transistor, 137: wiring, 139: wiring, 141: wiring, 151: substrate, 153: insulating film, 153a: insulating film, 154: rare gas, 155: oxide semiconductor film, 155a: oxide semiconductor film, 155b: oxide semiconductor film, 155c: oxide semiconductor film, 156: coating film, 156a: coating film, 156b: coating film, 156c: coating film, 157: insulating film, 157a: insulating film, 159: conductive film, 159a: conductive film, 159b: conductive film, 159c: conductive film, 160a: resistor, 160b: resistor, 160c: resistor, 160d: resistor, 160e: capacitor, 160f: capacitor, 160g: resistor, 160h: resistor, 160i: resistor, 161: conductive film, 161a: conductive film, 161b: conductive film, 161c: conductive film, 162: conductive film, 162a: conductive film, 162b: conductive film, 162c: conductive film, 163: conductive film, 163a: conductive film, 163b: conductive film, 163c: conductive film, 164: conductive film, 164a: conductive film, 164b: conductive film, 164c: conductive film, 170a: protection circuit, 170b: protection circuit, 171: wiring, 172: wiring, 173: resistor, 173a: resistor, 173b: resistor, 173c: resistor, 174: transistor, 174a: transistor, 174b: transistor, 174c: transistor, 174d: transistor, 175: wiring, 176: wiring, 177: wiring, 180a: capacitor, 180b: capacitor, 180c: capacitor, 180d: capacitor, 180e: capacitor, 180f: capacitor, 180g: capacitor, 181: conductive film, 306: insulating film, 320: liquid crystal layer, 322: liquid crystal element, 342: substrate, 344: light-blocking film, 346: coloring film, 348: insulating film, 350: conductive film, 352: alignment film, 370a: light-emitting element, 370b: light-emitting element, 371: insulating film, 373: EL layer, 375: conductive film, 601: insulating film, 603: multilayer film, 605: conductive film, 607: insulating film, 609: metal oxide film, 612: conductive film, 1001: main body, 1002: housing, 1003a: display portion, 1003b: display portion, 1004: keyboard button, 1021: main body, 1022: fixing portion, 1023: display portion, 1024: operation button, 1025: external memory slot, 1030: housing, 1031: housing, 1032: display panel, 1033: speaker, 1034: microphone, 1035: operation key, 1036: pointing device, 1037: camera, 1038: external connection terminal, 1040: solar cell, 1041: external memory slot, 1050: television set, 1051: housing, 1052: reproducing portion, 1053: display portion, 1054: external connection terminal, 1055: stand, 1056: external memory, 1101: housing, 1110: display panel, 1111: display region, 1112: display region, 1113: display region, 1114: display region, 5100: pellet, 5100a: pellet, 5100b: pellet, 5101: ion, 5102: zinc oxide layer, 5103: particle, 5105a: pellet, 5105a1: region, 5105a2: pellet, 5105b: pellet, 5105c: pellet, 5105d: pellet, 5105d1: region, 5105e: pellet, 5120: substrate, 5130: target, 5161: region, 8000: display module, 8001: upper cover, 8002: lower cover, 8003: FPC, 8004: touch panel, 8005: FPC, 8006: display panel, 8007: backlight unit, 8008: light source, 8009: frame, 8010: printed board, 8011: battery.

This application is based on Japanese Patent Application serial no. 2013-248284 filed with Japan Patent Office on Nov. 29, 2013 and Japanese Patent Application serial no. 2014-038615 filed with Japan Patent Office on Feb. 28, 2014, the entire contents of which are hereby incorporated by reference.

The invention claimed is:
1. A semiconductor device comprising:
an insulating layer;
wherein the insulating layer includes hydrogen;
a first conductive film,
wherein the first conductive film includes a Cu—X alloy film and a Cu film over the Cu—X alloy film, and
wherein X is Mn, Ni, Cr, Fe, Co, Mo, Ta, or Ti;
a capacitor comprising:
a first oxide semiconductor film having conductivity;
an insulating film;
the first conductive film; and
a second conductive film,
wherein the first conductive film in contact with the first oxide semiconductor film,
wherein the insulating film is over the first oxide semiconductor film and the first conductive film,
wherein a hydrogen concentration of the first oxide semiconductor film is higher than or equal to $8 \times 10^{19}$ atoms/cm$^3$,
wherein the first oxide semiconductor film is in contact with the insulating layer, and wherein the second conductive film is over the insulating film and overlaps with the first oxide semiconductor film;
a transistor comprising:
   a second oxide semiconductor film; and
   the first conductive film,
wherein the first conductive film in contact with the second oxide semiconductor film,
wherein a hydrogen concentration of the second oxide semiconductor film is lower than or equal to $5\times10^{19}$ atoms/cm$^3$, and
wherein a resistivity of the first oxide semiconductor film is higher than or equal to $1\times10^{-8}$ times and lower than $1\times10^{-1}$ times a resistivity of the second oxide semiconductor film.

2. The semiconductor device according to claim 1,
wherein the resistivity of the first oxide semiconductor film is higher than or equal to $1\times10^{-3}$ Ωcm and lower than $1\times10^{4}$ Ωcm.

3. The semiconductor device according to claim 1,
wherein the first conductive film includes a Cu—Mn alloy film.

4. The semiconductor device according to claim 3,
wherein a part of the Cu film is covered with a film including manganese oxide, and
wherein the part of the Cu film is in contact with the film including manganese oxide.

5. The semiconductor device according to claim 1,
wherein the first oxide semiconductor film includes hydrogen and an oxygen vacancy, and
wherein the hydrogen is located in the oxygen vacancy.

6. The semiconductor device according to claim 1,
wherein the insulating film is a nitride insulating film.

7. The semiconductor device according to claim 1,
wherein the hydrogen concentration of the first oxide semiconductor film having conductivity is higher than or equal to $5\times10^{20}$ atoms/cm$^3$.

* * * * *